> US011631687B2

(12) United States Patent
Suzuki et al.

(10) Patent No.: US 11,631,687 B2
(45) Date of Patent: Apr. 18, 2023

(54) VERTICAL MEMORY DEVICE WITH IMPROVED MANUFACTURING YIELD

(71) Applicant: Kioxia Corporation, Minato-ku (JP)

(72) Inventors: Yusaku Suzuki, Kuwana (JP); Kazuhiro Nojima, Mie (JP); Atsuko Aiba, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 56 days.

(21) Appl. No.: 16/797,331

(22) Filed: Feb. 21, 2020

(65) Prior Publication Data

US 2021/0074711 A1    Mar. 11, 2021

(30) Foreign Application Priority Data

Sep. 11, 2019   (JP) .............................. JP2019-165432

(51) Int. Cl.
| | |
|---|---|
| *H01L 27/1157* | (2017.01) |
| *H01L 27/11575* | (2017.01) |
| *H01L 27/11565* | (2017.01) |
| *G11C 16/04* | (2006.01) |

(52) U.S. Cl.
CPC ...... *H01L 27/1157* (2013.01); *G11C 16/0483* (2013.01); *H01L 27/11565* (2013.01)

(58) Field of Classification Search
CPC ................................. H01L 27/11504–11597
See application file for complete search history.

(56) References Cited

U.S. PATENT DOCUMENTS

| | | | | |
|---|---|---|---|---|
| 7,847,342 B2* | 12/2010 | Fukuzumi | ......... | H01L 27/11556 257/326 |
| 8,637,919 B2 | 1/2014 | Lee et al. | | |
| 9,577,085 B2* | 2/2017 | Lee | ................. | H01L 21/76897 |
| 2009/0212350 A1* | 8/2009 | Kidoh | ................. | H01L 27/0688 257/324 |
| 2011/0063914 A1* | 3/2011 | Mikajiri | ............. | H01L 27/11578 365/185.15 |
| 2014/0054673 A1* | 2/2014 | Kim | .................... | H01L 29/7926 257/324 |
| 2015/0263025 A1 | 9/2015 | Nakagami | | |
| 2016/0079185 A1 | 3/2016 | Kato et al. | | |
| 2017/0278861 A1* | 9/2017 | Sonehara | .......... | H01L 27/11575 |
| 2018/0197874 A1 | 7/2018 | Oshiki et al. | | |

(Continued)

FOREIGN PATENT DOCUMENTS

| | | |
|---|---|---|
| JP | 2015-177136 A | 10/2015 |
| JP | 2019-54163 A | 4/2019 |

*Primary Examiner* — Didarul A Mazumder
*Assistant Examiner* — Gustavo G Ramallo
(74) *Attorney, Agent, or Firm* — Oblon, McClelland, Maier & Neustadt, L.L.P.

(57) ABSTRACT

A semiconductor memory device according to an embodiment includes a base, a first conductor, a second conductor, a first pillar, a first insulating member, and a first contact. The first conductor is provided in a first layer above the base. The second conductor is provided above the first conductor. The first pillar includes a first portion and a second portion formed by different bodies. The first portion of the first pillar is provided to penetrate the first conductor. The second portion of the first pillar is provided to penetrate the second conductor. The first insulating member is provided at least in the first layer. The first contact is contacting the second conductor above the first insulating member.

20 Claims, 36 Drawing Sheets

(56) References Cited

U.S. PATENT DOCUMENTS

| | | |
|---|---|---|
| 2019/0067314 A1 | 2/2019 | Lu et al. |
| 2019/0088587 A1 | 3/2019 | Takekida |
| 2019/0198523 A1* | 6/2019 | Nakanishi ......... H01L 27/11565 |
| 2020/0286910 A1* | 9/2020 | Kashima ........... H01L 27/11524 |
| 2020/0303300 A1* | 9/2020 | Kato ................. H01L 27/11565 |
| 2020/0365617 A1* | 11/2020 | Ahn .................. H01L 27/11526 |

* cited by examiner

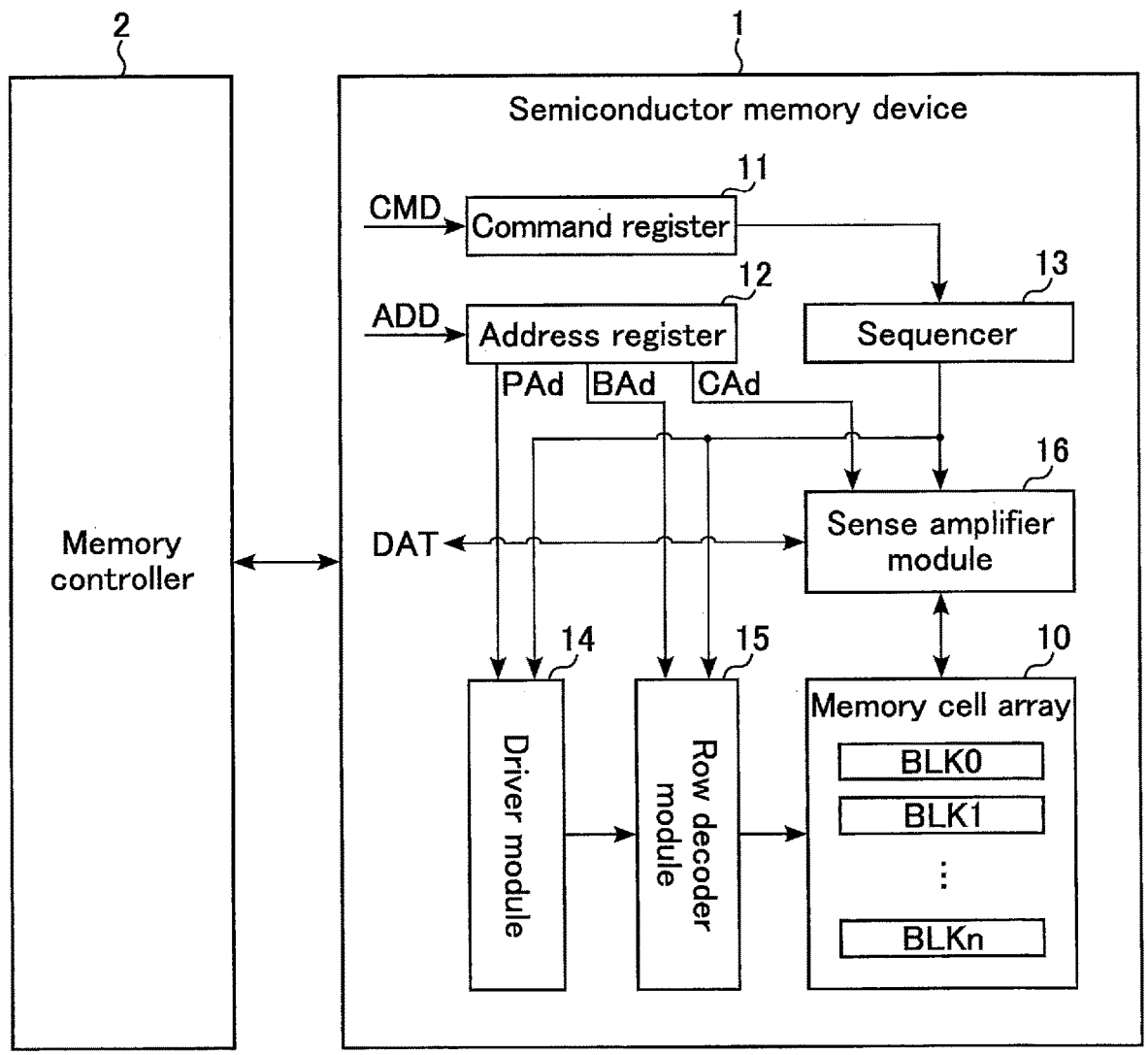
F I G. 1

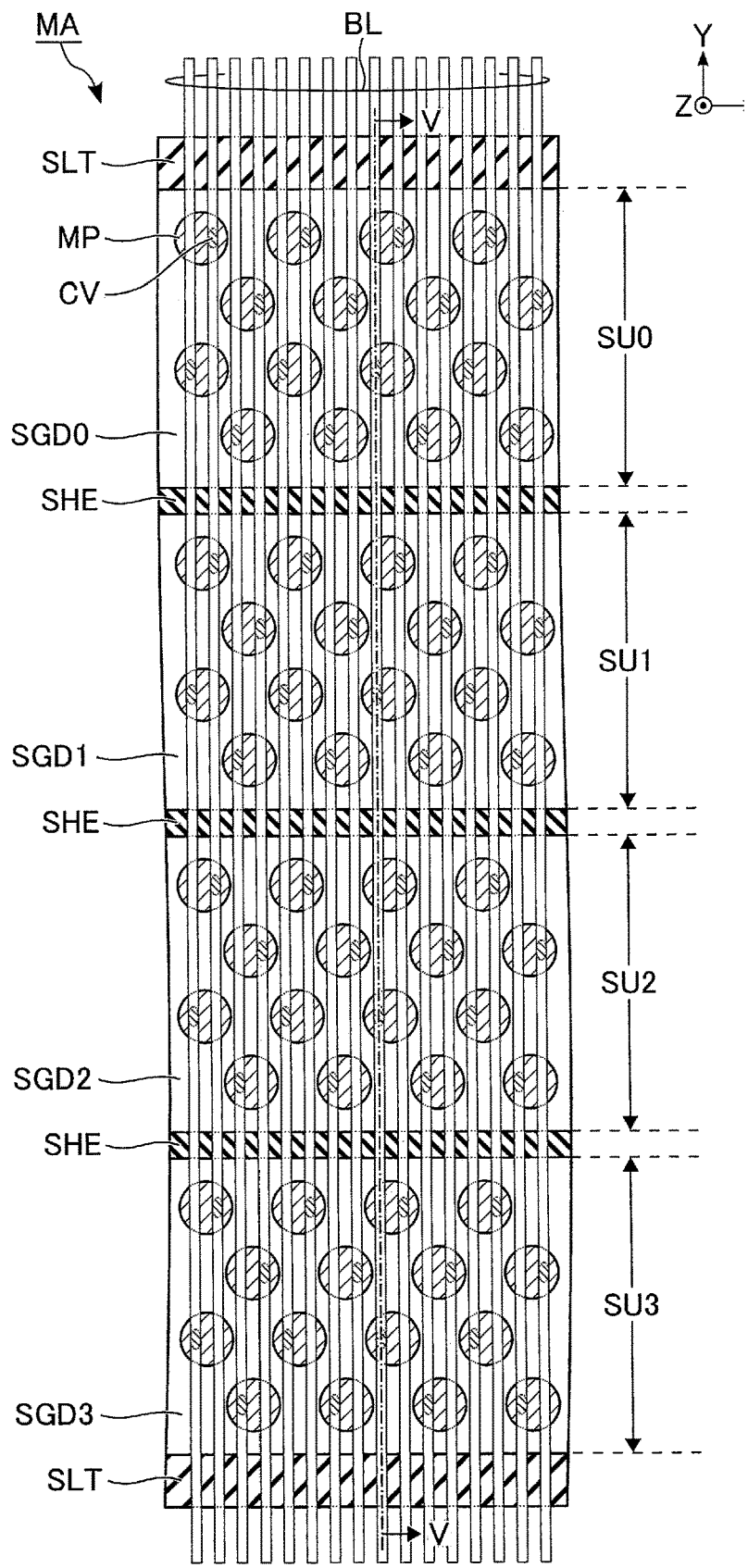
F I G. 4

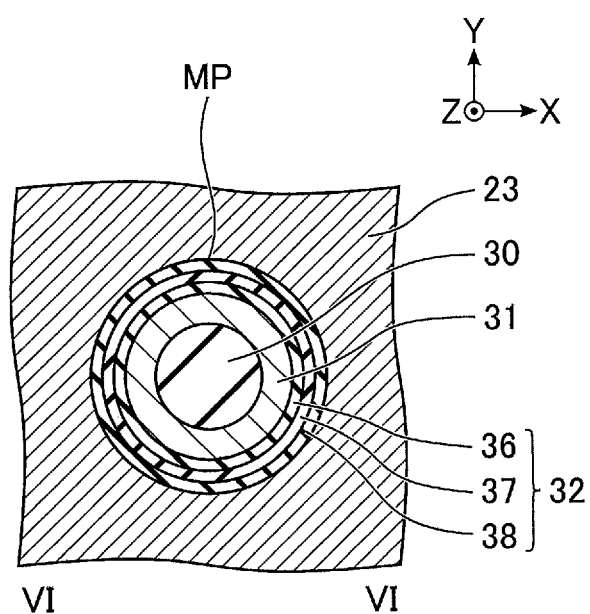
F I G. 6

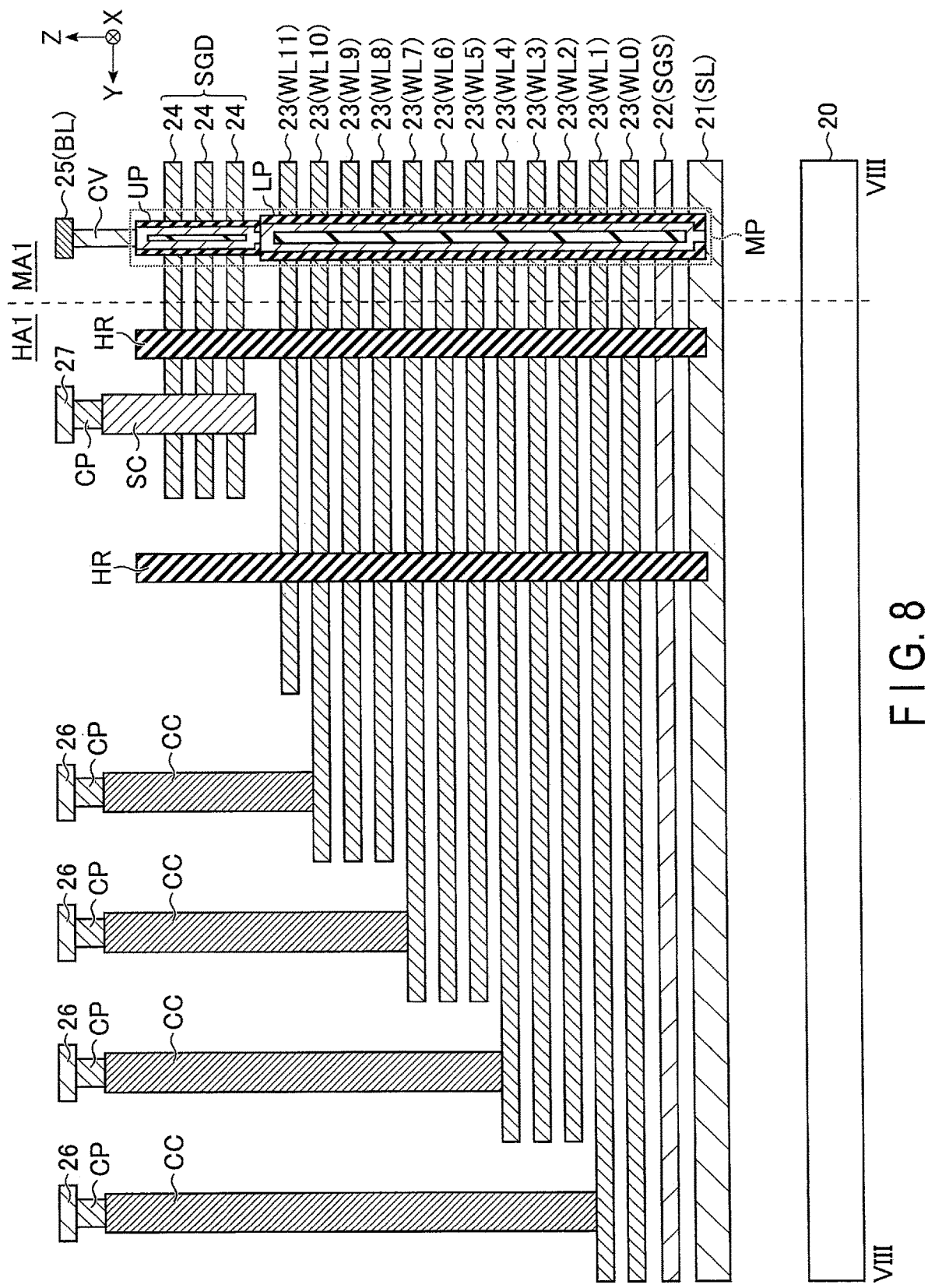
F I G. 8

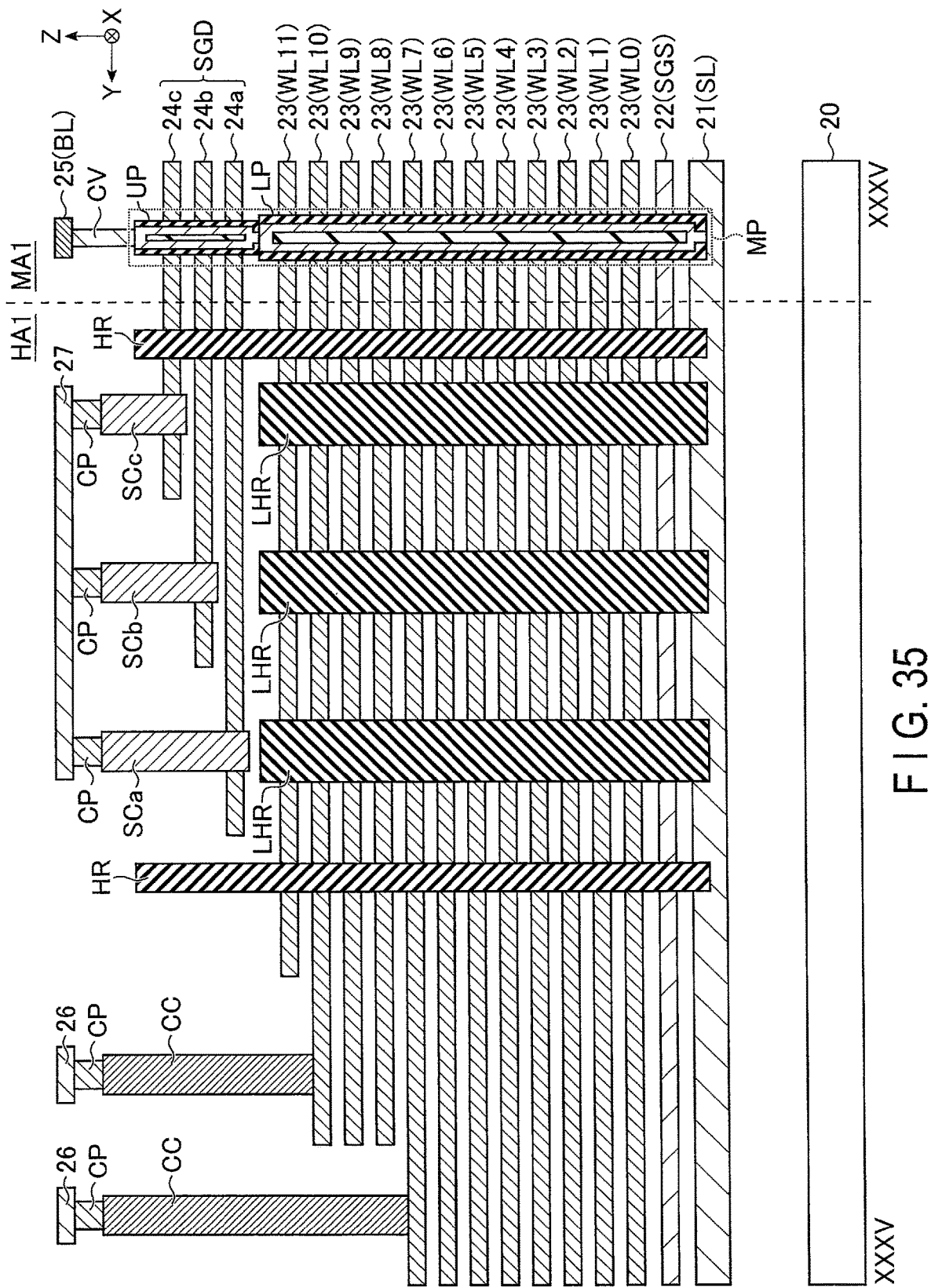
F I G. 35

VERTICAL MEMORY DEVICE WITH IMPROVED MANUFACTURING YIELD

CROSS-REFERENCE TO RELATED APPLICATIONS

This application is based upon and claims the benefit of priority from Japanese Patent Application No. 2019-165432, filed Sep. 11, 2019, the entire contents of which are incorporated herein by reference.

FIELD

Embodiments described herein relate to generally a semiconductor memory device.

BACKGROUND

There is known a NAND-type flash memory that is capable of storing data in a nonvolatile manner.

BRIEF DESCRIPTION OF THE DRAWINGS

FIG. 1 is a block diagram of a semiconductor memory device according to a first embodiment;

FIG. 4 is a plan view illustrating an example of a planar layout in a memory area of the semiconductor memory device according to the first embodiment;

FIG. 6 is a cross-sectional view, taken along line VI-VI in FIG. 5, illustrating an example of a cross-sectional structure of a memory pillar in the semiconductor memory device according to the first embodiment;

FIG. 8 is a cross-sectional view, taken along line VIII-VIII in FIG. 7, illustrating an example of a cross-sectional structure in the hookup area of the semiconductor memory device according to the first embodiment;

FIG. 35 is a cross-sectional view, taken along line XXXV-XXXV in FIG. 34, illustrating an example of a cross-sectional structure in the hookup area of the semiconductor memory device according to the fourth embodiment.

DETAILED DESCRIPTION

Figure 2:
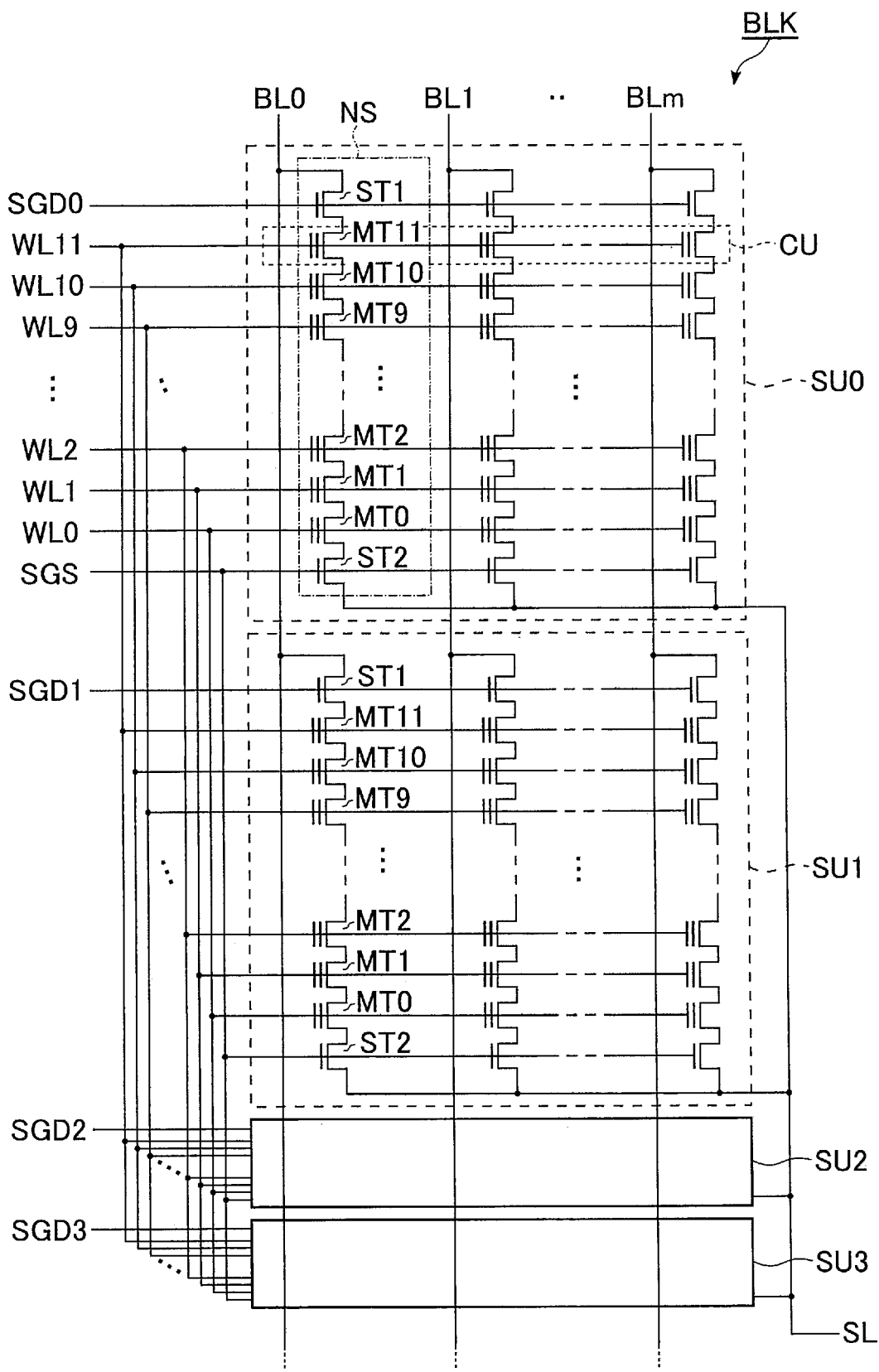
FIG. 2 is a circuit diagram of a memory cell array included in the semiconductor memory device according to the first embodiment.

In general, according to one embodiment, a semiconductor memory device includes a base, a first conductor, a second conductor, a first pillar, a first insulating member, and a first contact. The first conductor is provided in a first layer above the base. The second conductor is provided above the first conductor. The first pillar includes a first portion and a second portion formed by different bodies. The first portion of the first pillar is provided to penetrate the first conductor. The second portion of the first pillar is provided to penetrate the second conductor. The first insulating member is provided at least in the first layer. The first contact is contacting the second conductor above the first insulating member.

Hereinafter, the embodiments will be described with reference to the accompanying drawings. Each embodiment illustrates an example of a device or a method for embodying a technical concept of the invention. The drawings are schematic or conceptual ones. The dimensions, ratios, etc. in the drawings do not necessarily agree with the actual ones. The technical concept of the present invention is not specified by shapes, structures, dispositions, etc. of constituent elements.

In the description below, constituent elements having substantially the same functions and configurations will be denoted by the same reference signs. Numerals after the letters constituting the reference signs are used to distinguish elements which are denoted by the reference signs including the same letters and which have similar configurations. When there is no need to mutually distinguish the elements which are denoted by the reference signs that include the same letters, the same elements are denoted by the reference signs that include only the same letters.

[1] First Embodiment

Hereinafter, a semiconductor memory device 1 according to a first embodiment will be described.

[1-1] Configuration of Semiconductor Memory Device 1

[1-1-1] Entire Configuration of Semiconductor Memory Device 1

FIG. 1 illustrates a configuration example of the semiconductor memory device 1 according to the first embodiment. The semiconductor memory device 1 is a NAND-type flash memory which can store data nonvolatilely, and is controlled by an external memory controller 2.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells which can store data nonvolatilely, and the block BLK is used, for example, as an erase unit of data. In addition, in the memory cell array 10, a plurality of bit lines and a plurality of word lines are provided. Each memory cell is associated with, for example, one bit line and one word line. A detailed configuration of the memory cell array 10 will be described later.

The command register 11 holds a command CMD which the semiconductor memory device 1 has received from the memory controller 2. The command CMD includes, for example, instructions to cause the sequencer 13 to perform a read operation, a write operation, an erase operation and the like.

The address register 12 holds address information ADD which the semiconductor memory device 1 has received from the memory controller 2. The address information ADD includes, for example, a block address BAd, a page address PAd, and a column address CAd. For example, the block address BAd, page address PAd and column address CAd are used to select a block BLK, a word line and a bit line, respectively.

The sequencer 13 controls the operation of the entire semiconductor memory device 1. For example, the sequencer 13 controls the driver module 14, the row decoder module 15, the sense amplifier module 16 and the like, based on the command CMD held in the command register 11, thereby executing a read operation, a write operation, an erase operation and the like.

The driver module 14 generates a voltage that is to be used in the read operation, write operation, erase operation and the like. Then, the driver module 14 applies the generated voltage to a signal line corresponding to a selected word line, for example, based on the page address PAd held in the address register 12.

Based on the block address BAd held in the address register 12, the row decoder module 15 selects one corresponding block BLK in the memory cell array 10. Then, the row decoder module 15 transfers, for example, a voltage applied to the signal line corresponding to the selected word line, to the selected word line in the selected block BLK.

In the write operation, the sense amplifier module 16 apples a desired voltage to each bit line in accordance with write data DAT received from the memory controller 2. In the read operation, the sense amplifier module 16 determines data stored in a memory cell, based on the voltage of the bit line, and transfers a result of the determination to the memory controller 2 as read data DAT.

The above-described semiconductor memory device 1 and memory controller 2 may be combined to constitute one semiconductor device. Examples of this semiconductor device include a memory card such as an SD™ card, a solid-state drive (SSD), and the like.

[1-1-2] Circuit Configuration of Memory Cell Array 10

FIG. 2 illustrates an example of a circuit configuration of the memory cell array 10 included in the semiconductor memory device 1 according to the first embodiment, by extracting one of the blocks BLK included in the memory cell array 10. As illustrated in FIG. 2, the block BLK includes, for example, four string units SU0 to SU3.

Each string unit SU includes a plurality of NAND strings NS which are associated with bit lines BL0 to BLm (m is an integer of 1 or more), respectively. Each NAND string NS includes, for example, memory cell transistors MT0 to MT11, and select transistors ST1 and ST2. The memory cell transistor MT includes a control gate and a charge storage layer, and stores data nonvolatilely. Each of the select transistors ST1 and ST2 is used to select the string unit SU during various operations.

In each NAND string NS, the memory transistors MT0 to MT11 are connected in series. The drain of the select transistor ST1 is connected to the associated bit line BL, and the source of the select transistor ST1 is connected to one end of the series-connected memory transistors MT0 to MT11. The drain of the select transistor ST2 is connected to the other end of the series-connected memory transistors MT0 to M11. The source of the select transistor ST2 is connected to the source line SL.

In the same block BLK, the control gates of the memory cell transistors MT0 to MT11 are commonly connected to word lines WL0 to WL11, respectively. The gates of the select transistors ST1 in the string units SU0 to SU3 are commonly connected to select gate lines SGD0 to SGD3, respectively. The gates of the select transistors ST2 in the same block BLK are commonly connected to a select gate line SGS.

Different column addresses are allocated to the bit lines BL0 to BLm. Each bit line BL is shared by the NAND strings NS to which the same column address is allocated between a plurality of blocks BLK. The word lines WL0 to WL11 are provided for each block BLK. The source line SL is shared by, for example, a plurality of blocks BLK.

A set of memory cell transistors MT connected to a common word line WL in one string unit SU is referred to as, for example, a cell unit CU. For example, the storage capacity of the cell unit CU including memory cell transistors MT each storing one-bit data is defined as "one-page data." The cell unit CU may have a storage capacity of data of two or more pages, according to the number of bits of data to be stored in the memory cell transistor MT.

Note that the circuit configuration of the memory cell array 10 included in the semiconductor memory 1 according to the embodiment is not limited to the configuration described above. For example, the number of string units SU included in each block BLK, and the number of memory cell transistors MT and the number of select transistors ST1 and ST2, which are included in each NAND string NS, may be freely selected.

[1-1-3] Structure of Memory Cell Array 10

An example of a structure of the semiconductor memory device 1 according to the first embodiment will be described below. In the drawings to be referred to below, an X direction corresponds to the extending direction of the word line WL, a Y direction corresponds to the extending direction of the bit line BL, and a Z direction corresponds to a direction perpendicular to the surface of a semiconductor substrate 20 on which the semiconductor memory device 1 is formed. Hatching is added to plan views as appropriate for clarification. The hatching added to the plan views is not necessarily related to the materials or properties of the constituent elements to which hatching is added. In cross-sectional views, depiction of interlayer insulating films and the like is omitted as appropriate for clarification.

(Planar Layout of Memory Cell Array 10)

Figure 3:
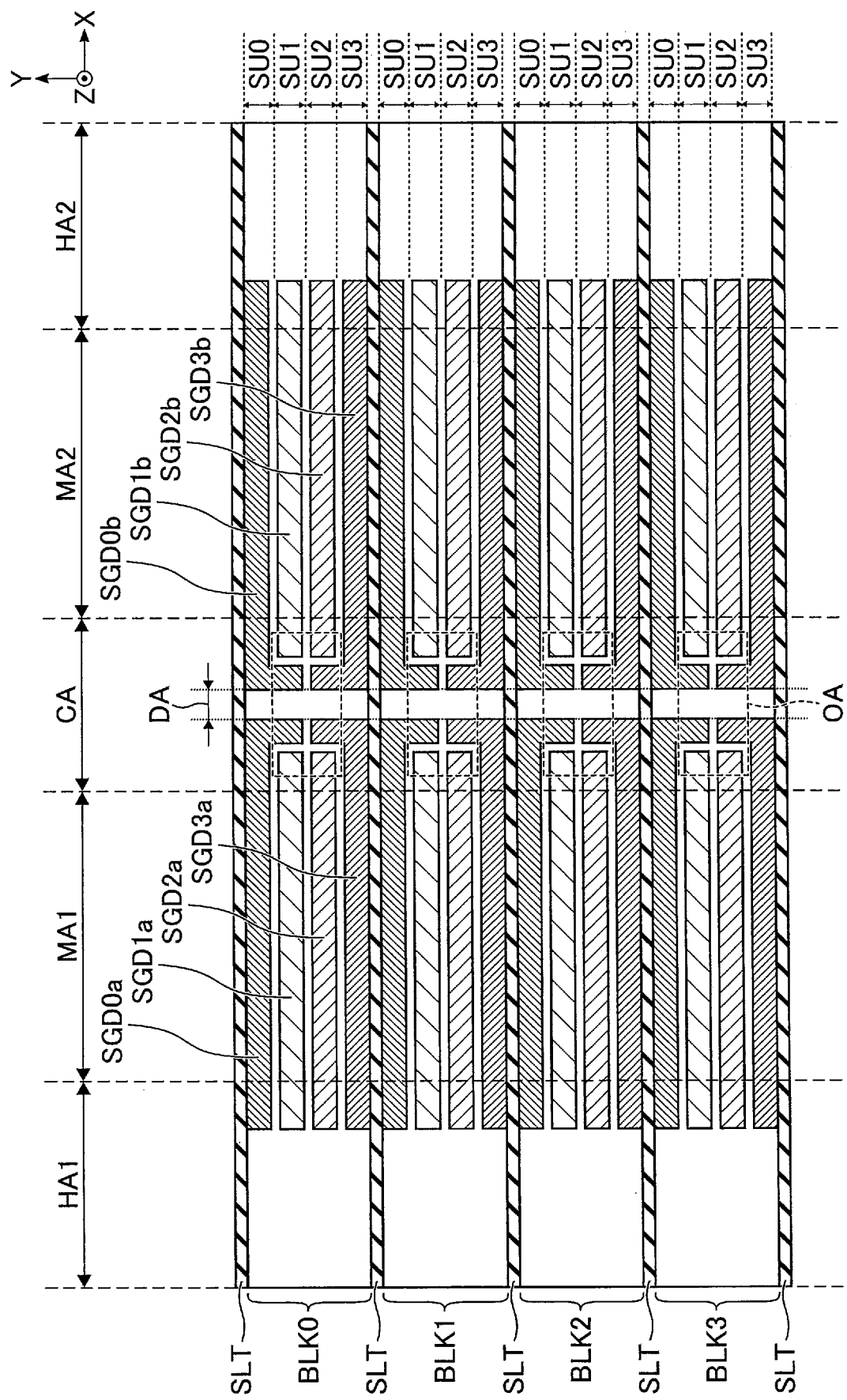
FIG. 3 is a plan view illustrating an example of a planar layout of the semiconductor memory device according to the first embodiment.

FIG. 3 illustrates an example of a planar layout of the memory cell array 10 included in the semiconductor memory device 1 according to the first embodiment. FIG. 3 illustrates, in an extracted manner, an area corresponding to four blocks BLK0 to BLK3. As illustrated in FIG. 3, the planar layout of the memory cell array 10 is divided into, for example, memory areas MA1 and MA2, hookup areas HA1 and HA2, and a contact area CA in the X direction. In addition, the memory cell array 10 includes a plurality of slits SLT, and a plurality of select gate lines SGD0a to SGD3a and SGD0b to SGD3b.

The memory areas MA1 and MA2 are interposed between the hookup areas HA1 and HA2. The contact area CA is interposed between the memory areas MA1 and MA2. Each of the memory areas MA1 and MA2 includes a plurality of NAND strings NS. Each of the hookup areas HA1 and HA2 includes contacts for electrically connecting the word lines WL and select gate lines SGS and SGD, which are connected to the NAND strings NS, and the row decoder module 15. The contact area CA includes through-contacts which penetrate a stacked structure of the memory cell array 10.

The slits SLT are provided to extend in the X direction, and are arranged in the Y direction. Each of the slits SLT extends across the memory areas MA1 and MA2, hookup areas HA1 and HA2 and contact area CA in the X direction. In addition, each of the slits SLT has such a structure that an insulator is buried in the inside thereof, and divides (insulates) conductive layers which neighbor each other via the slit SLT. Specifically, the slits SLT divide the word lines WL0 to WL11 and select gate lines SGD and SGS.

A set of select gate lines SGD0a to SGD3a and SGD0b to SGD3b is disposed between mutually neighboring slits SLT. Each of the select gate lines SGD0a to SGD3a and SGD0b to SGD3b includes a portion extending in the X direction in the memory area MA. Each of the select gate lines SGD0a to SGD3a is included in the memory area MA1, hookup area HA1 and contact area CA and extends across the memory area MA1. Each of the select gate lines SGD0b to SGD3b is included in the memory area MA2, hookup area HA2 and contact area CA and extends across the memory area MA2.

Between mutually neighboring slits SLT, the select gate lines SGD0a to SGD3a are connected to the select gate lines SGD0b to SGD3b via interconnects (not shown). A set of the select gate lines SGD0a and SGD0b functions as the select gate line SGD0. A set of the select gate lines SGD1a and SGD1b functions as the select gate line SGD1. A set of the select gate lines SGD2a and SGD2b functions as the select gate line SGD2. A set of the select gate lines SGD3a and SGD3b functions as the select gate line SGD3.

The contact area CA further includes a dividing area DA and a plurality of penetration areas OA. The dividing area DA is disposed in an intermediate portion in the X direction of the contact area CA, and extends in the Y direction. For example, the select gate lines SGD0a to SGD3a and the select gate lines SGD0b to SGD3b are isolated and insulated in the dividing area DA. The penetration area OA is disposed between mutually neighboring slits SLT, and is spaced apart from the slits SLT. For example, the penetration area OA includes a through-contact, and end portions of the select gate lines SGD0a to SGD3a and SGD0b to SGD3b.

In the above-described planar layout of the memory cell array 10, each of the areas partitioned by the slits SLT in the memory areas MA1 and MA2 corresponds to one block BLK. The number of string units SU formed between mutually neighboring slits SLT may be changed based on the number of select gate lines SGDa and SGDb. The memory cell array 10 may include a plurality of contact areas CA. In this case, the memory area MA between the hookup areas HA1 and HA2 is divided into three or more memory areas. In the memory cell array 10, for example, the layout illustrated in FIG. 3 is repeatedly arranged in the Y direction.

(Configuration of Memory Cell Array 10 in Memory Area MA)

FIG. 4 illustrates an example of a detailed planar layout in the memory area MA of the memory cell array 10 included in the semiconductor memory device 1 according to the first embodiment, by extracting an area corresponding to one block BLK (i.e. string units SU0 to SU3). As illustrated in FIG. 4, in the memory area MA, the memory cell array 10 includes slits SHE, a plurality of memory pillars MP, a plurality of contacts CV, and a plurality of bit lines BL.

The slits SHE are provided between the select gate lines SGD0 and SGD1, between the select gate lines SGD1 and SGD2, and between the select gate lines SGD2 and SGD3, respectively. In addition, the slit SHE has such a structure that an insulator is buried in the inside thereof, and divides (insulates) the select gate lines SGD which neighbor each other via the slit SHE. Specifically, an area divided by slits SHE between the mutually neighboring slits SLT corresponds to one string unit SU.

Each of the memory pillars MP functions, for example, as one NAND string NS. The memory pillars MP are arranged in a staggering fashion in four rows, for example, in an area between mutually neighboring slits SLT and SHE, and between mutually neighboring slits SHE, respectively. The number and arrangement of memory pillars MP between mutually neighboring slits SLT and SHE and between mutually neighboring slits SHE are not limited to those described here, and may be changed as appropriate.

The respective bit lines EL include portions extending in the Y direction and are arranged in the X direction. Each bit line EL is disposed in a manner to overlap at least one memory pillar MP in each string unit SU. In addition, each bit line BL is electrically connected to one memory pillar MP via a contact CV in each string unit SU. The number of bit lines BL, which are disposed to overlap one memory pillar MP, may be freely selected. In this example, two bit lines BL are disposed to overlap each memory pillar MP.

Figure 5:
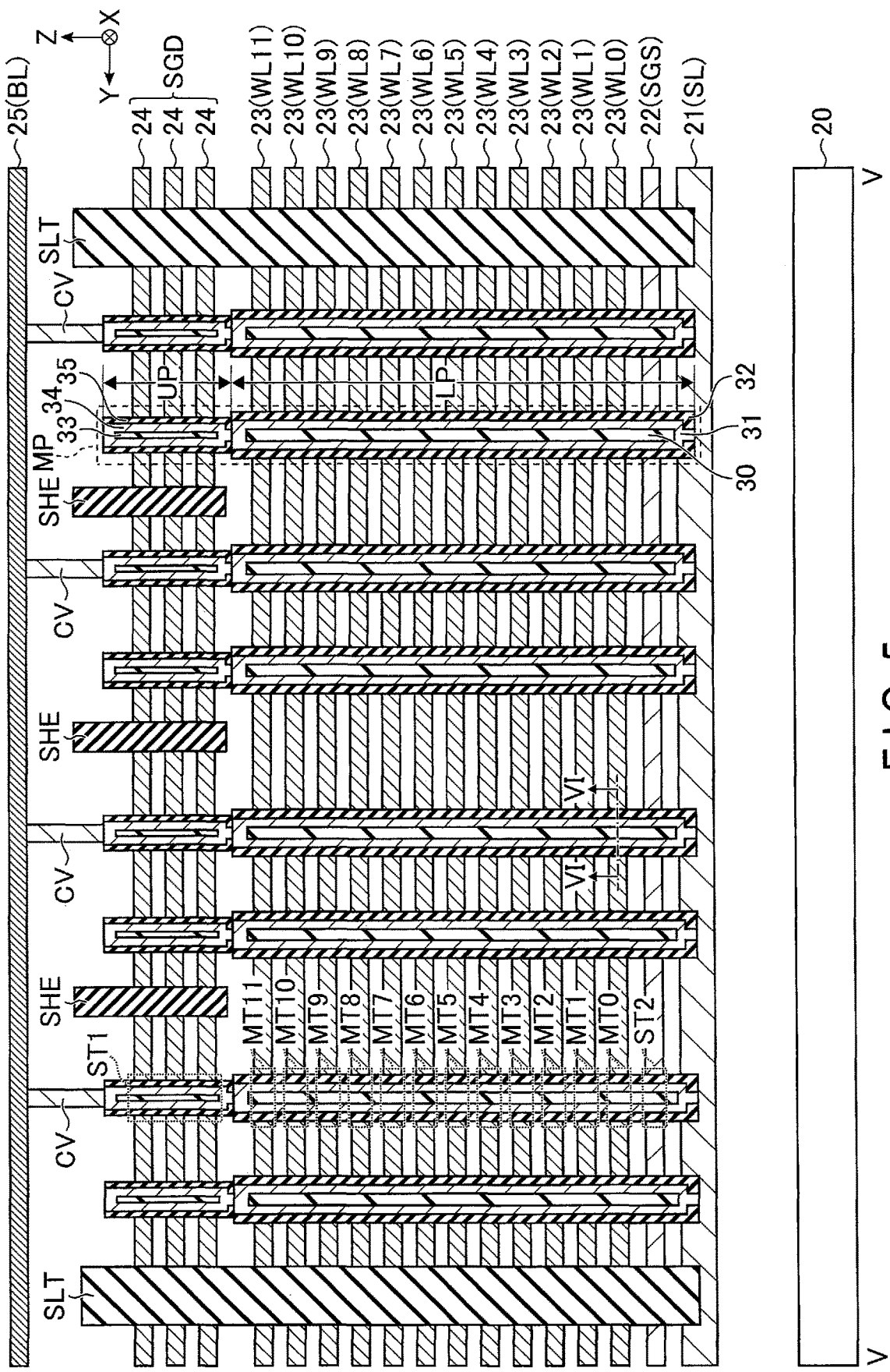
FIG. 5 is a cross-sectional view, taken along line V-V in FIG. 4, illustrating an example of a cross-sectional structure in the memory area of the semiconductor memory device according to the first embodiment.

FIG. 5 is a cross-sectional view, taken along line V-V in FIG. 4, illustrating an example of a cross-sectional structure in the memory area MA of the memory cell array 10 included in the semiconductor memory device 1 according to the first embodiment. As illustrated in FIG. 5, the memory cell array 10 further includes conductive layers 21 to 25. The conductive layers 21 to 25 are provided above a semiconductor substrate 20.

Specifically, the conductive layer 21 is provided above the semiconductor substrate 20 via an insulating layer. Although depiction is omitted, circuitry corresponding to, for example, the row decoder module 15, sense amplifier module 16 and the like is provided in the insulating layer between the semiconductor substrate 20 and conductive layer 21. The conductive layer 21 is formed, for example, in a plate shape extending along the XY plane, and is used as the source line SL. The conductive layer 21 includes, for example, silicon doped with phosphorus.

The conductive layer 22 is provided above the conductive layer 21 via an insulating layer. The conductive layer 22 is formed, for example, in a plate shape extending along the XY plane, and is used as the select gate line SGS. The conductive layer 22 includes, for example, silicon doped with phosphorus.

Above the conductive layer 22, insulating layers and the conductive layers 23 are alternately stacked. Each conductive layer 23 is formed, for example, in a plate shape extending along the XY plane. The stacked conductive layers 23 are used as word lines WL0 to WL11 in an order from the semiconductor substrate 20 side. The conductive layers 23 include, for example, tungsten.

Above the uppermost conductive layer 23, insulating layers and the conductive layers 24 are alternately stacked. In this example, three conductive layers 24 are stacked via insulating layers. Each conductive layer 24 is formed, for example, in a plate shape extending along the XY plane. The stacked conductive layers 24 are used as select gate lines SGD. The conductive layers 24 include, for example, tungsten.

The conductive layer 25 is provided above the conductive layers 24 via an insulating layer. The conductive layer 25 is formed, for example, in a line shape extending in the Y direction, and is used as a bit line BL. Specifically, in an area not shown, a plurality of conductive layers 25 are arranged in the X direction. Each conductive layer 25 incudes, for example, copper.

Each of the memory pillars MP is provided to extend in the Z direction, and penetrates the conductive layers 22 to 24. In addition, each memory pillar MP is configured such that a lower pillar LP and an upper pillar UP are formed by different bodies and coupled in the Z direction. The lower pillar LP penetrates the conductive layers 22 and 23, and includes, for example, a core member 30, a semiconductor layer 31, and a stacked film 32. The upper pillar UP penetrates the conductive layers 24, and includes, for example, a core member 33, a semiconductor layer 34, and a gate insulation film 35.

In the lower pillar LP, the core member 30 is provided to extend in the Z direction. For example, an upper end of the core member 30 is included in a layer between the uppermost conductive layer 23 and the lowermost conductive layer 24, and a lower end of the core member 30 is included in a layer in which the conductive layer 21 is provided. The semiconductor layer 31 covers a periphery of the core member 30. For example, in a bottom portion of the lower pillar LP, a portion of the semiconductor layer 31 is in contact with the conductive layer 21. The stacked film 32 covers a side surface and a bottom surface of the semiconductor layer 31, except for a portion where the semiconductor layer 31 is in contact with the semiconductor layer 21. The core member 30 includes, for example, an insulator such as silicon oxide ($SiO_2$). The semiconductor layer 31 includes, for example, silicon.

In the upper pillar UP, the core member 33 is provided to extend in the Z direction. For example, an upper end of the core member 33 is included in a layer between the uppermost conductive layer 24 and the conductive layer 25, and a lower end of the core member 33 is included in a layer between the uppermost conductive layer 23 and lowermost conductive layer 24. The semiconductor layer 34 covers a periphery of the core member 33. For example, in a bottom portion of the upper pillar UP, a portion of the semiconductor layer 33 is in contact with the conductive layer 31 in the lower pillar LP. The gate insulation film 35 covers a side surface and a bottom surface of the semiconductor layer 34, except for a portion where the semiconductor layers 31 and 34 are in contact. The core member 33 includes, for example, an insulator such as silicon oxide. The semiconductor layer 34 includes, for example, silicon.

The outside diameter and area of the lower pillar LP are greater than, for example, the outside diameter and area of the upper pillar UP. The gate insulation film 35 of the upper pillar UP may have a layer structure which is similar to a layer structure of the stacked film 32. The thickness of the insulating layer including the portion, in which the lower pillar LP and upper pillar UP are connected, is greater than the thickness of the insulating layer between mutually neighboring conductive layers 23, and is greater than the thickness of the insulating layer between mutually neighboring conductive layers 24. In addition, the insulating layer including the portion, in which the lower pillar LP and upper pillar UP are connected, may be composed of a plurality of kinds of insulating layers.

A columnar contact CV is provided on a top surface of the semiconductor layer 34 in the memory pillar MP. In the area illustrated, contacts CV corresponding to four memory pillars MP among eight memory pillars MP are depicted. In an area not illustrated, contacts CV are connected to the memory pillars MP to which the contacts CV are not connected in the illustrated area.

One conductive layer 25, i.e., one bit line BL, is in contact with a top surface of the contact CV. One contact CV is connected to one conductive layer 25 in each of areas which are divided by the slits SLT and SHE1. Specifically, for example, one memory pillar MP disposed between the mutually neighboring slits SLT and SHE, and one memory pillar MP disposed between the mutually neighboring slits SHE, are electrically connected to each of the conductive layers 25.

The slit SLT is formed, for example, in a plate shape extending along the XZ plane, and divides the conductive layers 22 to 24. An upper end of the slit SLT is included in a layer between the uppermost conductive layer 24 and the conductive layer 25. A lower end of the slit SLT is included, for example, in the layer in which the conductive layer 21 is provided. The slit SLT includes, for example, an insulator such as silicon oxide.

The slit SHE is formed, for example, in a plate shape extending along the XZ plane, and divides the stacked conductive layers 24. An upper end of the slit SHE is included in the layer between the uppermost conductive layer 24 and the conductive layer 25. A lower end of the slit SHE is included, for example, in a layer between the uppermost conductive layer 23 and lowermost conductive layer 24. The slit SHE includes, for example, an insulator such as silicon oxide. The upper end of the slit SHE and the upper end of the memory pillar MP may, or may not, be aligned with each other.

In the above-described structure of the memory pillar MP, a portion, at which the memory pillar MP and conductive layer 22 intersect, functions as the select transistor ST2. A portion, at which the memory pillar MP and conductive layer 23 intersect, functions as the memory cell transistor MT. A portion, at which the memory pillar MP and conductive layer 24 intersect, functions as the select transistor ST1.

FIG. 6 is a cross-sectional view, taken along line VI-VI in FIG. 5, illustrating an example of a cross-sectional structure of the memory pillar MP in the semiconductor memory device 1 according to the first embodiment. More specifically, FIG. 6 illustrates a cross-sectional structure of the memory pillar MP in a layer which is parallel to the surface of the semiconductor substrate 20 and includes the conductive layer 23. As illustrated in FIG. 6, the stacked film 32 includes, for example, a tunnel insulation film 36, an insulating film 37 and a block insulation film 38.

In the layer including the conductive layer 23, the core member 30 is provided, for example, in a central part of the memory pillar MP. The semiconductor layer 31 surrounds the side surface of the core member 30. The tunnel insulation film 36 surrounds the side surface of the semiconductor layer 31. The insulating film 37 surrounds the side surface of the tunnel insulation film 36. The block insulation film 38 surrounds the side surface of the insulating film 37. The conductive layer 23 surrounds the side surface of the block insulation film 38.

In each memory pillar MP, the semiconductor layers 31 and 34 are used as channels of the memory cell transistors MT0 to MT11 and select transistors ST1 and ST2. Each of tunnel insulation film 36 and block insulation film 38 includes, for example, silicon oxide. The insulating film 37 is used as a charge storage layer of the memory cell transistor MT, and includes, for example, silicon nitride (SiN). The gate insulation film 35 is used as a gate insulation film of the select transistor ST2. Thereby, each memory pillar MP functions as one NAND string NS.

(Structure of Memory Cell Array 10 in Hookup Area HA)

Figure 7:
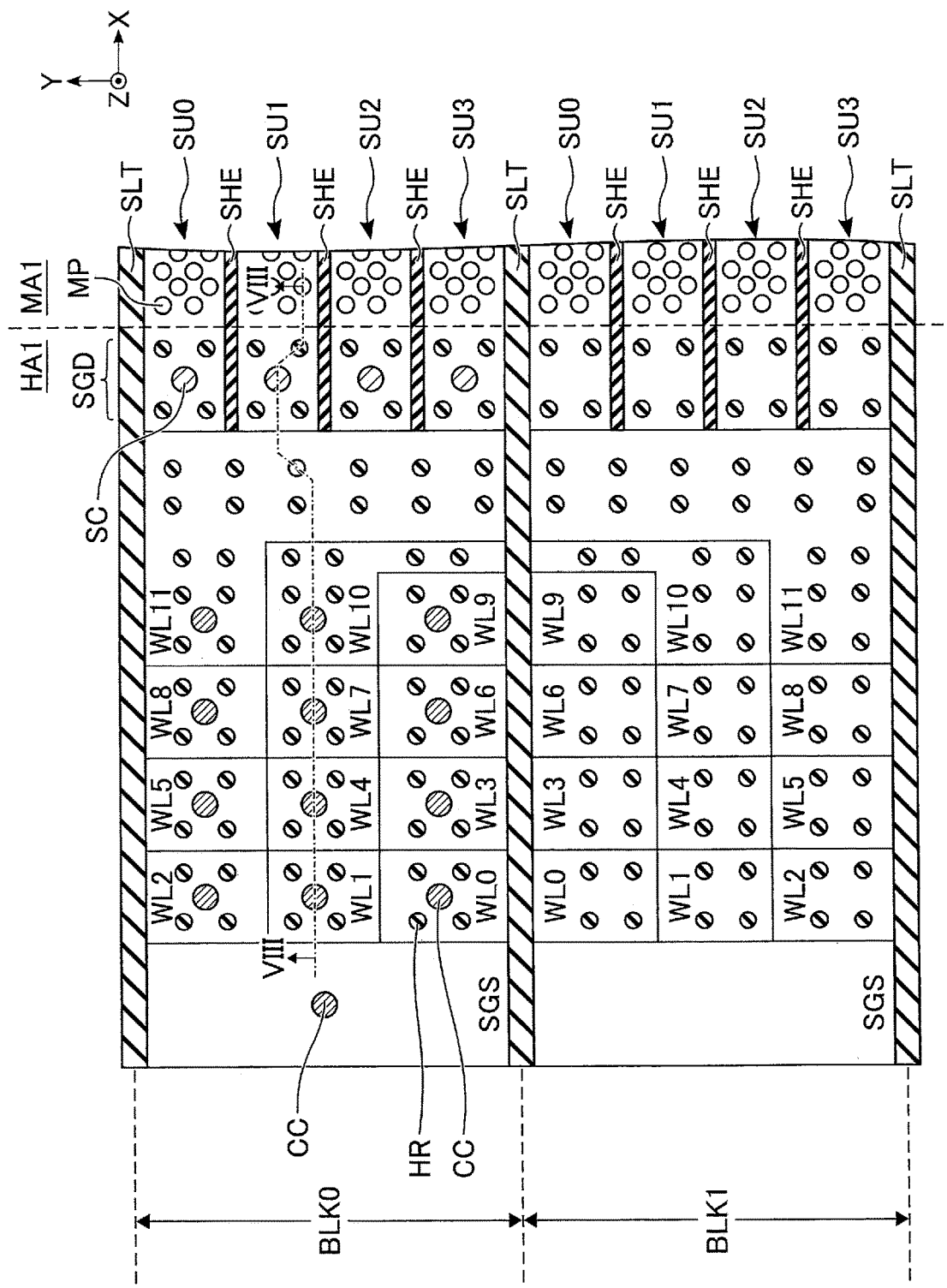
FIG. 7 is a plan view illustrating an example of a planar layout in a hookup area of the semiconductor memory device according to the first embodiment.

FIG. 7 illustrates an example of a detailed planar layout in the hookup area HA1 of the memory cell array 10 included in the semiconductor memory device 1 according to the first embodiment, by extracting an area corresponding to mutually neighboring blocks BLK0 and BLK1. FIG. 7 also illustrates a part of the memory area MA1 near the hookup area HA1. As illustrated in FIG. 7, in the hookup area HA1, each of the select gate line SGS, word lines WL0 to WL11 and select gate lines SGD includes a portion (terrace portion) which does not overlap an interconnect layer (conductive layer) of an upper layer. In addition, in the hookup area HA1, the memory cell array 10 includes a plurality of contacts CC and SC, and a plurality of support pillars HR.

In the hookup area HA1, the shapes of portions that do not overlap upper interconnect layers are similar to shapes of steps, terraces, rimstones, or the like. Specifically, stepped portions are provided between the select gate line SGS and word line WL0, between the word line WL0 and word line WL1, ..., and between the word line WL10 and word line WL11, and between the word line WL11 and select gate line SGD. In this example, the end portions of the word lines WL0 to WL11 are provided in a stepped shape of three rows, the stepped shape including two steps in the Y direction and a plurality of steps in the X direction.

In addition, in the hookup area HA1, the stepped structure of word lines WL corresponding to the block BLK1 is similar to a structure which is obtained by reversing the stepped structure of word lines WL corresponding to the block BLK0 with respect to the X direction as a symmetry axis. In other words, in the hookup area HA1, the direction of steps formed in the Y direction in the word lines WL of the block BLK0 (i.e. even-numbered block BLK) is opposite to the direction of steps formed in the Y direction in the word lines WL of the block BLK1 (i.e. odd-numbered block BLK).

In the hookup area HA1, the contacts CC are disposed in an overlapping manner on terrace portions of the word lines WL0 to WL11 and select gate line SGS of the even-numbered block BLK0. Each of the word lines WL0 to WL11 and select gate line SGS is electrically connected to the row decoder module 15 via the contacts CC disposed on the terrace portions of these lines.

In the hookup area HA1, contacts SC are disposed in an overlapping manner on terrace portions of the select gate lines SGD0 to SGD3 of the even-numbered block BLK0. Each of the select gate lines SGD0 to SGD3 is electrically connected to the row decoder module 15 via the contacts SC disposed on the terrace portions of these lines. Note that in the hookup area HA1, the contacts SC may further be disposed in an overlapping manner on terrace portions of the select gate lines SGD0 to SGD3 of the odd-numbered block BLK1.

In the hookup area HA1, the support pillars HR are disposed as appropriate, for example, in such a manner as not to overlap the contacts CC and SC and slits SLT. The support pillar HR has such a structure that an insulator is buried in a hole extending in the Z direction. In addition, the support pillar HR penetrates the stacked interconnect layers (e.g. word lines WL and select gate lines SGD).

FIG. 8 is a cross-sectional view, taken along line VIII-VIII in FIG. 7, illustrating an example of a cross-sectional structure in the hookup area HA1 of the memory cell array 10 included in the semiconductor memory device 1 according to the first embodiment. In addition, FIG. 8 illustrates a portion of the memory area MA1 near the hookup area HA1. As illustrated in FIG. 8, in the hookup area HA1, the end portions of the conductive layers 23 corresponding to the word lines WL are provided in a stepped shape. Besides, in the hookup area HA1, the memory cell array 10 further includes a plurality of contacts CP, and conductive layers 26 and 27.

The illustrated area includes a plurality of terrace portions corresponding to the word lines WL1, WL4, WL7 and WL10 and select gate lines SGD. Further, one contact CC is provided on the terrace portion of each of the four conductive layers 23 corresponding to the word lines WL0, WL4, WL7 and WL10. One conductive layer 26 is provided above each contact CC. The associated contact CC and conductive layer 26 are electrically connected via the contact CP. Each conductive layer 26 is included, for example, in the same interconnect layer as the conductive layer 25.

For example, end portions of the three conductive layers 24 corresponding to the select gate lines SGD are aligned. Thus, a terrace portion corresponding to the select gate lines SGD is provided on the uppermost conductive layer 24. In addition, one contact SC is provided to penetrate the three conductive layers 24 corresponding to the select gate lines SGD. A bottom portion of the contact SC is included, for example, in a layer between the uppermost conductive layer 23 and the lowermost conductive layer 24. Thus, the contact SC is in contact with at least each of the stacked conductive layers 24 and electrically connects the stacked conductive layers 24. One conductive layer 27 is provided above each contact SC. The associated contact SC and conductive layer 27 are electrically connected via a contact CP. Each conductive layer 27 is included, for example, in the same interconnect layer as the conductive layer 25.

The support pillar HR is provided to extend in the Z direction, and penetrates, for example, the conductive layers 22 to 24. The number of conductive layers, which the support pillar HR penetrates, varies in accordance with the disposition of the support pillar HR. An upper end of the support pillar HR is included, for example, in a layer between the uppermost conductive layer 24 and the conductive layer 25. A lower end of the support pillar HR is included, for example, in a layer lower than the conductive layer 22. The support pillar HR suffices if its lower end reaches at least the conductive layer 22.

The above-described structure of the memory cell array 10 in the hookup area HA1 is similar to the structure of the memory cell array 10 in the hookup area HA2. Specifically, the structure in the hookup area HA1 of the even-numbered block BLK is similar to the structure in the hookup area HA2 of the odd-numbered block BLK, and the structure in the hookup area HA2 of the even-numbered block BLK is similar to the structure in the hookup area HA1 of the odd-numbered block BLK.

For example, the planar layout of the block BLK0 in the hookup area HA2 is similar to a planar layout which is obtained by reversing the structure of the block BLK1 in the hookup area HA1 in the X direction and Y direction. The planar layout of the block BLK1 in the hookup area HA2 is similar to a planar layout which is obtained by reversing the structure of the block BLK0 in the hookup area HA1 in the X direction and Y direction. Specifically, in the semiconductor memory device 1 according to the first embodiment, the driver module 14 applies voltages to the word lines WL and select gate line SGS via contacts CC disposed in either of the hookup areas HA1 and HA2. Similarly, the driver module 14 applies voltages to the select gate lines SGD via contacts SC disposed in either of the hookup areas HA1 and HA2. Note that the driver module 14 may apply voltages to both ends of the select gate lines SGD via the contacts SC disposed in the hookup areas HA1 and HA2.

(Structure of Memory Cell Array 10 in Contact Area CA)

Figure 9:
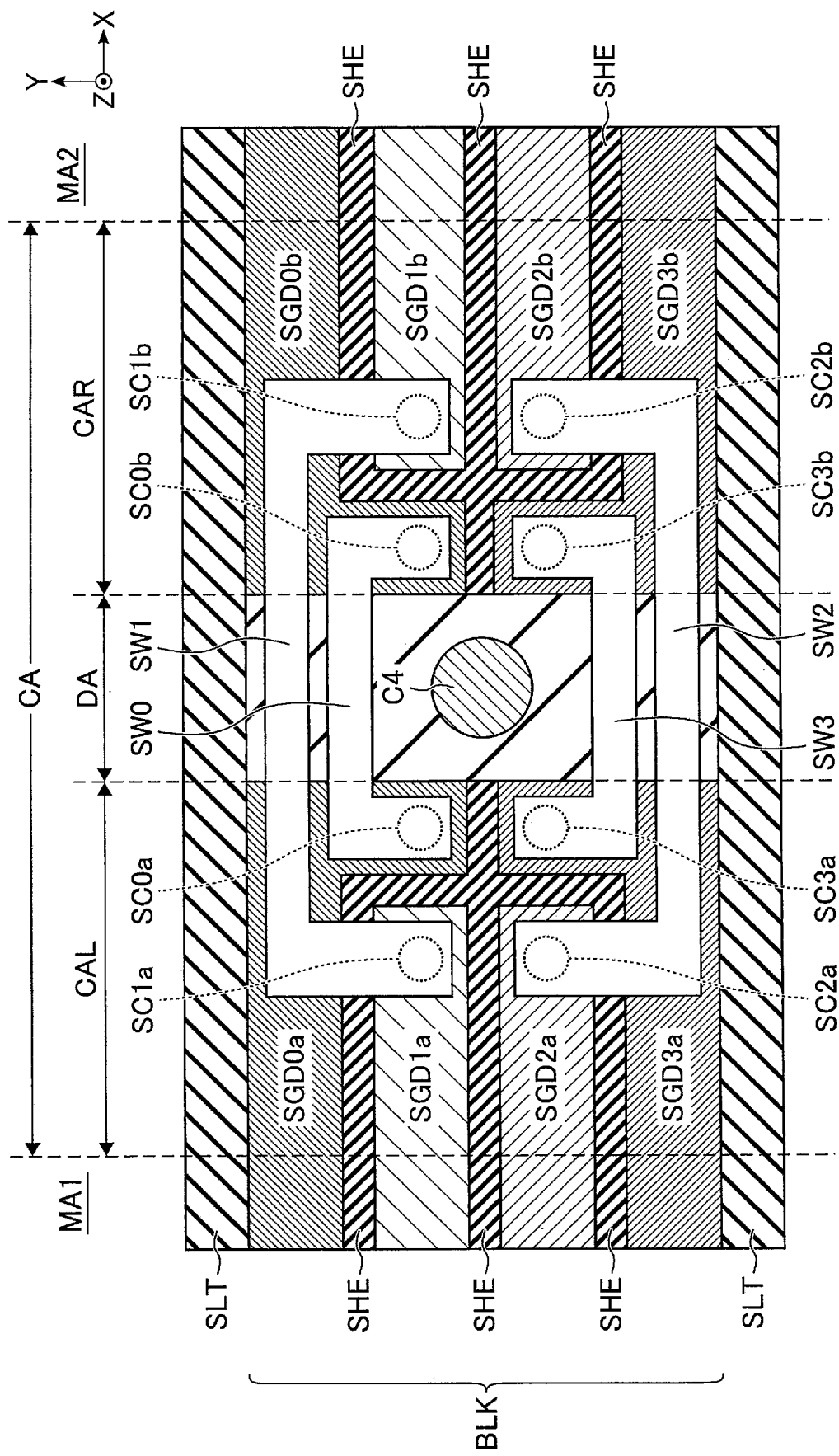
FIG. 9 is a plan view illustrating an example of a planar layout in a contact area of the semiconductor memory device according to the first embodiment.

FIG. 9 illustrates an example of a detailed planar layout in the contact area CA of the memory cell array 10 included in the semiconductor memory device 1 according to the first embodiment. Hereinafter, an area between the memory area MA1 and dividing area DA is called "CAL", and an area between the memory area MA2 and dividing area DA is called "CAR". As illustrated in FIG. 9, in the contact area CA, the memory cell array 10 includes contacts C4, SC0a to SC3a, and SC0b to SC3b, and interconnects SW0 to SW3. The contacts SC0a to SC3a and SC0b to SC3b are arranged in a manner to surround the contact C4.

The contact C4 is provided to penetrate the stacked structure of the memory cell array 10. In addition, the contact C4 electrically connects upper interconnects of the memory cell array 10 and lower interconnects of the memory cell array 10. Further, in the dividing area DA, the contact C4 is disposed, for example, spaced apart from the slits SLT and select gate lines SGD. Note that the contact area CA may include a plurality of contacts C4.

In the area CAL, the select gate lines SGD0a and SGD3a include portions which are opposed in the Y direction and neighbor the dividing area DA. In addition, these portions of the select gate lines SG0a and SGD3a are opposed to end portions of the select gate lines SGD1a and SGD1a in the X direction. Specifically, the slit SHE in the area CAL includes a portion interposed between the select gate lines SGD1a and SGD3a, a portion interposed between the select gate lines SGD0a and SGD1a, a portion interposed between the select gate lines SGD1a and SGD2a, and a portion interposed between the select gate lines SGD2a and SGD3a, and these portions are continuously provided.

Similarly, in the area CAR, the select gate lines SGD0b and SGD3b include portions which are opposed in the Y direction and neighbor the dividing area DA. In addition, these portions of the select gate lines SGD0b and SGD3b are opposed to end portions of the select gate lines SGD1b and SGD2b in the X direction. Specifically, the slit SHE in the area CAR includes a portion interposed between the select gate lines SGD0b and SGD3b, a portion interposed between the select gate lines SGD0b and SGD1b, a portion interposed between the select gate lines SGD1b and SGD2b, and a portion interposed between the select gate lines SGD2b and SGD3b, and these portions are continuously provided.

The contacts SC0a to SC3a and SC0b to SC3b are disposed, for example, at end portions of the select gate lines SGD0a to SGD3a and SGD0b to SGD3b. In addition, the contacts SC0a to SC3a and SC0b to SC3b are electrically connected to the select gate lines SGD0a to SGD3a and SGD0b to SGD3b, respectively. For example, the contacts SC1a, SC0a, SC0b and SC1b are arranged in the named order in the X direction. The contacts SC2a, SC3a, SC3b and SC2b are arranged in the named order in the X direction. The contacts SC1a and SC2a neighbor in the Y direction. The contacts SC0a and SC3a neighbor in the Y direction. The contacts SC0b and SC3b neighbor in the Y direction. The contacts SC1b and SC2b neighbor in the Y direction.

The interconnects SW0 to SW3 are provided in association with the select gate lines SGD0 to SGD3, respectively. Specifically, the interconnect SW0 is connected to the contacts SC0a and SC0b, and electrically connects the select gate lines SGD0a and SGD0b. The interconnect SW1 is connected to the contacts SC1a and SC1b, and electrically connects the select gate lines SGD1a and SGD1b. The interconnect SW2 is connected to the contacts SC2a and SC2b, and electrically connects the select gate lines SGD2a and SGD2b. The interconnect SW3 is connected to the contacts SC3a and SC3b, and electrically connects the select gate lines SGD3a and SGD3b. In addition, each of the interconnects SW0 to SW3 has such a crank-shaped pattern as to make a detour around the contact C4, and the interconnects SW0 to SW3 are disposed, spaced apart from each other.

Figure 10:
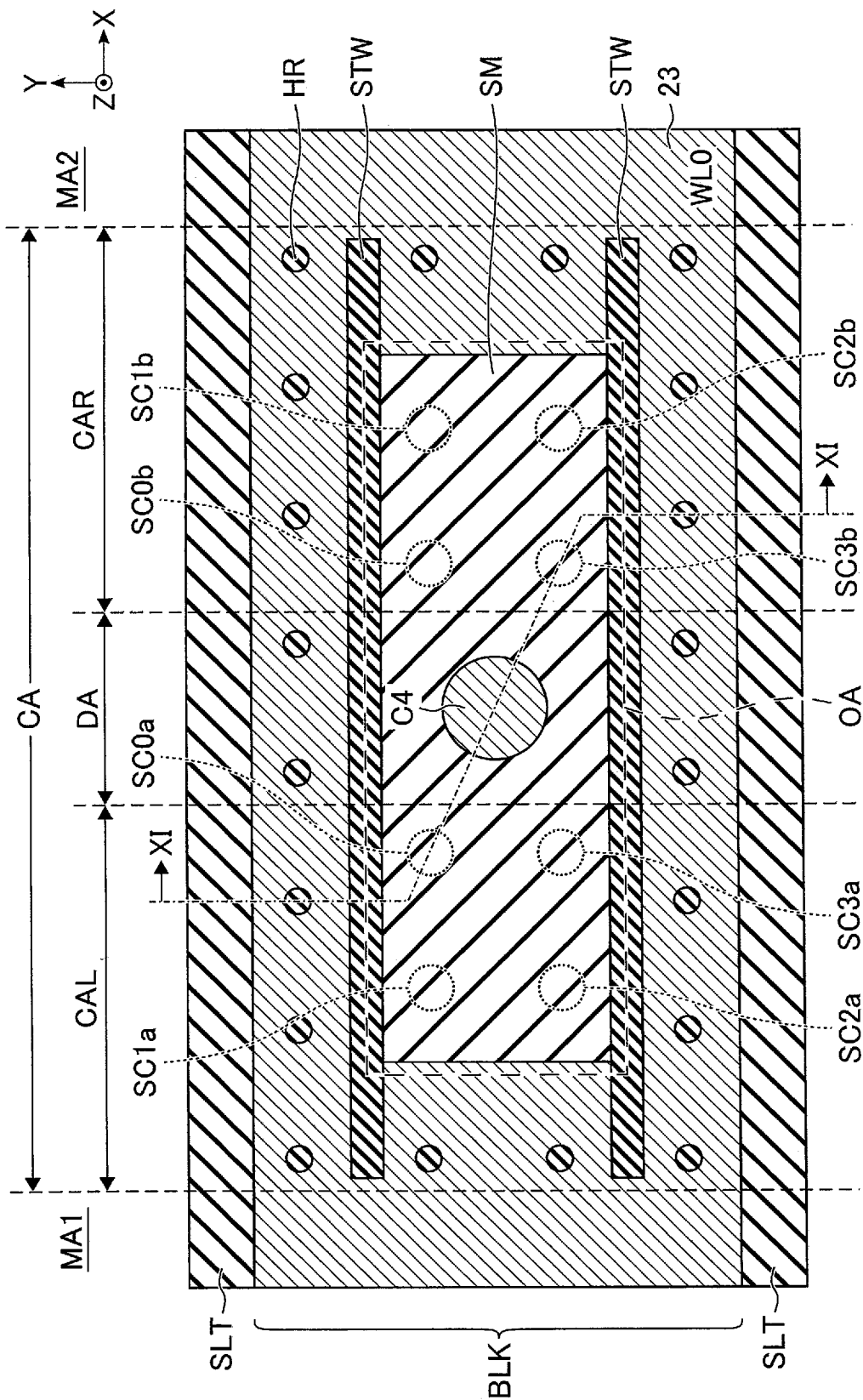
FIG. 10 is a cross-sectional view illustrating an example of a cross-sectional structure in the contact area of the semiconductor memory device according to the first embodiment.

FIG. 10 illustrates an example of a cross-sectional structure in the contact area CA of the memory cell array 10 included in the semiconductor memory device 1 according to the first embodiment, and illustrates a cross section which includes the conductive layer 23 corresponding to the word line WL0 and is parallel to the surface of the semiconductor substrate 20. As illustrated in FIG. 10, in the contact area CA, the memory cell array 10 further includes a plurality of wall portions STW and a sacrificial member SM. In addition, for example, the conductive layer 23 is continuously provided between the memory areas MA1 and MA2 via the contact area CA.

The wall portion STW is provided to extend in the X direction. In addition, for example, two wall portions STW are spaced apart from the slits SLT between the mutually neighboring slits SLT, and are arranged in the Y direction. Further, the mutually neighboring wall portions STW are spaced from each other. The sacrificial member SM is provided between the two wall portions STW. Specifically, each of the two wall portions STW includes a portion which is interposed between the conductive layer 23 and sacrificial member SM.

The sacrificial member SM is a member which is used in a replacement process of a stacked interconnect, the member being left in a manufacturing step of the semiconductor memory device 1. The sacrificial member SM includes, for example, silicon nitride. End portions of the sacrificial member SM in the X direction are in contact with the conductive layer 23. Those portions of the conductive layer 23, which are in contact with the sacrificial member SM, are located, for example, between the two wall portions STW.

That area in the above-described contact area CA, in which the sacrificial member SM is provided, corresponds to the penetration area OA. Specifically, the contact C4 penetrates the sacrificial member SM. In addition, in the semiconductor memory device 1 according to the first embodiment, the dispositions in plan view of the contacts SC0a to SC3a and SC0b to SC3b overlap the area in which the sacrificial member SM is provided. In other words, the dispositions in plan view of the contacts SC0a to SC3a and SC0b to SC3b are interposed between the two wall portions STW.

Note that the memory cell array 10 may include, in the contact area CA, a plurality of support pillars HR. For example, the support pillars HR are arranged as appropriate between the mutually neighboring slits SLT and in the area where the conductive layer 23 is provided. The shape of the support pillar HR may be changed in accordance with the disposition thereof. For example, the cross-sectional shape of the support pillar HR may be elliptic.

Figure 11:
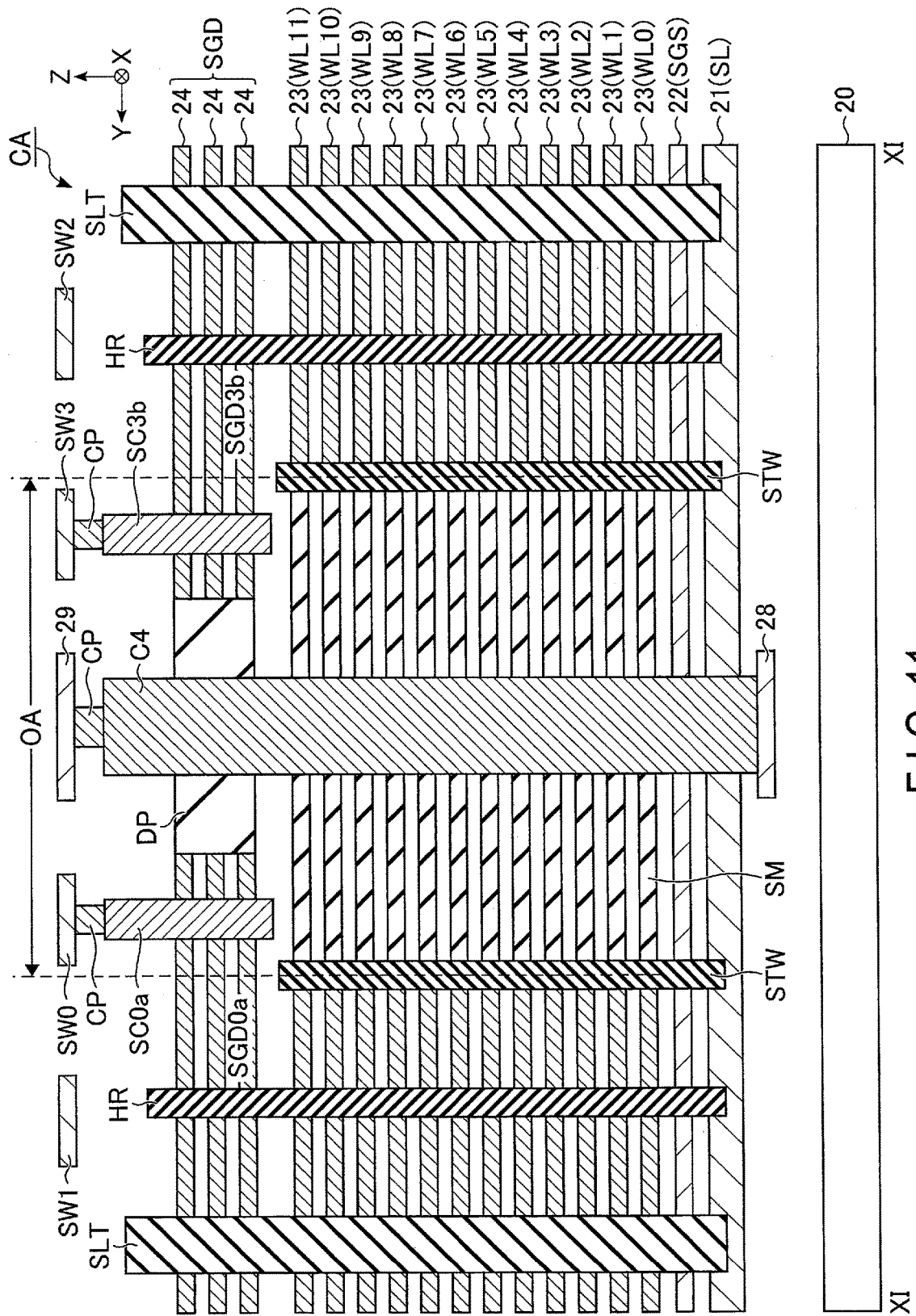
FIG. 11 is a cross-sectional view, taken along line XI-XI in FIG. 10, illustrating an example of a cross-sectional structure in the contact area of the semiconductor memory device according to the first embodiment.

FIG. 11 is a cross-sectional view, taken along line XI-XI in FIG. 10, illustrating an example of a cross-sectional structure in the contact area CA of the memory cell array 10 included in the semiconductor memory device 1 according to the first embodiment. As illustrated in FIG. 11, in the contact area CA, the memory cell array 10 further includes conductive layers 28 and 29 and a plurality of contacts CP.

The wall portion STW includes a portion extending in the Z direction. An upper end of the wall portion STW is included in a layer between the uppermost conductive layer 23 and lowermost conductive layer 24. A lower end of the wall portion STW is included, for example, in a layer in which the conductive layer 21 is provided. The sacrificial member SM is provided in the same layer as the conductive layer 23 and in a portion interposed between the two wall portions STW. An insulator is provided in the same layer as the conductive layer 24 and in a portion included in the dividing area DP.

The structures of the contacts SC0a and SC3b are the same as the structure of the contact SC. The contact SC0a is provided to penetrate the three conductive layers 24 corresponding to the select gate line SGD0a, above the sacrificial member SM. An interconnect SW0 is provided above the contact SC0a, and the contact SC0a and interconnect SW0 are connected via a contact CP. Similarly, the contact SC3b is provided to penetrate the three conductive layers 24 corresponding to the select gate line SGD3b, above the sacrificial member SM. An interconnect SW3 is provided above the contact SC3b, and the contact SC3b and interconnect SW3 are connected via a contact CP. The structures of the other contacts SC in the contact area CA are the same as those of the contacts SC0a and SC3b.

The conductive layer 28 is provided in a layer between the semiconductor substrate 20 and conductive layer 21, and is connected to circuitry under the memory cell array 10. The contact C4 is provided on the conductive layer 28. The contact C4 is provided to extend in the Z direction, and penetrates the insulator in the dividing area DP and the sacrificial members SM. Note that an insulating layer (not shown) is disposed between the contact C4 and the conductive layers 21 and 22, and the contact C4 and the conductive layers 21 and 22 are isolated and insulated. A conductive layer 29 is provided above the contact C4. The conductive layer 29 is provided, for example, in the same layer as the interconnects SW0 to SW3, and is connected to circuitry above the memory cell array 10. The contact C4 and conductive layer 29 are connected via a contact CP.

In the above description, the case in which the memory cell array 10 includes one contact area CA is exemplarily illustrated. However, the memory cell array 10 may include a plurality of contact areas CA. In addition, the contact area CA may be provided in the hookup area HA. When the contact area CA is provided in the hookup area HA, the above-described structure relating to the select gate lines SGD may be omitted as appropriate.

[1-2] Manufacturing Method of Semiconductor Memory Device 1

Hereinafter, referring to FIG. 12 as needed, a description will be given of an example of serial manufacturing steps relating to a formation method of a stacked interconnect structure and contacts SC in the memory cell array 10 in the semiconductor memory device 1 according to the first embodiment. In the description below, the stacked structure, which the lower pillar LP penetrates, is called "lower layer portion", and the stacked structure, which the upper pillar UP penetrates, is called "upper layer portion".

Figure 12:
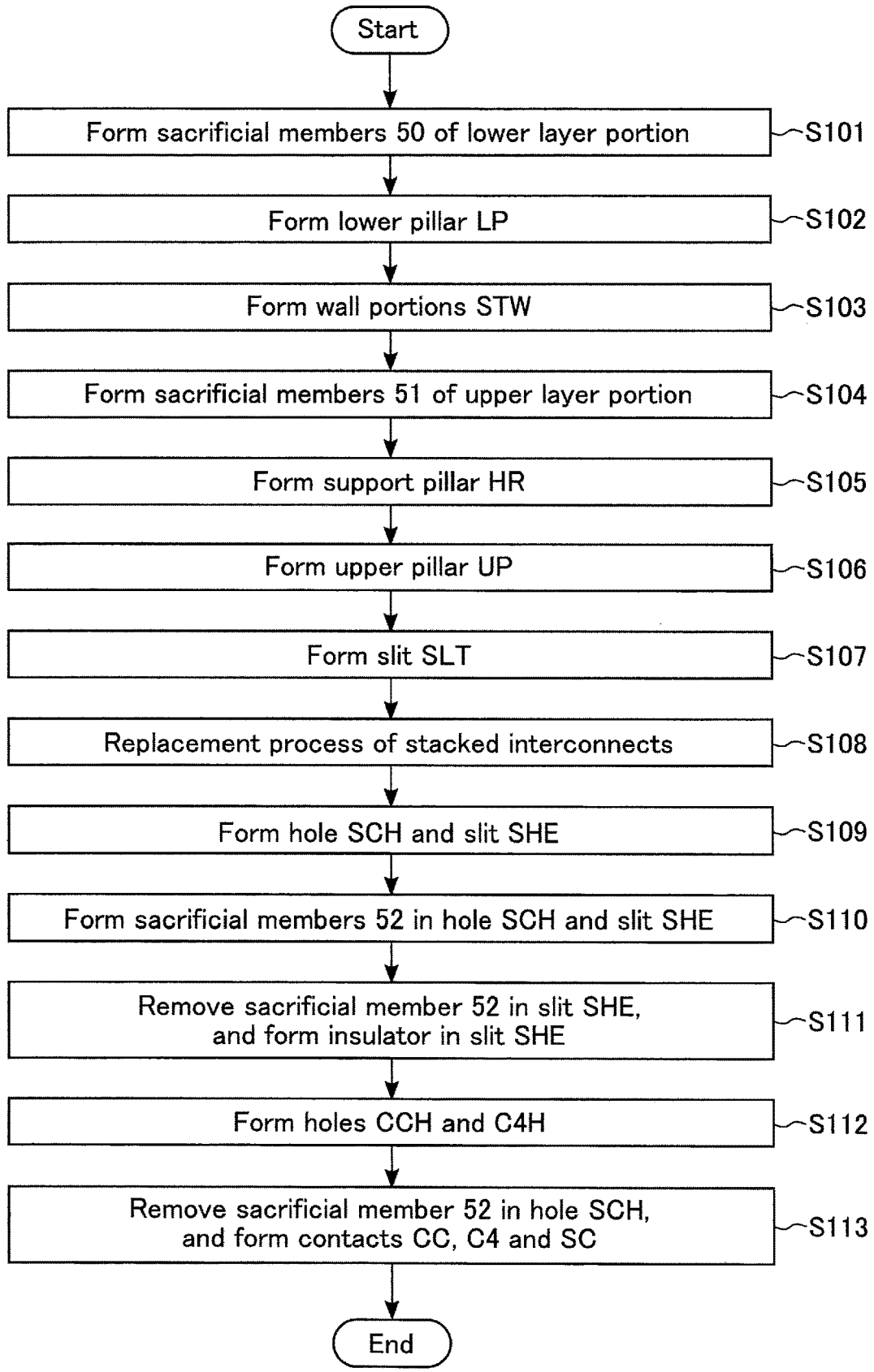
FIG. 12 is a flowchart illustrating an example of a manufacturing method of the semiconductor memory device according to the first embodiment.

FIG. 12 is a flowchart illustrating an example of a manufacturing method of the semiconductor memory device 1 according to the first embodiment. Each of FIG. 13 to FIG. 24 illustrates an example of a cross-sectional structure during the manufacture of the semiconductor memory device 1 according to the first embodiment, and illustrates, in an extracted manner, an area where the memory pillar MP and slits SLT and SHE are formed in the memory area MA2, an area where the contacts CC are formed in the hookup area HA1, and an area where the contacts C4 and SC and support pillars HR are formed in the contact area CA. As illustrated in FIG. 12, in the manufacturing process of the semiconductor memory device 1 according to the first embodiment, the processes of steps S101 to S112 are successively executed.

Figure 13:
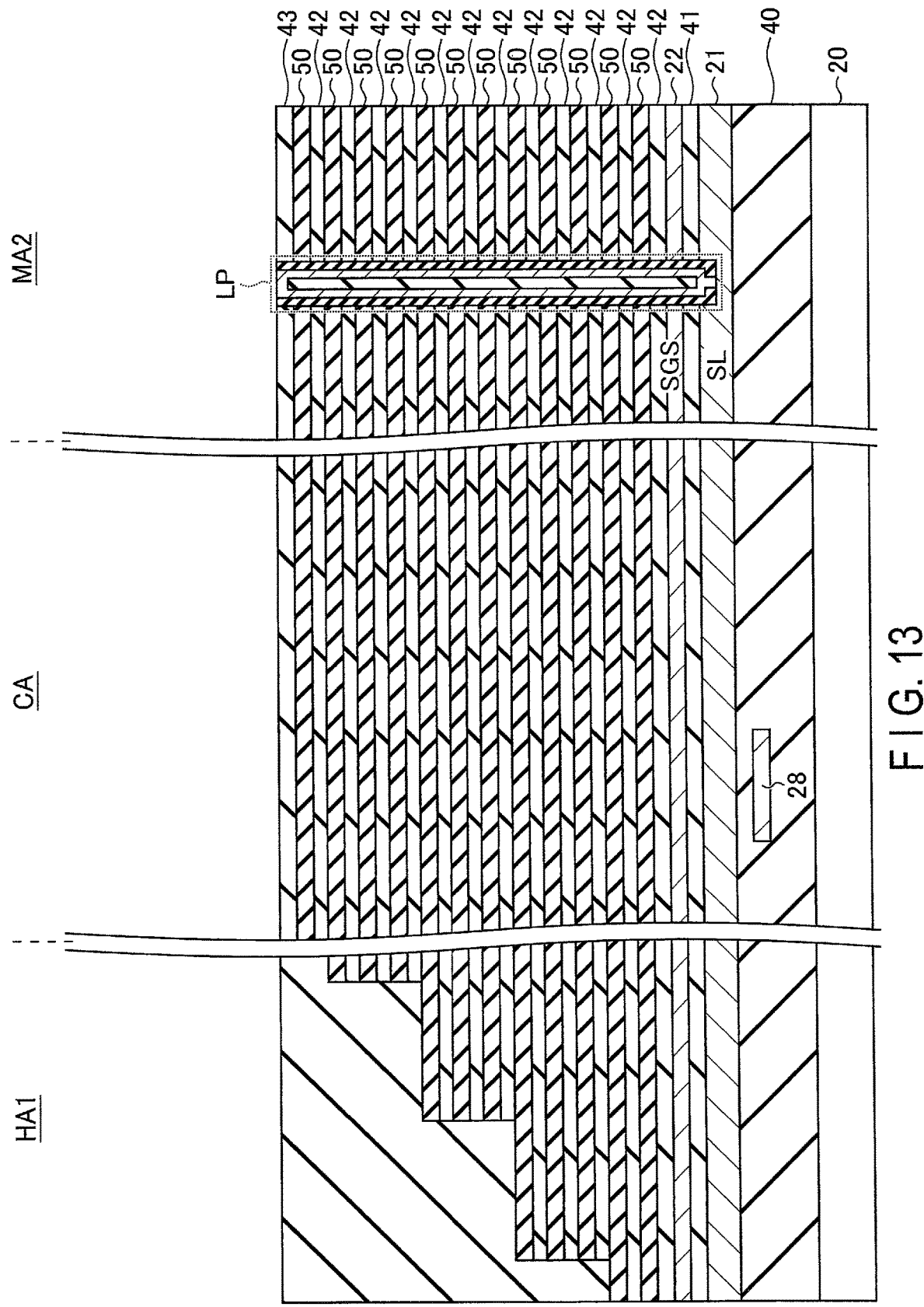
FIG. 13, FIG. 14, FIG. 15, FIG. 16, FIG. 17, FIG. 18, FIG. 19, FIG. 20, FIG. 21, FIG. 22, FIG. 23, and FIG. 24 are cross-sectional views illustrating an example of a cross-sectional structure during the manufacture of the semiconductor memory device according to the first embodiment.

Specifically, to start with, sacrificial members 50 of the lower layer portion are formed by a process of step S101, and a lower pillar LP is formed by a process of step S102, as illustrated in FIG. 13. In brief, an insulating layer 40 including circuitry (not shown) corresponding to the sense amplifier module 16 and the like, and including a conductive layer 28 and the like, is formed on a semiconductor substrate 20. A conductive layer 21, an insulating layer 41 and a conductive layer 22 are successively formed on the insulating layer 40. Insulating layers 42 and sacrificial members 50 are alternately stacked on the conductive layer 22. End portions of the stacked sacrificial members 50 are processed in a stepped shape in the hookup areas HA1 and HA2. Stepped portions in the hookup areas HA1 and HA2 are buried by an insulating layer 43, and a top surface of the insulating layer 43 is planarized by, for example, CMP (Chemical Mechanical Polishing).

Then, a mask with an opening in an area corresponding to the lower pillar LP is formed by photolithography or the like. By anisotropic etching using the mask, a hole is formed which penetrates the insulating layers 41 to 43, conductive layer 22 and sacrificial members 50. In a bottom part of the hole, a portion of the conductive layer 21 is exposed. Then, a block insulation film 38, an insulating film 37 and a tunnel insulation film 36 are successively formed on a side surface and a bottom surface of the hole, and portions of the block insulation film 38, insulating film 37 and tunnel insulation film 36, which are provided on the bottom part of the hole, are removed. Thereafter, a semiconductor layer 31 and a core member 30 are formed in the hole.

Figure 14:
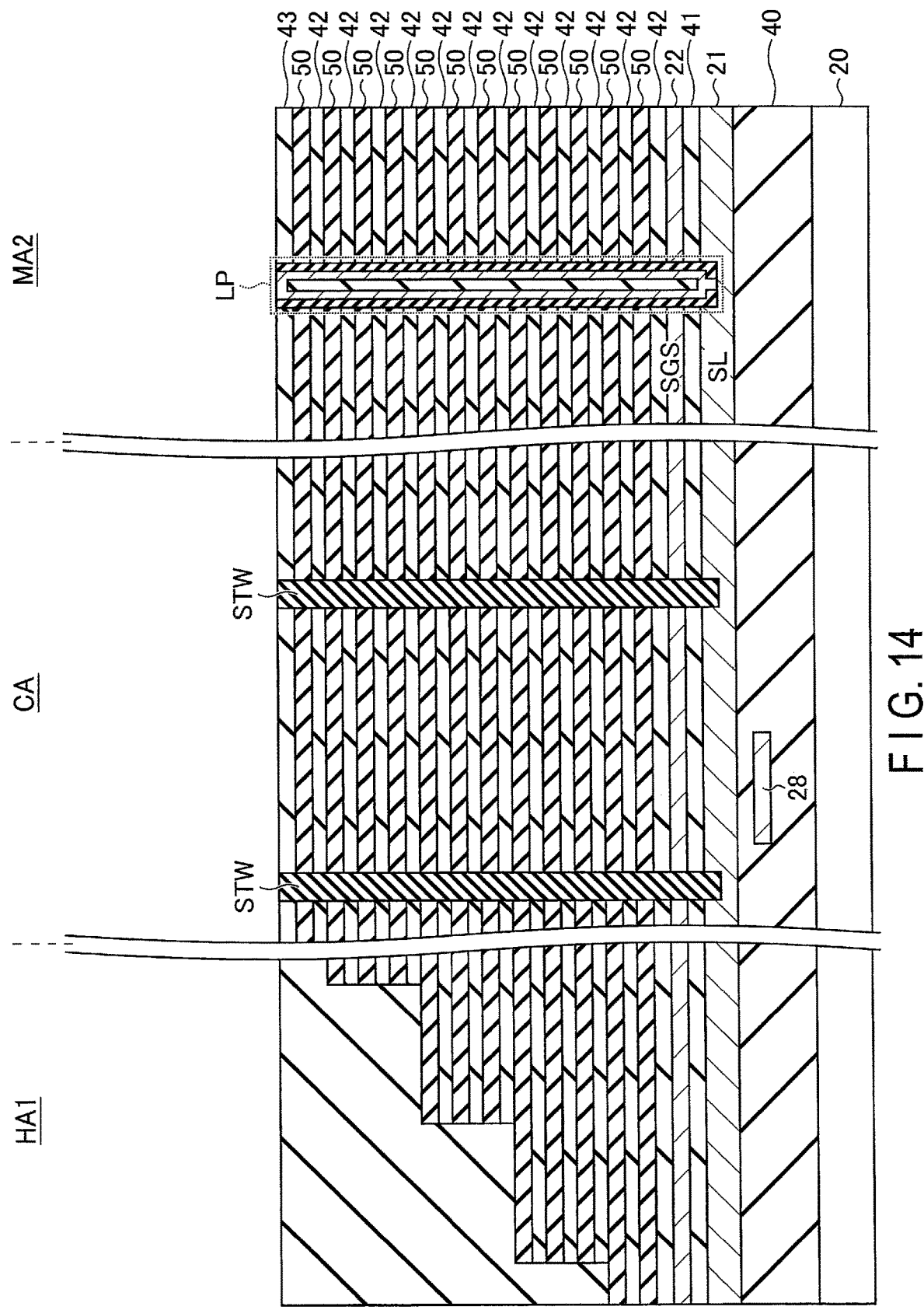

Next, by a process of step S103, wall portions STW are formed as illustrated in FIG. 14. Specifically, a mask with openings in areas corresponding to the wall portions STW is first formed by photolithography or the like. By anisotropic etching using the mask, slits are formed which penetrate the insulating layers 41 to 43, conductive layer 22 and sacrificial members 50. Then, the slits are filled with an insulator, and thereby structures corresponding to the wall portions STW are formed.

Figure 15:
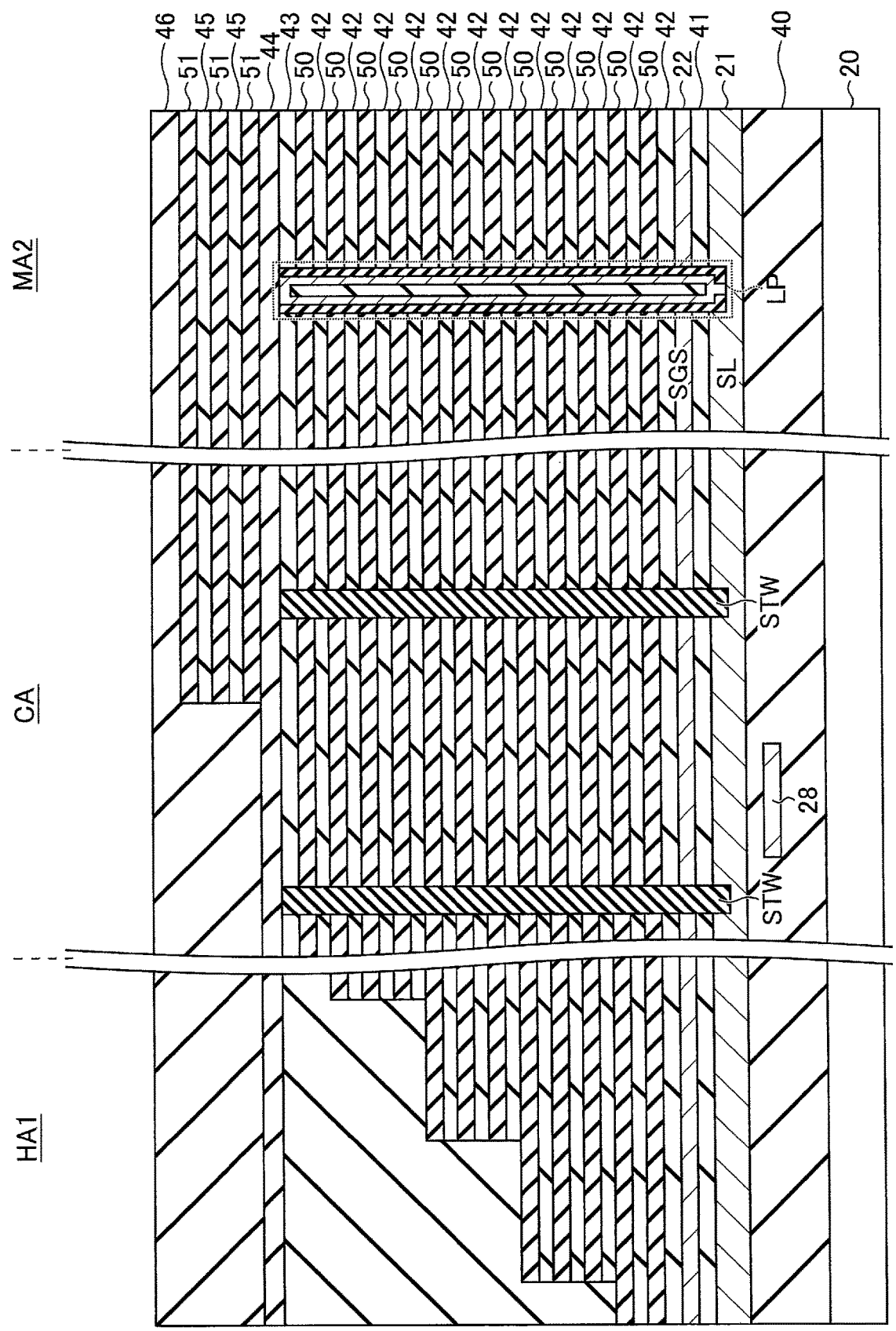

Next, by a process of step S104, sacrificial members 51 of the upper layer portion are formed as illustrated in FIG. 15. Specifically, an insulating layer 44 is formed on the insulating layer 43, and the sacrificial members 51 and insulating layers 45 are alternately stacked on the insulating layer 44. Then, by photolithography or the like, a mask is formed which has, at least, openings in areas corresponding to terrace portions of the word lines WL and select gate line SGS in the hookup areas HA1 and HA2, and an opening in an area corresponding to the dividing area DA. Then, by etching using the mask, the sacrificial members 51 and insulating layers 45 provided in the openings are removed. Thereafter, the formed steps are buried by an insulating layer 46, and a top surface of the insulating layer 46 is planarized by, for example, CMP.

Figure 16:
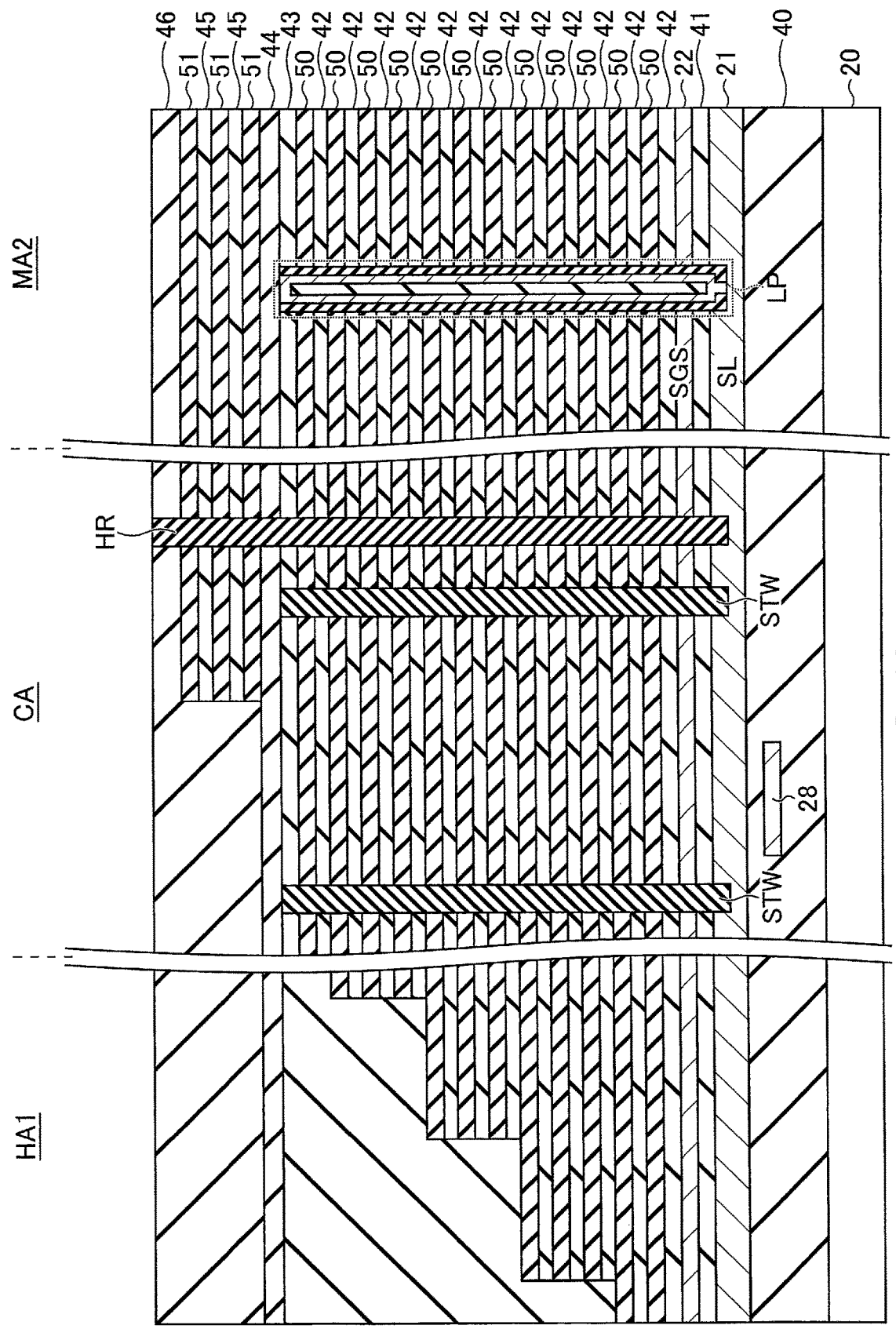

Next, by a process of step S105, a support pillar HR is formed as illustrated in FIG. 16. Specifically, a mask with an opening in an area corresponding to the support pillar HR is first formed by photolithography or the like. Then, by anisotropic etching using the mask, a hole is formed which penetrates, for example, the insulating layers 41 to 46, conductive layer 22 and sacrificial members 50 and 51. Subsequently, the hole is filled with an insulator, and thereby a structure corresponding to the support pillar HR is formed.

Figure 17:
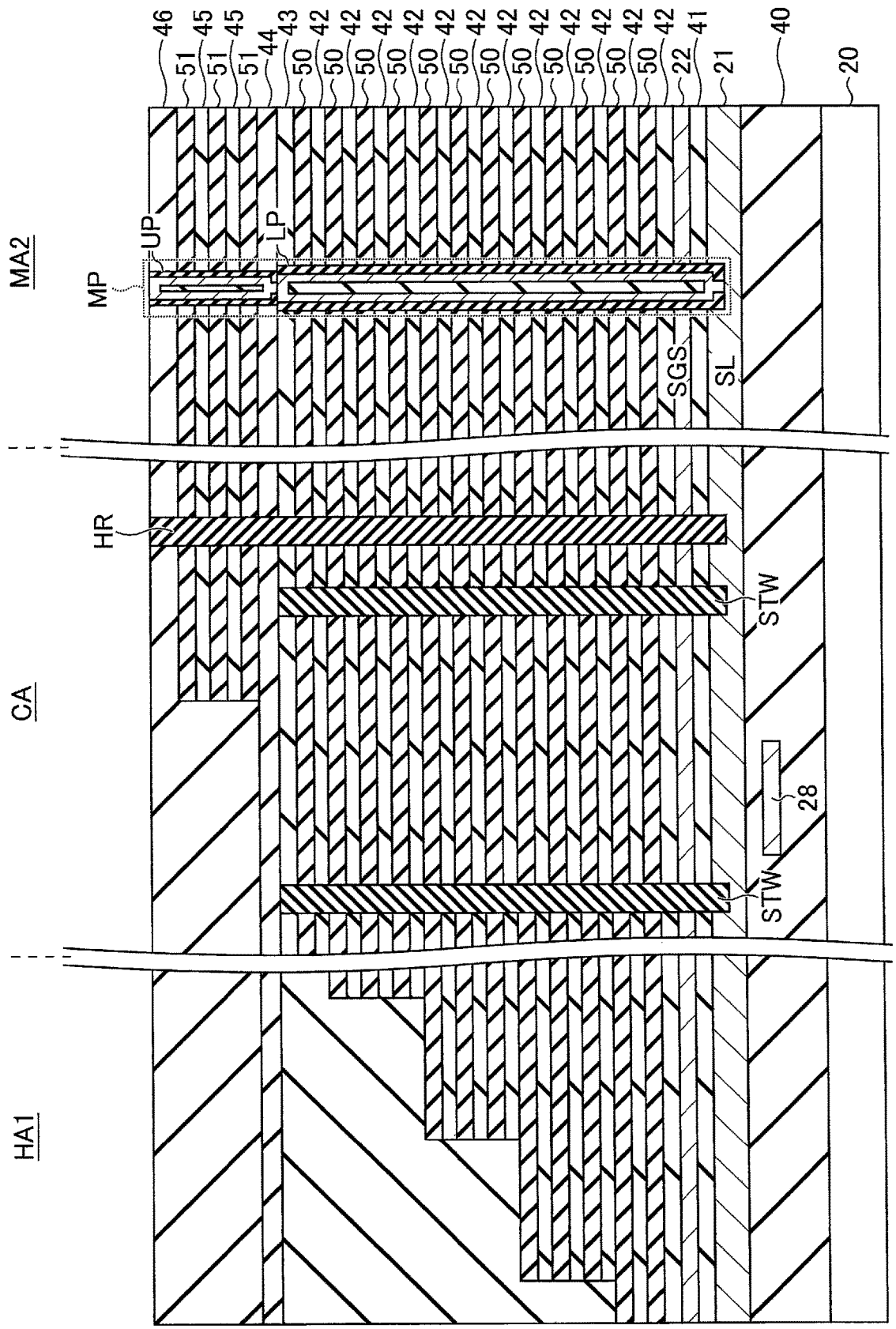

Next, by a process of step S106, an upper pillar UP is formed as illustrated in FIG. 17. Specifically, a mask with an opening in an area corresponding to the upper pillar UP is formed by photolithography or the like. Then, by anisotropic etching using the mask, a hole is formed which penetrates the insulating layers 44 to 46 and sacrificial members 51. In a bottom part of the hole, a portion of the semiconductor layer 31 in the lower pillar LP is exposed. Then, a gate insulation film 35 is formed on a side surface and a bottom surface of the hole, and a portion of the gate insulation film 35 provided on the bottom part of the hole is removed. Thereafter, a semiconductor layer 34 and a core member 33 are formed in the hole. Thereby, a structure in which the lower pillar LP and upper pillar UP are coupled, i.e. a memory pillar MP, is formed.

Figure 18:
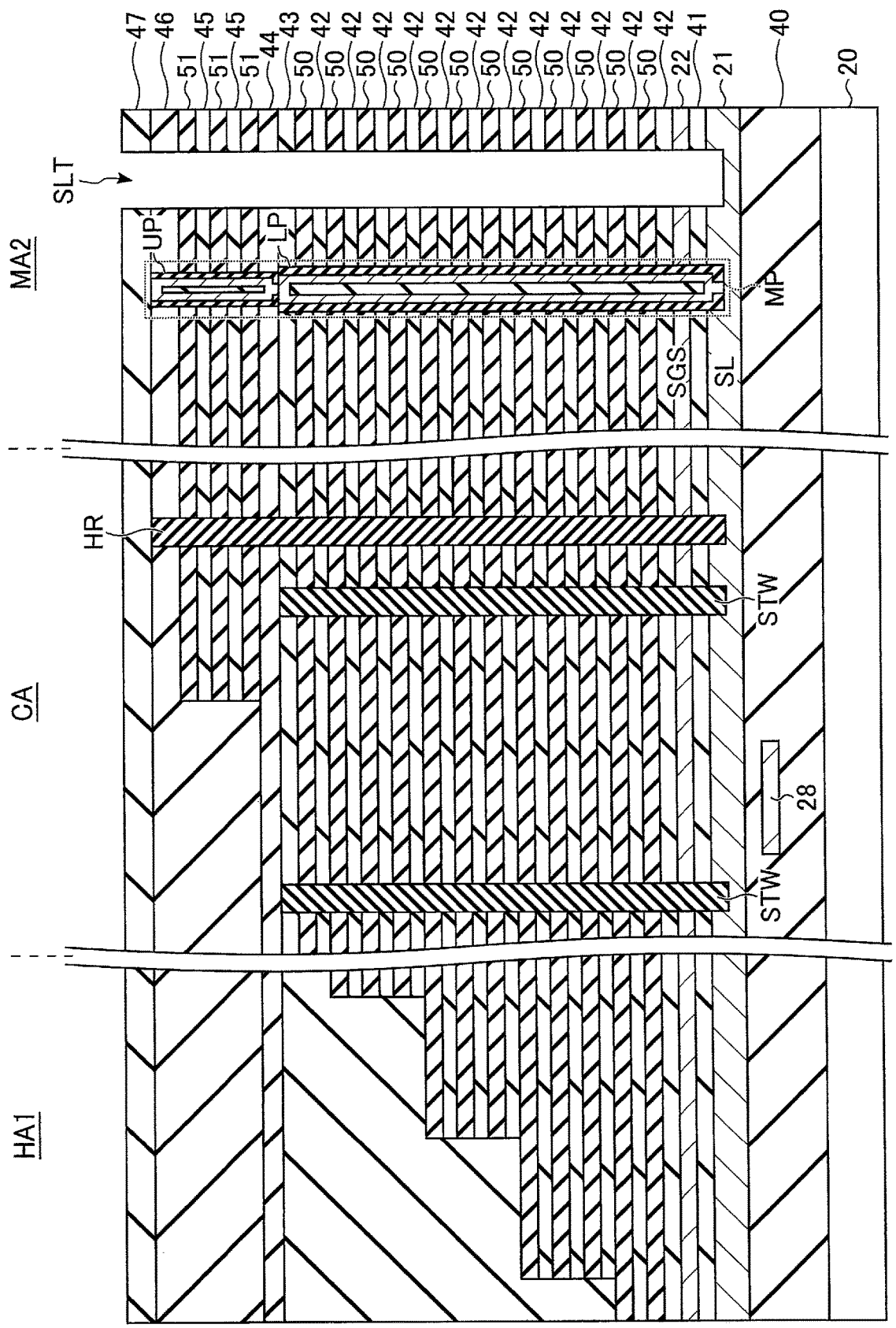

Next, by a process of step S107, a slit SLT is formed as illustrated in FIG. 18. Specifically, an insulating layer 47 is first formed on the insulating layer 46. Then, a mask with an opening in an area corresponding to the slit SLT is formed by photolithography or the like. Subsequently, by anisotropic etching using the mask, a slit is formed which divides the insulating layers 41 to 47, conductive layer 22 and sacrificial members 50 and 51. In the present example, at least side surfaces of all sacrificial members 50 and 51 are exposed in the slit SLT.

Figure 19:
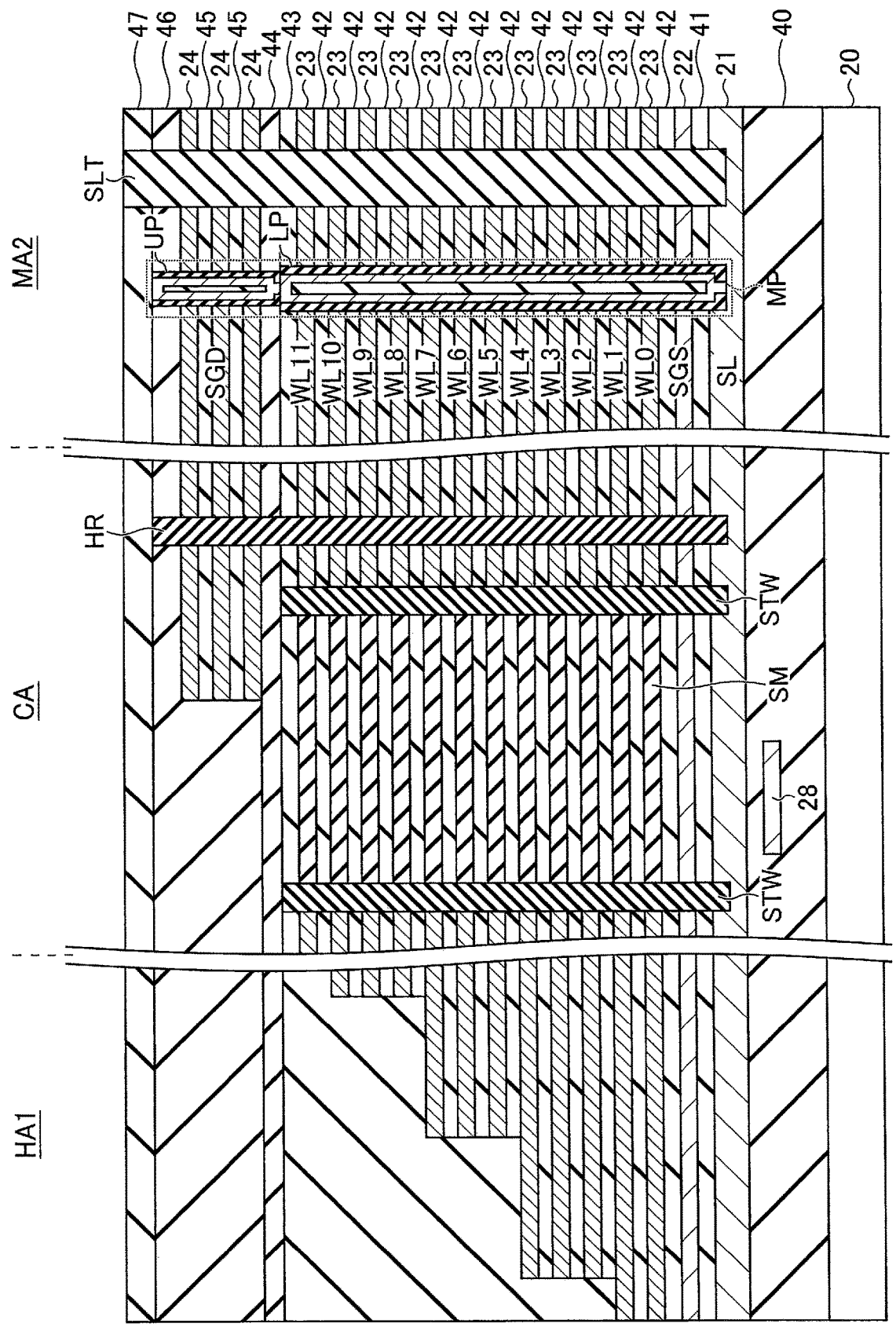

Next, by a process of step S108, a replacement process of stacked interconnects is executed, and a stacked interconnect structure is formed as illustrated in FIG. 19. Specifically, the sacrificial members 50 and 51 are selectively removed via the slit SLT by wet etching using hot phosphoric acid or the like. At this time, the three-dimensional structure of a structure body in which the sacrificial members 50 and 51 are removed is kept by the memory pillars MP, support pillars HR and wall portions STW. Then, conductors are buried, via the slit SLT, in the spaces from which the sacrificial members 50 and 51 are removed. For example, CVD (Chemical Vapor Deposition) is used for the formation of the conductors in this step.

Thereafter, by an etch-back process, the conductors formed in the inside of the slit SLT are removed, and the conductors formed in mutually adjacent interconnect layers are separated. Then, the slit SLT is filled with an insulator. Thereby, conductive layers 23 functioning as the word lines WL0 to WL11, and conductive layers 24 functioning as the select gate lines SGD are formed. The conductive layers 23 and 24 formed in the present step may include barrier metals. In this case, in the formation of conductors after the removal of the sacrificial members 50 and 51, for example, a film of titanium nitride is formed as a barrier metal, and then tungsten is formed.

Figure 20:
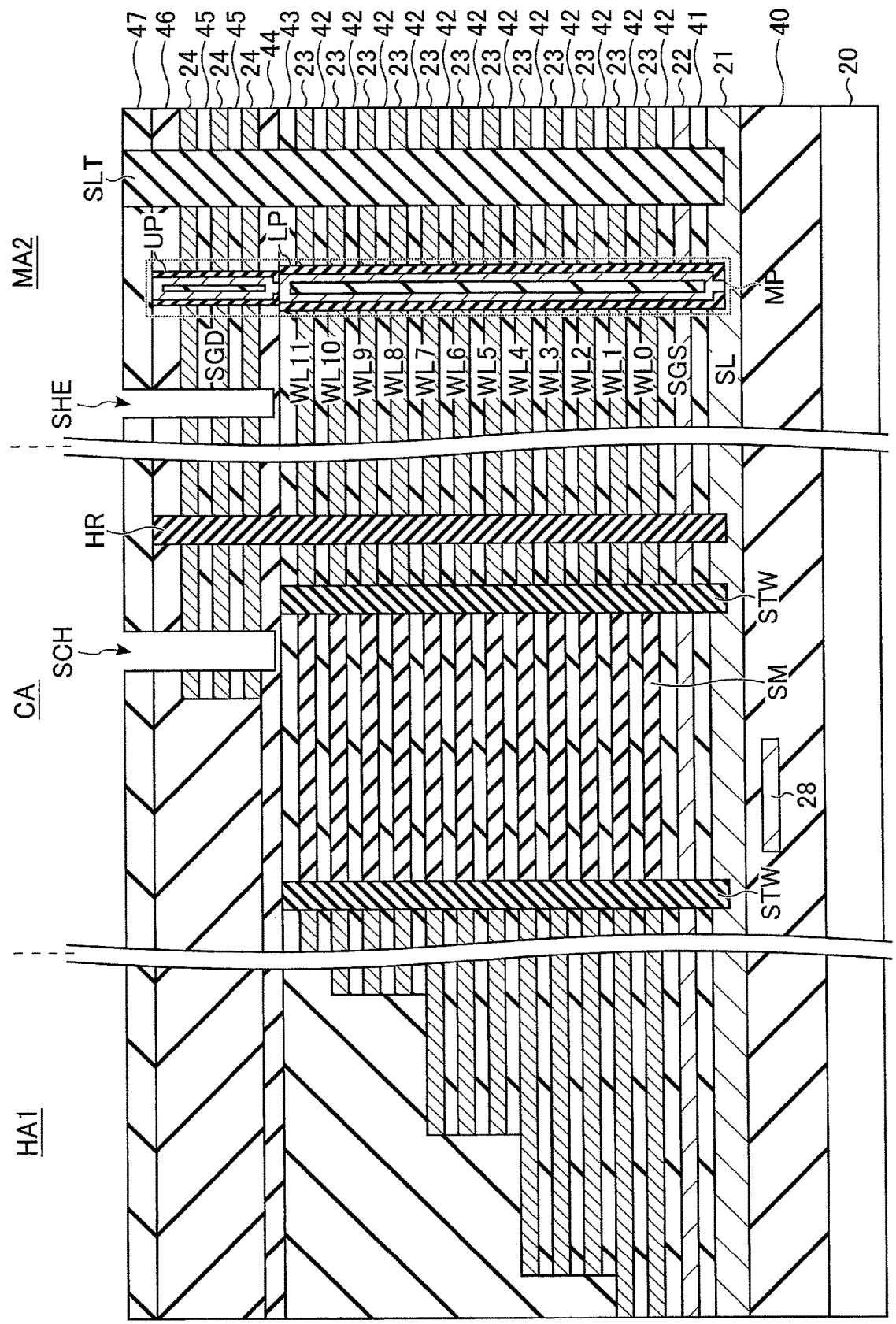

Next, by a process of step S109, a hole SCH and a slit SHE are formed as illustrated in FIG. 20. Specifically, a mask with openings in areas corresponding to the hole SCH and slit SHE is first formed by photolithography or the like. Then, by anisotropic etching using the mask, the hole SCH and slit SHE are formed which penetrate the insulating layers 45 to 47 and conductive layers 24. In the present example, the stacked conducive layers 24 are exposed in the hole SCH at this time.

Figure 21:
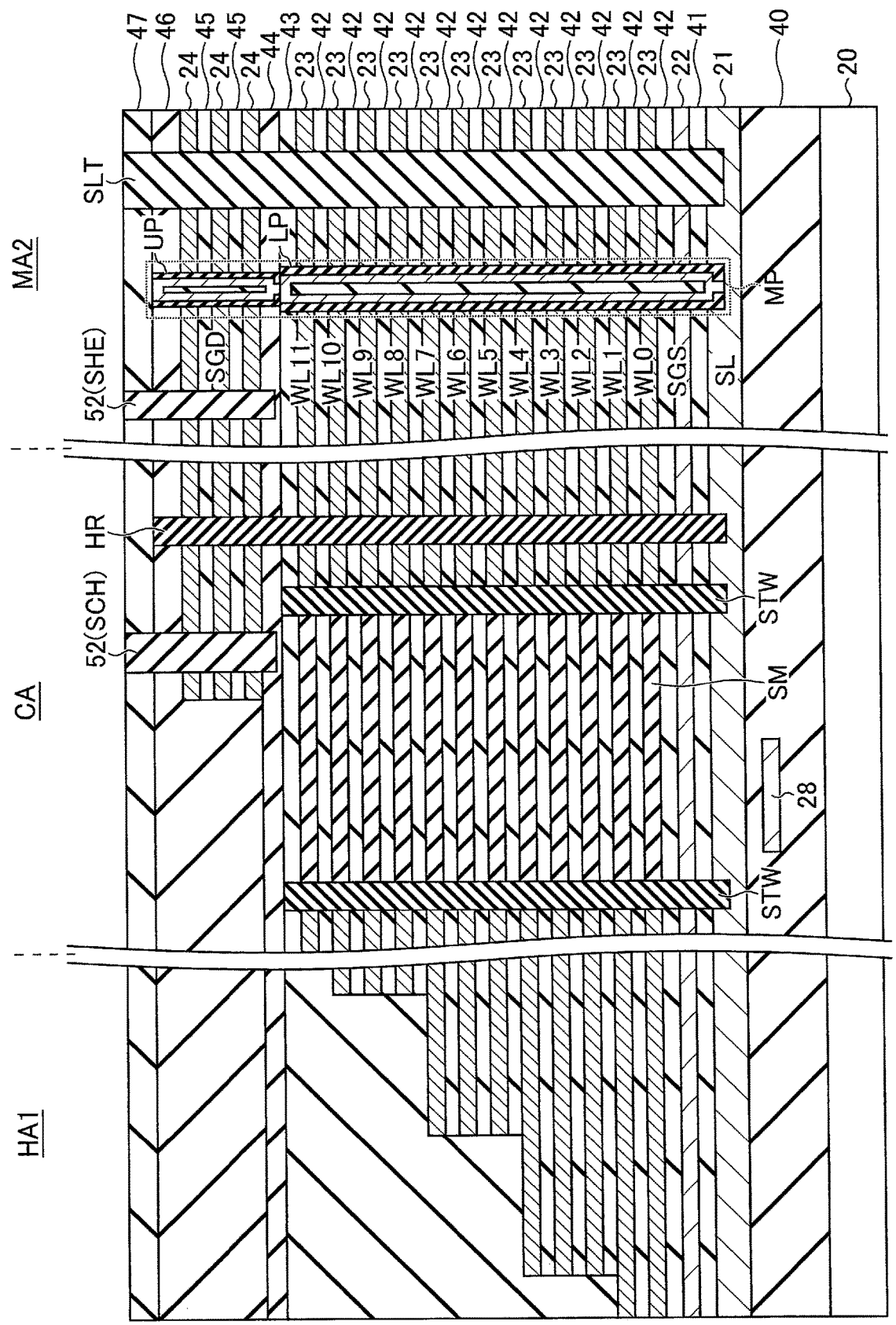

Next, by a process of step S110, sacrificial members 52 are formed in the hole SCH and slit SHE, as illustrated in FIG. 21. The sacrificial members 52 include, for example, silicon nitride. The sacrificial members 52 formed outside the hole SCH and slit SHE are removed by, for example, CMP.

Figure 22:
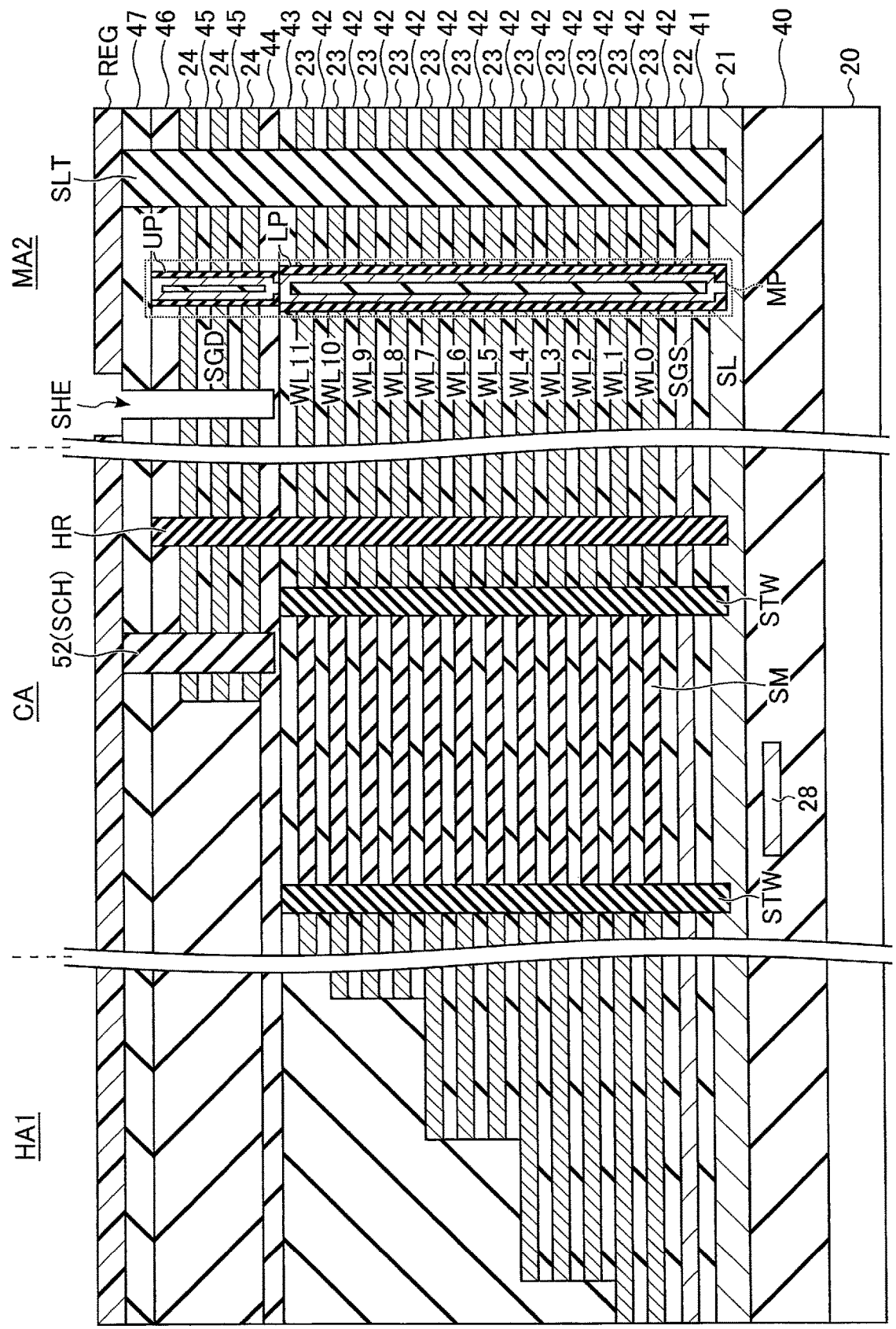

Next, by a process of step S111, the sacrificial member 52 in the slit SHE is removed as illustrated in FIG. 22, and an insulator is formed in the slit SHE. Specifically, a mask REG with an opening in an area corresponding to the slit SHE is first formed by photolithography or the like. Then, by etching using the mask REG, the sacrificial member 52 formed in the slit SHE is removed. Subsequently, the mask REG is removed, and the slit SHE is filled with an insulator.

Figure 23:
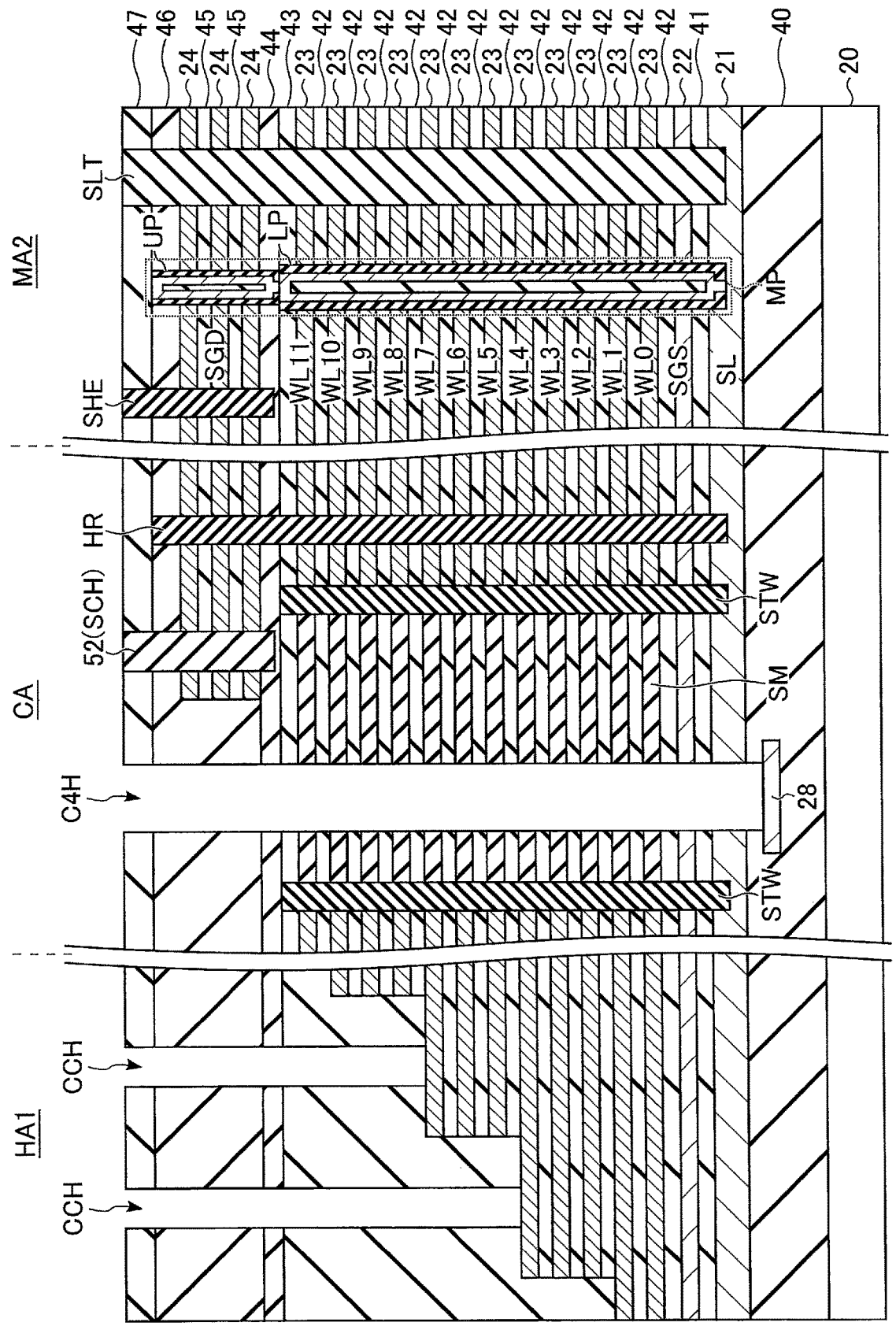

Next, by a process of step S112, holes CCH and C4H are formed as illustrated in FIG. 23. Specifically, a mask with openings in areas corresponding to the holes CCH and C4H is first formed by photolithography or the like. Then, by etching using the mask, the holes CCH and hole C4H are formed. The holes CCH penetrate, for example, the insulating layers 43 to 47, and portions of the conductive layers 23 are exposed in bottom parts of the holes CCH. The hole C4H penetrates the insulating layers 41 to 47, conductive layers 21 and 22 and sacrificial members SM, and a portion of the conductive layer 28 is exposed in a bottom part of the C4H.

Figure 24:
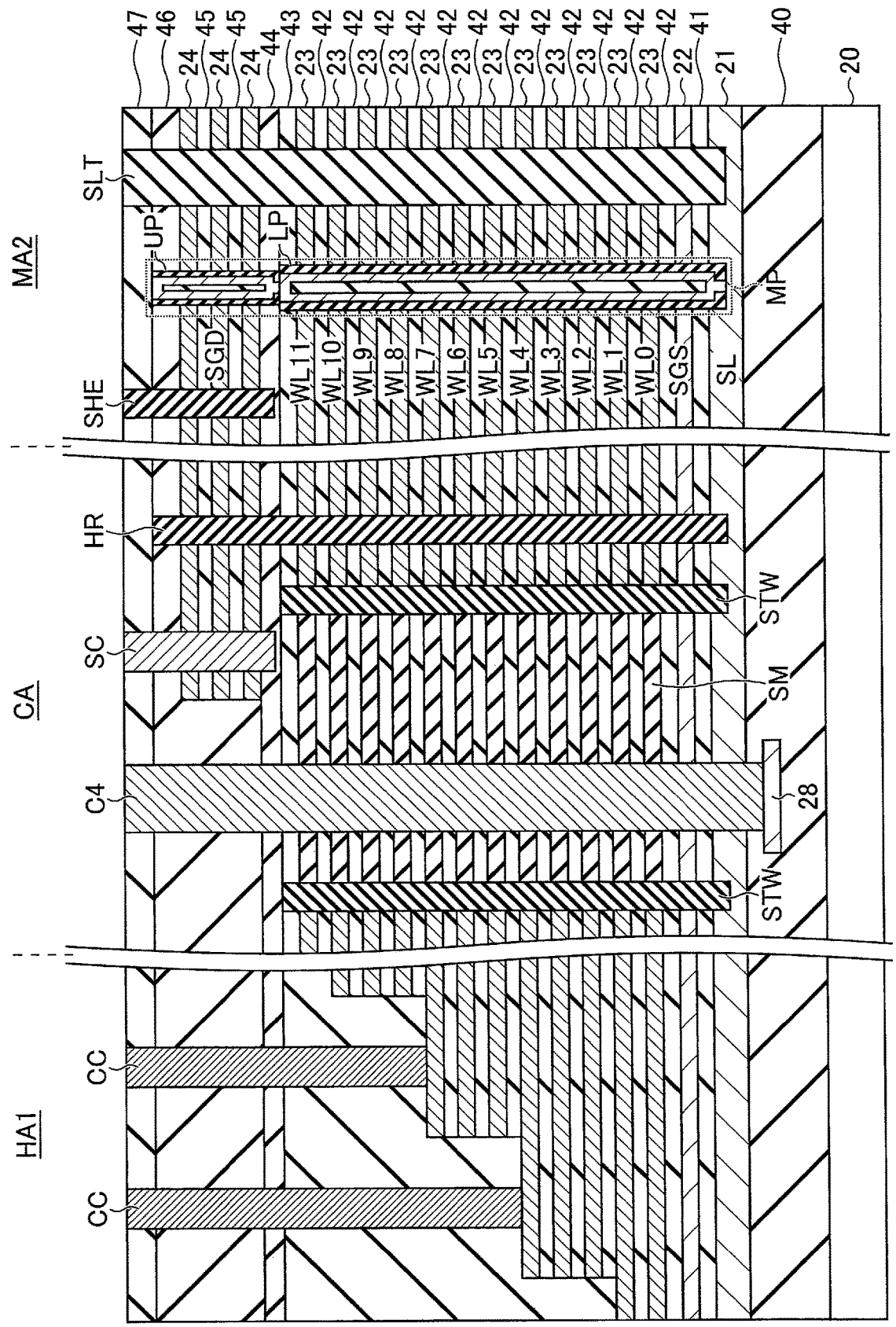

Next, by a process of step S113, the sacrificial member 52 in the hole SCH is removed, and contacts CC, C4 and SC are formed as illustrated in FIG. 24. Specifically, the sacrificial member 52 in the hole SCH is first removed by wet etching or the like. Then, conductors are formed in a manner to fill the holes CCH, C4H and SCH, and conductors formed outside the holes CCH, C4H and SCH are removed by, for example, CMP. Thereby, the contacts CC, C4 and SC are formed.

By the above-described manufacturing process of the semiconductor memory device 1 according to the first embodiment, the stacked interconnect structure and contacts SC in the memory cell array 10 are formed. Note that the above-described manufacturing process is merely an example, and the manufacturing process is not limited to this. For example, other processes may be inserted between the respective manufacturing steps, and some steps may be omitted or integrated.

[1-3] Advantageous Effects of the First Embodiment

According to the above-described semiconductor memory device 1 of the first embodiment, the manufacturing yield of semiconductor memory devices can be improved. Hereinafter, the advantageous effects of the semiconductor memory device 1 according to the first embodiment will be described in detail.

In a semiconductor memory device in which memory cells are three-dimensionally stacked, interconnects, such as word lines WL, are stacked. As a method of forming such stacked interconnects, a replacement process using sacrificial members is known. In addition, in order to reduce a chip area, it is conceivable to form a memory pillar in which a pillar penetrating word lines WL and a pillar penetrating select gate lines SGD are coupled. In this case, for example, in order to simultaneously form the word lines WL and select gate lines SGD by the replacement process, the word lines WL and select gate lines SGD are formed to have similar thickness.

On the other hand, with formation of memory pillars MP at high density, there is concern that the wiring resistance of select gate lines SGD increases. In connection with this, as a method of lowering the wiring resistance of select gate lines SGD, it is conceivable to stack select gate lines SGD and to provide a contact SC which shunts the select gate lines SGD. However, if over-etching occurs in the etching step for forming the contact SC which penetrates the select gate lines SGD, short-circuit may occur between the select gate lines SGD and word lines WL. In short, there may occur a chip defect due to short-circuit between the select gate lines SGD and word lines WL.

Taking this into account, the semiconductor memory device 1 according to the first embodiment has such a structure that the penetration area OA is disposed under the contact SC which penetrates the stacked select gate lines SGD. The penetration area OA is an area in which the sacrificial members SM for use in the replacement process of stacked interconnects are left, and this area includes the contact C4 which penetrates, for example, the stacked interconnects. In addition, the sacrificial members SM, which are left in the penetration area OA, are formed of an insulator.

Thus, in the semiconductor memory device 1 according to the first embodiment, when the contact SC penetrates the lowermost select gate line SGD, a lower portion of the contact SC comes in contact with the sacrificial member SM. Specifically, even when the contact SC and sacrificial member SM are put in contact, the select gate lines SGD and the word lines WL are insulated by the sacrificial members SM. Therefore, the semiconductor memory device 1 according to the first embodiment can suppress the occurrence of a short-circuit defect between the select gate lines SGD and word lines WL due to the contact SC, and can improve the manufacturing yield.

In addition, in the semiconductor memory device according to the first embodiment, a process margin in the formation of the contact SC is relaxed. Thus, the manufacturing method of the semiconductor memory device 1 according to the first embodiment has a possibility that the etching step used for the formation of the contact SC and other etching steps can be integrated. Therefore, the semiconductor memory device 1 according to the first embodiment can suppress an increase in manufacturing cost by reducing the number of manufacturing steps.

In the first embodiment, the case in which the penetration area OA is disposed in the contact area CA was exemplarily illustrated. However, the penetration area OA may be disposed in the hookup area HA. In this case, the structure corresponding to the penetration area OA is formed under the contact SC in the hookup area HA. Thereby, it is possible to suppress the occurrence of short-circuit between the select gate lines SGD and word lines WL by the contact SC in the hookup area HA. In addition, in the hookup area HA, only the contacts CC with the select gate line SGS and word lines WL may be formed, the contacts SC with the select gate lines SGD may be omitted, and the contacts SC may be exclusively disposed in the penetration area OA in the contact area CA. In this case, such a structure may be adopted that the select gate line SGD, which is led out from the contact SC disposed in the contact area CA to the interconnect SW, is electrically connected to the row decoder module 15, for example, through a shunt line in a layer above the interconnect SW. The structure of the shunt line will be described later.

[2] Second Embodiment

A semiconductor memory device 1 according to a second embodiment has a structure in which a support pillar LHR is disposed under the contact SC. Hereinafter, the semiconductor memory device 1 according to the second embodiment will be described with respect to different points from the first embodiment.

[2-1] Structure of Memory Cell Array 10 in Hookup Area HA

Figure 25:
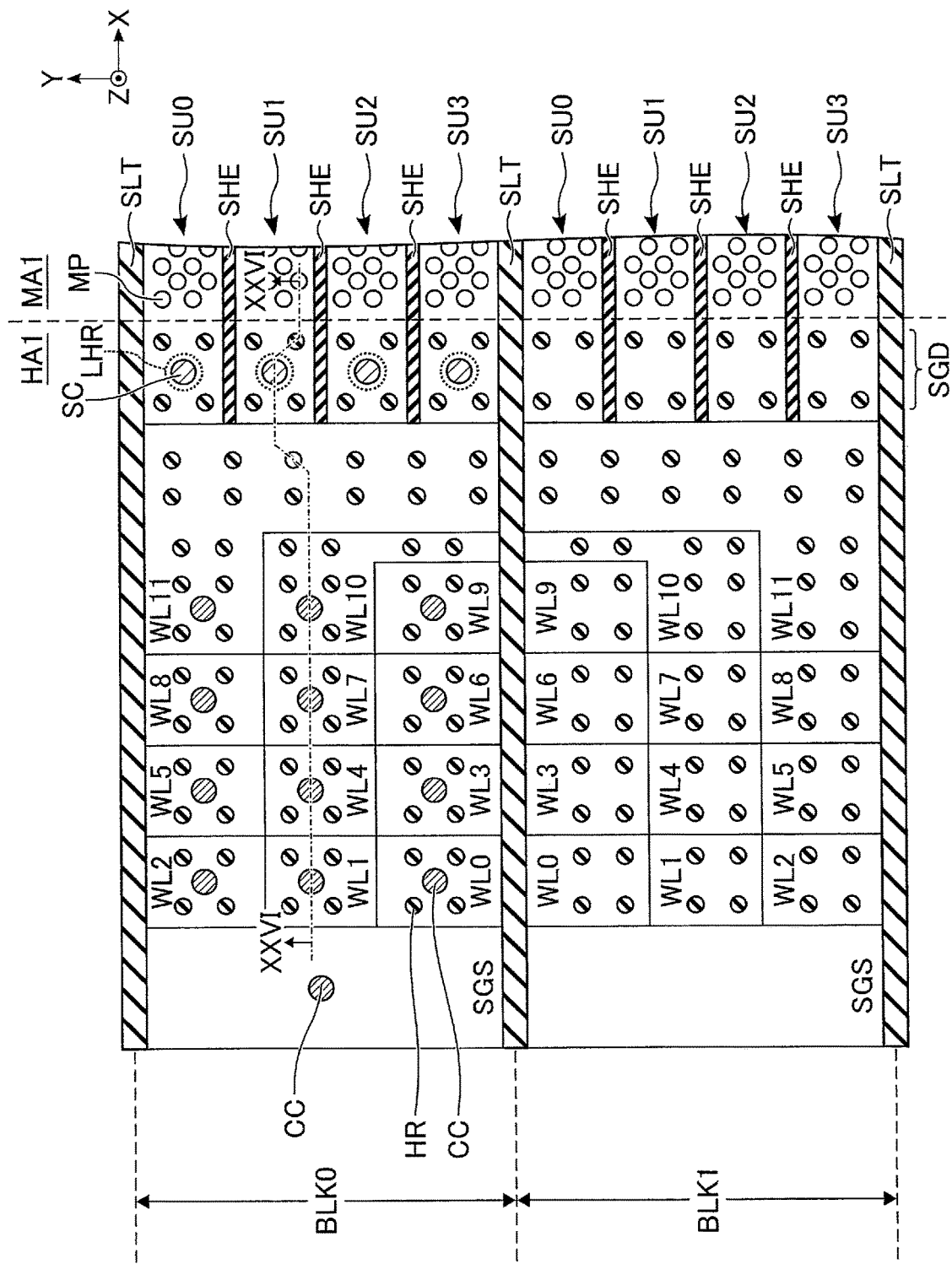
FIG. 25 is a plan view illustrating an example of a planar layout in a hookup area of a semiconductor memory device according to a second embodiment.

FIG. 25 illustrates an example of a detailed planar layout in the hookup area HA1 of a memory cell array 10 included in the semiconductor memory device 1 according to the second embodiment, FIG. 25 illustrating an area similar to the area shown in FIG. 7 described in the first embodiment. As illustrated in FIG. 25, the memory cell array 10 in the second embodiment further includes a plurality of support pillars LHR in addition to the structure of the memory cell array 10 in the first embodiment.

The support pillars LHR are disposed in a manner to overlap the contacts SC. The outside diameter and area of an upper end of the support pillar LHR are greater than the outside diameter and area of a lower end of the contact SC. In the second embodiment, it is preferable that an area in which the contact SC is disposed in plan view is included in an area in which the support pillar LHR overlapping the contact SC is disposed.

Figure 26:
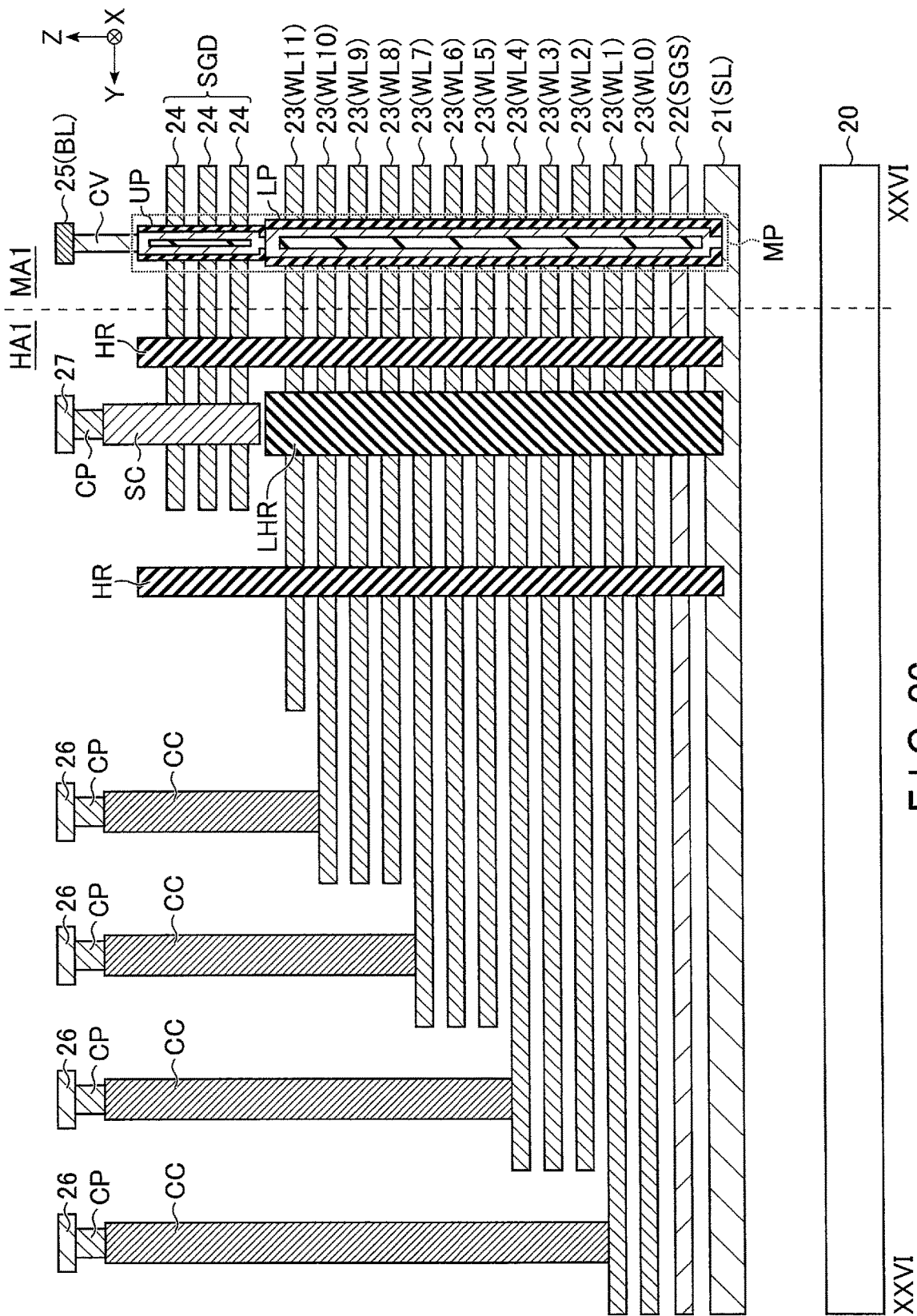
FIG. 26 is a cross-sectional view, taken along line XXVI-XXVI in FIG. 25, illustrating an example of a cross-sectional structure in the hookup area of the semiconductor memory device according to the second embodiment.

FIG. 26 is a cross-sectional view, taken along line XXVI-XXVI in FIG. 25, illustrating an example of a cross-sectional structure in the hookup area HA1 of the memory cell array 10 included in the semiconductor memory device 1 according to the second embodiment. The structure of the memory cell array 10 illustrated in FIG. 26 is the same as the structure of the memory cell array 10 illustrated in FIG. 8, except for the support pillar LHR.

The support pillar LHR is provided to extend in the Z direction, and penetrates, for example, the conductive layers 22 and 23. An upper end of the support pillar LHR is included in a layer between the uppermost conductive layer 23 and the lowermost conductive layer 24. A lower end of the support pillar LHR is included, for example, in a layer lower than the conductive layer 22. The support pillar LHR may be provided to penetrate at least the uppermost conductive layer 23. In addition, the upper end of the support pillar LHR and the lower end of the contact SC may be in contact, or may be separated. Even when the support pillar LHR and the contact SC are in contact, the contact SC is isolated and insulated from at least the conductive layer 23 by the support pillar LHR. The other structure of the semiconductor memory device 1 according to the second embodiment is the same as in the first embodiment.

[2-2] Manufacturing Method of Semiconductor Memory Device 1

Figure 27:
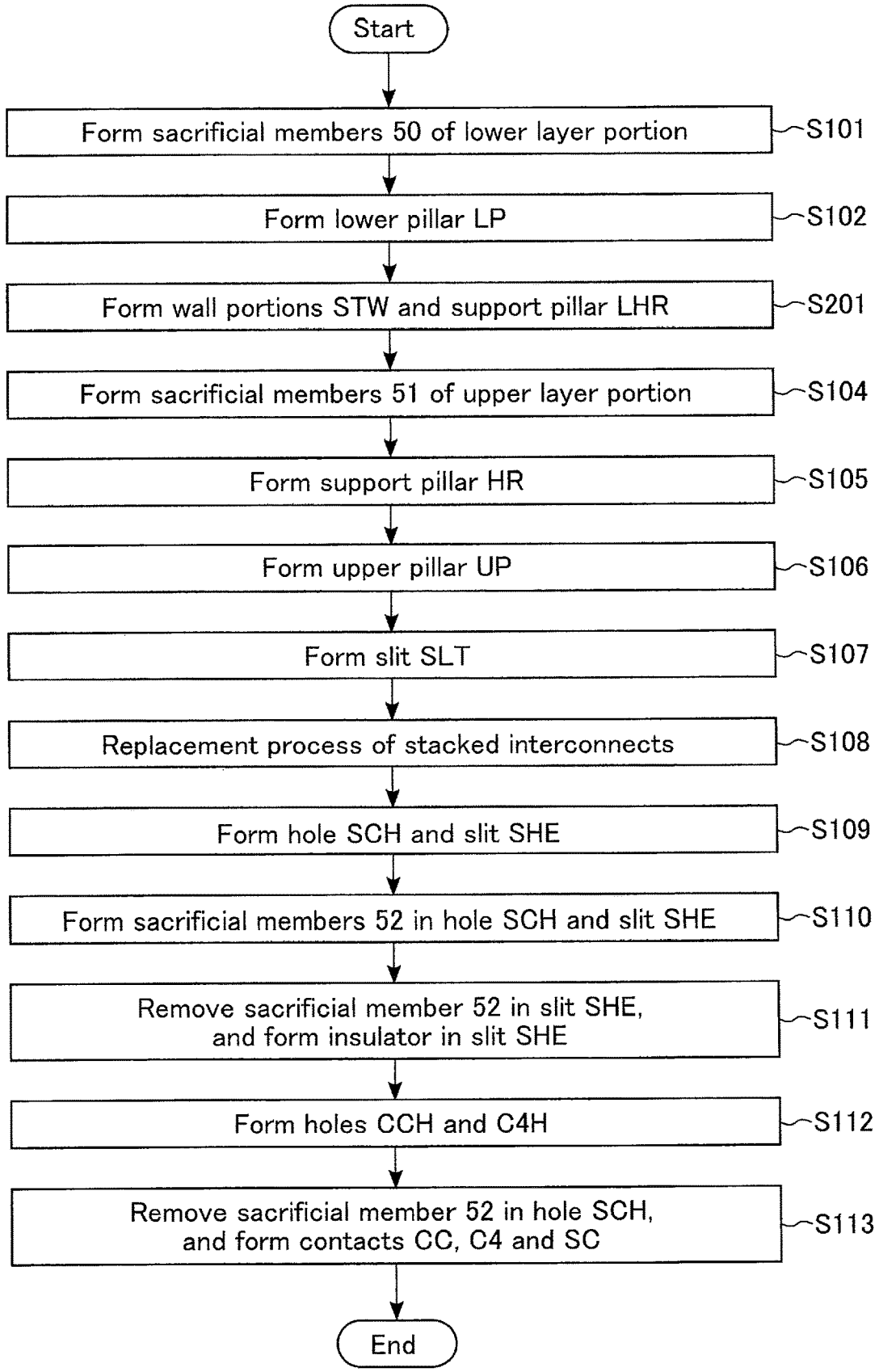
FIG. 27 is a flowchart illustrating an example of a manufacturing method of the semiconductor memory device according to the second embodiment.

Hereinafter, referring to FIG. 27 as needed, different points from the first embodiment will be described with respect to an example of serial manufacturing steps relating to a formation method of a stacked interconnect structure and contacts SC in the memory cell array 10 in the semiconductor memory device 1 according to the second embodiment. FIG. 27 is a flowchart illustrating an example of a manufacturing method of the semiconductor memory device 1 according to the second embodiment. Each of FIG. 28 to FIG. 31 illustrates an example of a cross-sectional structure during the manufacture of the semiconductor memory device 1 according to the second embodiment, and illustrates, in an extracted manner, an area where the memory pillar MP and slits SLT and SHE are formed in the memory area MA2, and an area where the contacts CC and SC and support pillars HR and LHR are formed in the hookup area HA1.

As illustrated in FIG. 27, in the manufacturing process of the semiconductor memory device 1 according to the second embodiment, the process of step S103 described in the first embodiment is replaced with a process of step S201. In other words, in the second embodiment, in the step of forming the wall portions STW in the first embodiment, the support pillars LHR are further formed.

Specifically, to start with, the processes of steps S101 and S102 are first executed in the same manner as in the first embodiment. Specifically, the sacrificial members 50 of the lower layer portion and the lower pillar LP are formed.

Figure 28:
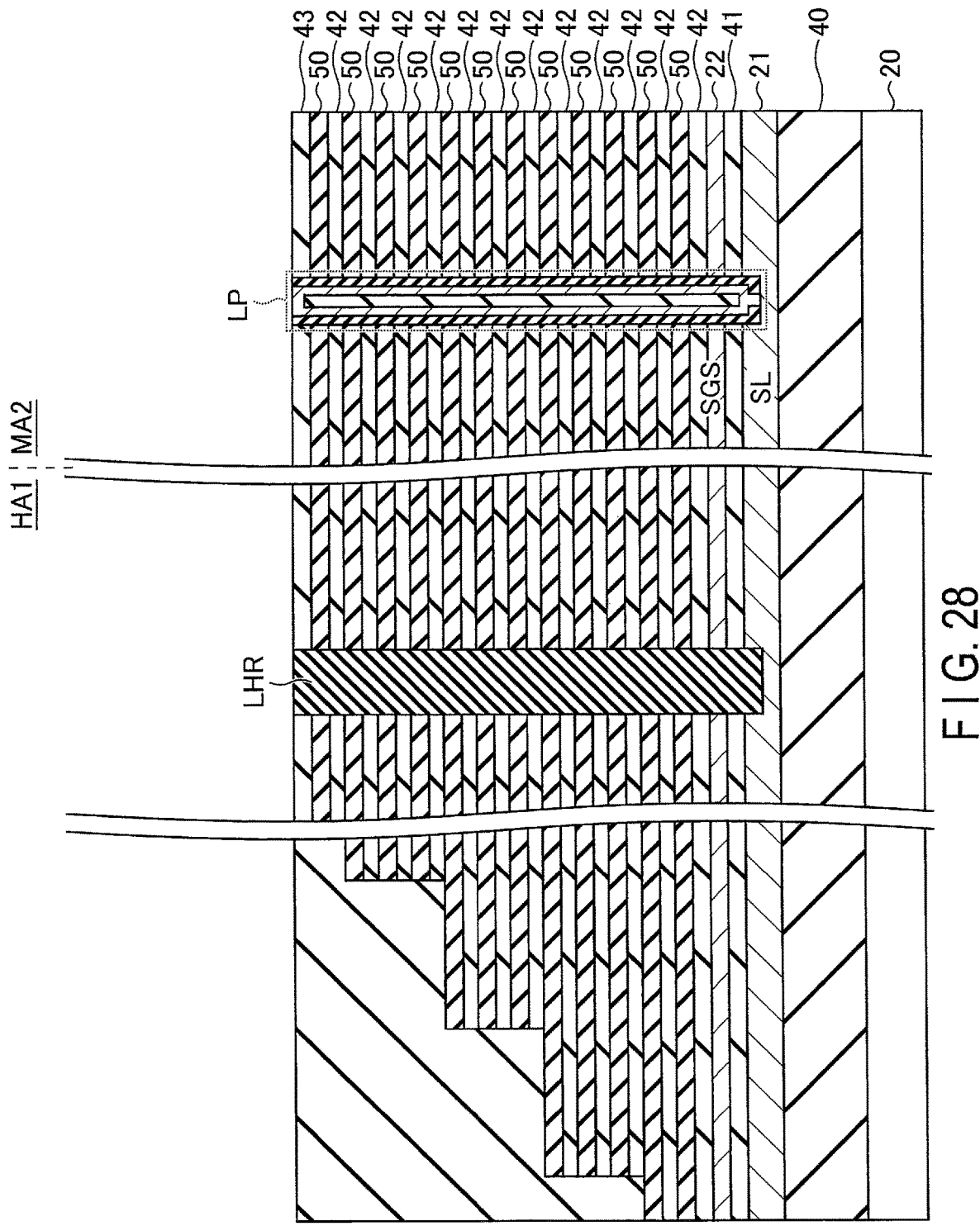
FIG. 28, FIG. 29, FIG. 30, and FIG. 31, are cross-sectional views illustrating an example of a cross-sectional structure during the manufacture of the semiconductor memory device according to the second embodiment.

Next, by the process of step S201, the wall portions STW and support pillars LHR are formed as illustrated in FIG. 28. Specifically, a mask with openings in areas corresponding to the wall portions STW and support pillars LHR is first formed by photolithography or the like. Then, by anisotropic etching using the mask, slits and holes penetrating the insulating layers 41 to 43, conductive layer 22 and sacrificial members 50 are formed. Subsequently, the slits and holes are filled with an insulator, and thereby structures corresponding to the wall portions STW and structures corresponding to the support pillars LHR are formed. Note that the structure of the wall portion STW formed in this step is the same as the structure of the wall portion STW illustrated in FIG. 14.

Figure 29:
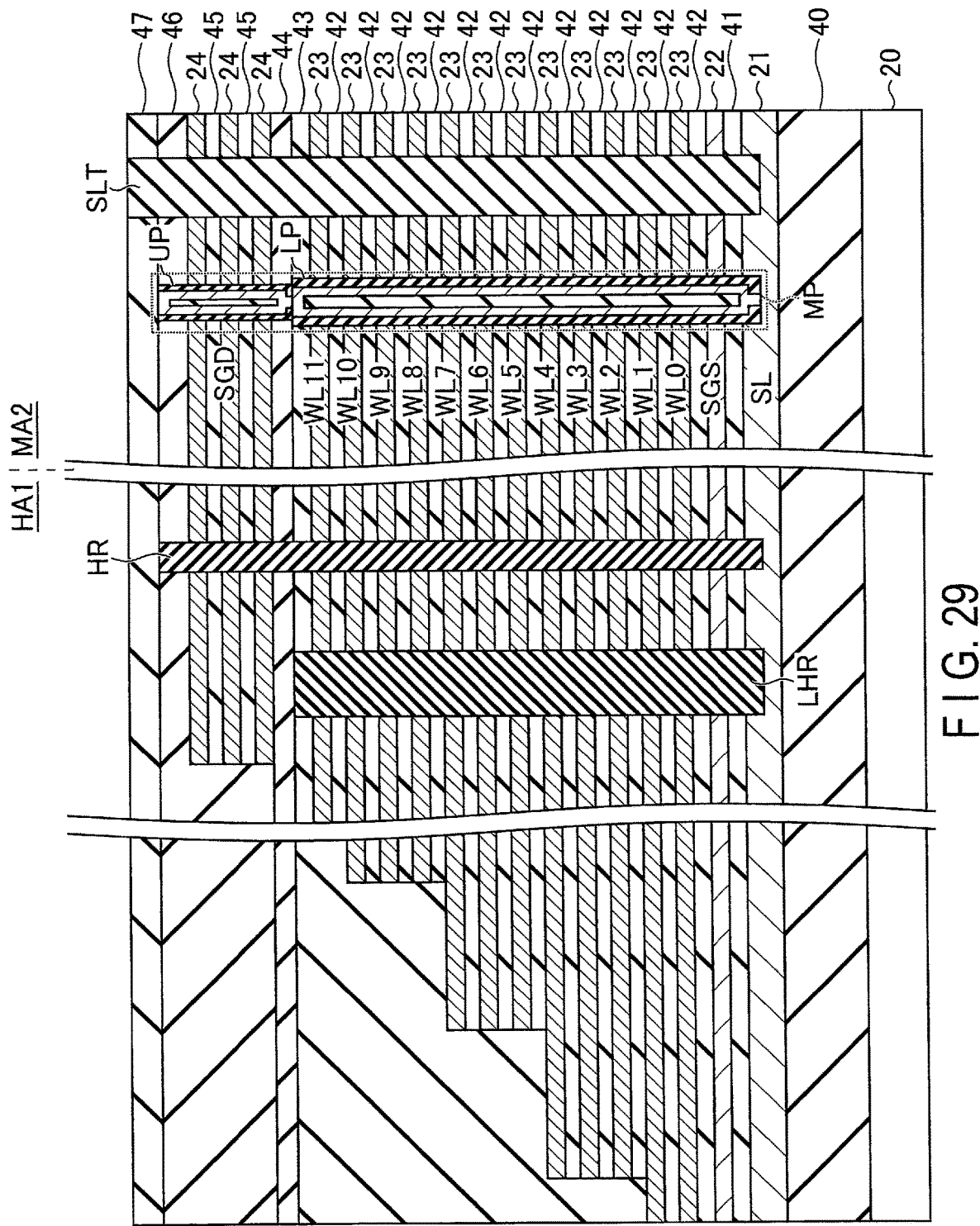

Next, the processes of steps S104 to S108 are executed in the same manner as in the first embodiment. Specifically, the sacrificial members 51 of the upper layer portion are formed, the support pillar HR is formed, the upper pillar UP is formed, the slit SLT is formed, and the replacement process of stacked interconnects is executed. Thereby, as illustrated in FIG. 29, the memory pillar MP and the conductive layers 23 and 24 are formed.

Figure 30:
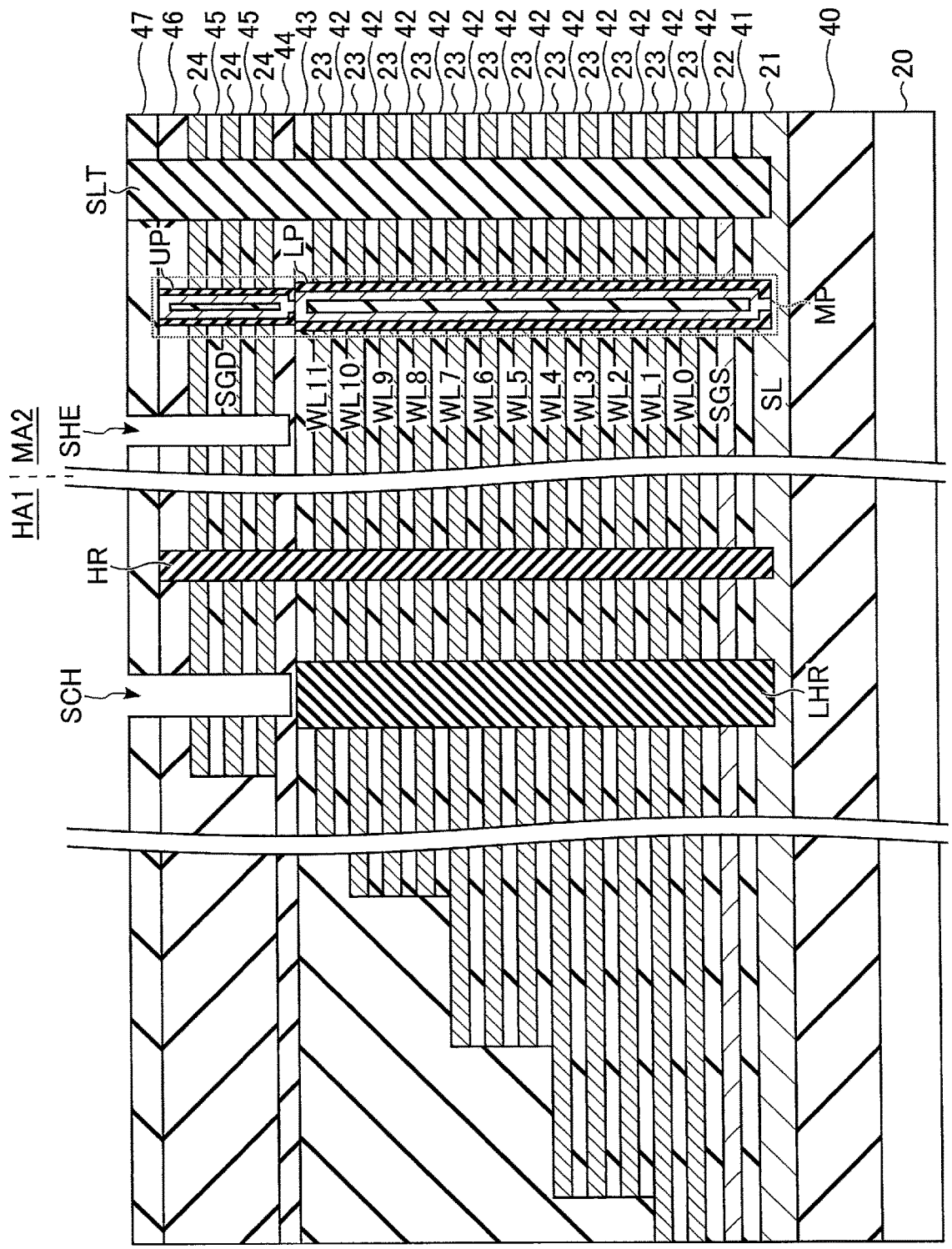

Next, by a process of step S109, like the first embodiment, the hole SCH and slit SHE are formed. In this step, the hole SCH is formed in a manner to overlap the support pillar LHR in plan view. For example, as illustrated in FIG. 30, a bottom part of the hole SCH is separated from the support pillar LHR. Note that the support pillar LHR may be exposed in the bottom part of the hole SCH if the conductive layers 23 are not exposed at least in the hole SCH.

Figure 31:
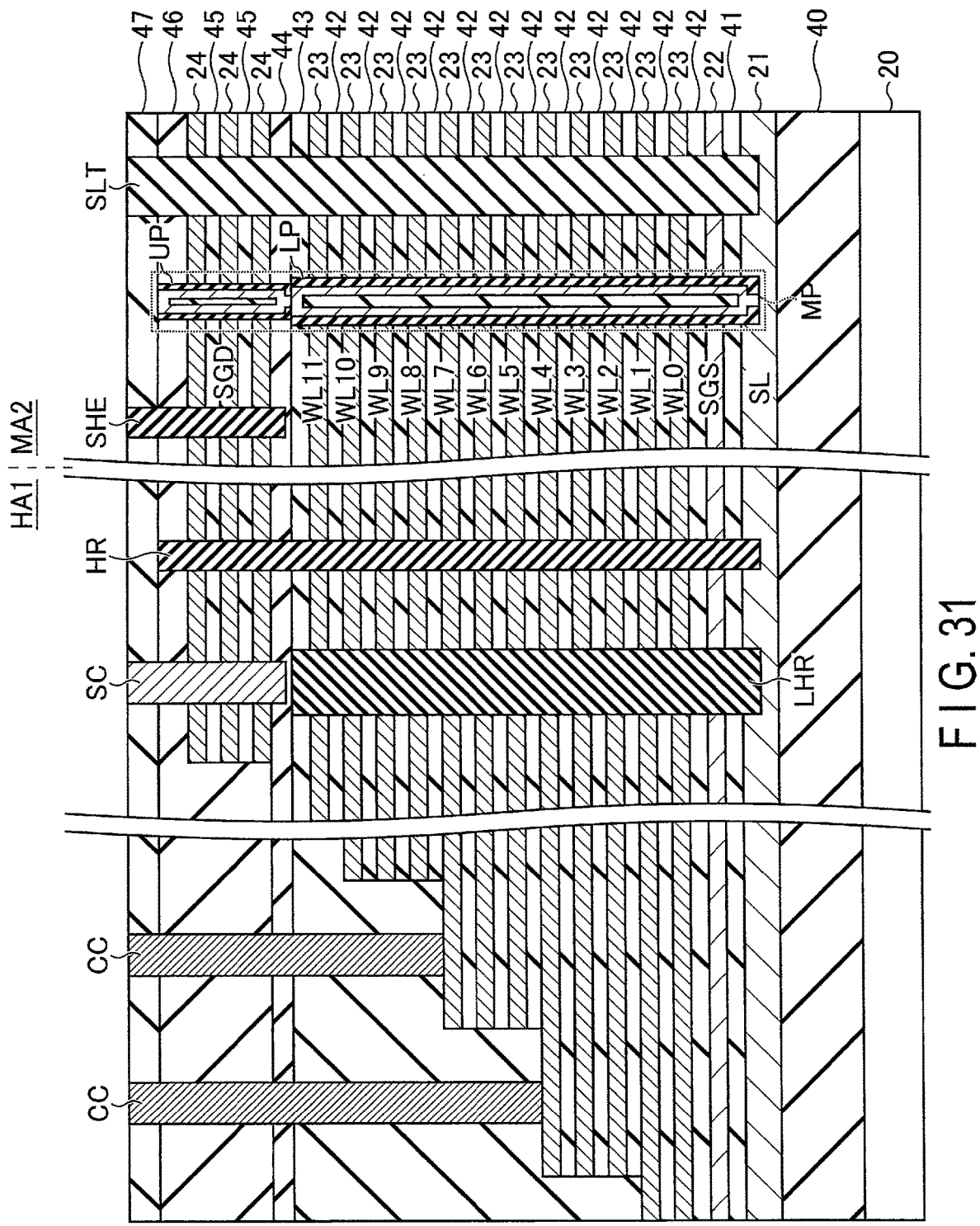

Thereafter, the processes of steps S110 to S113 are executed in the same manner as in the first embodiment. Specifically, the sacrificial member 52 is formed in the hole SCH, and the insulator is formed in the slit SHE. Then, the holes CCH and C4H are formed, and, after the sacrificial member 52 in the hole SCH is removed, the contacts CC, C4 and SC are formed as illustrated in FIG. 31.

In the above description, the case in which the wall portions STW and support pillars LHR are simultaneously formed was exemplarily illustrated. However, the step of forming the wall portions STW and the step of forming the support pillars LHR may be separated. In this case, either the step of forming the wall portions STW or the step of forming the support pillars LHR may be first executed.

[2-3] Advantageous Effects of the Second Embodiment

As described above, the semiconductor memory device 1 according to the second embodiment includes the support pillars LHR which are disposed under the contacts SC. In addition, the outside diameter and area of the support pillar LHR are designed to be greater than the outside diameter and area of the contact SC. Thereby, the support pillar LHR functions like the penetration area OA described in the first embodiment. Specifically, when the contact SC penetrates the lowermost select gate line SGD, the support pillar LHR can suppress short-circuit between the select gate lines SGD and word lines WL. Therefore, like the first embodiment, the semiconductor memory device 1 according to the second embodiment can improve the manufacturing yield.

In the second embodiment, the case in which the support pillar LHR is composed of an insulator was exemplarily illustrated. However, the support pillar LHR may include a conductor or a semiconductor. For example, the support pillar LHR may include a stacked structure similar to the stacked structure of the lower pillar LP of the memory pillar MP, and may include at least one of the core member 30, semiconductor layer 31, tunnel insulation film 36, insulating film 37 and block insulation film 38. In this case, the semiconductor layer 31 in the support pillar LHR and the conductive layers 21 to 23 are insulated. Specifically, if an insulating film is formed on a side surface and a bottom surface of the hole in which the support pillar LHR is formed and not removed from the bottom surface of the hole, a conductor or the like may be formed in the hole in which the support pillar LHR is formed.

[3] Third Embodiment

A semiconductor memory device 1 according to a third embodiment has such a structure that the terrace portions of the word lines WL are disposed under the contacts SC. Hereinafter, different points from the first and second embodiments will be described with respect to the semiconductor memory device 1 according to the third embodiment.

[3-1] Structure of Memory Cell Array 10 in Hookup Area HA

Figure 32:
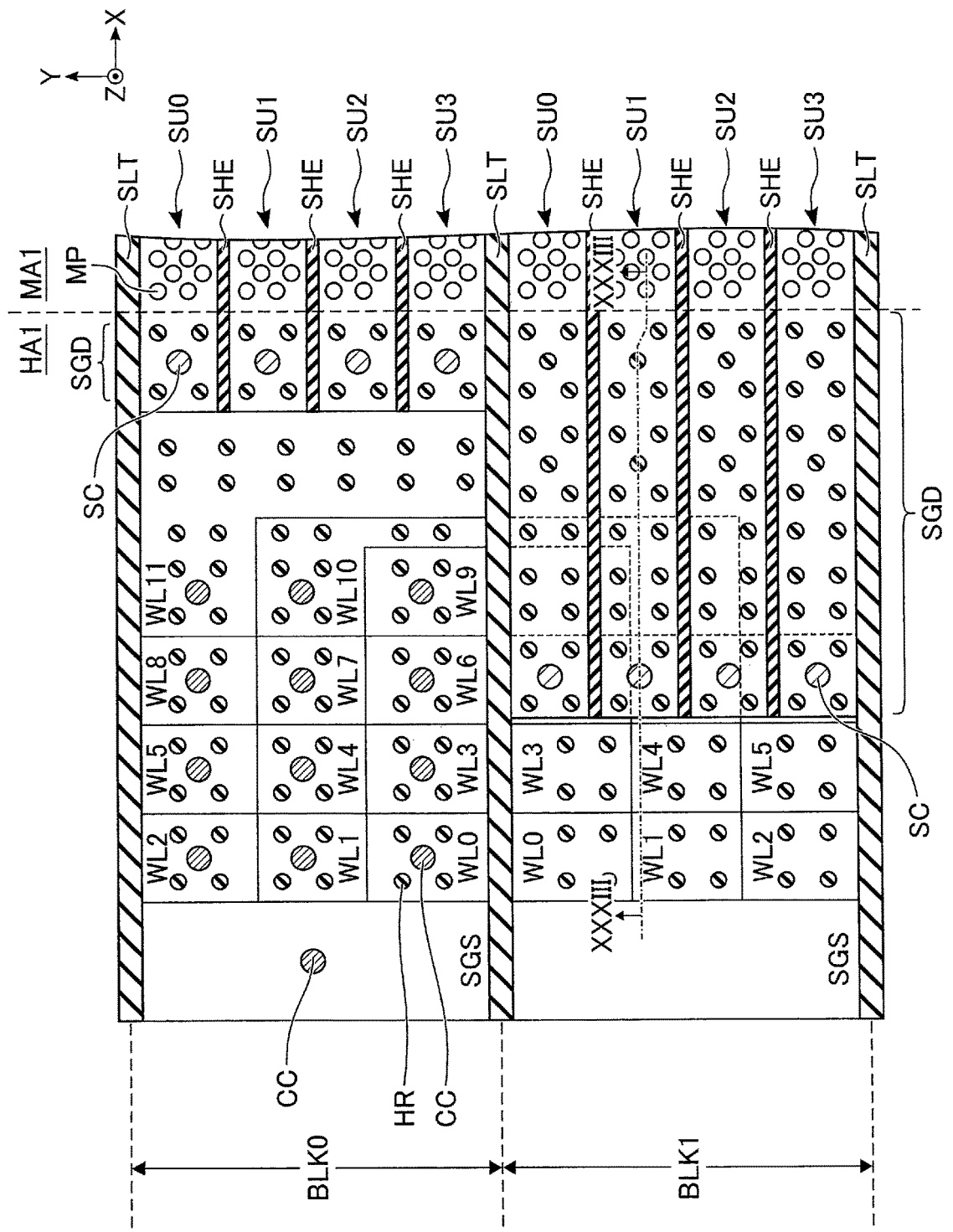
FIG. 32 is a plan view illustrating an example of a planar layout in a hookup area of a semiconductor memory device according to a third embodiment.

FIG. 32 illustrates an example of a detailed planar layout in the hookup area HA1 of a memory cell array 10 included in the semiconductor memory device 1 according to the third embodiment, FIG. 32 illustrating an area similar to the area shown in FIG. 7 described in the first embodiment. As illustrated in FIG. 32, the memory cell array 10 in the third embodiment differs from the memory cell array 10 in the first embodiment with respect to the structure in the block BLK in which the contacts CC are not disposed in the hookup area HA.

Specifically, in the third embodiment, the length in the X direction from the end portion of the memory area MA1 to the end portion of the select gate line SGD in the hookup area HA1 is greater in the block BLK1 than in the block BLK0. Thus, in the hookup area HA1, the terrace portions of some word lines WL of the word lines WL0 to WL11 in the block BLK1 (i.e. odd-numbered block BLK) overlap the select gate lines SGD. In addition, the contact CC is not connected to the terrace portions of the word lines WL, which overlap the select gate lines SGD.

On the other hand, the length in the X direction from the end portion of the memory area MA2 to the end portion of the select gate line SGD in the hookup area HA2 (not shown) is greater in the block BLK0 than in the block BLK1. Thus, in the hookup area HA2, the terrace portions of some word lines WL of the word lines WL0 to WL11 in the block BLK0 (i.e. even-numbered block BLK) overlap the select gate lines SGD. In addition, the contact CC is not connected to the terrace portions of the word lines WL, which overlap the select gate lines SGD.

Further, in the memory cell array 10 in the third embodiment, a plurality of contacts SC are included in the area of the block BLK1 (i.e. odd-numbered block BLK) in the hookup area HA1. These contacts SC are provided in association with the select gate lines SGD of the string units SU0 to SU3, and are disposed in a manner to overlap, for example, the terrace portions of the word lines WL6 to WL8. These contacts, like the contacts SC in the block BLK0, are electrically connected to the associated select gate lines SGD. In addition, in the even-numbered block BLK in the hookup area HA2, the contacts SC are disposed, for example, like the odd-numbered block BLK in the hookup area HA1.

Figure 33:
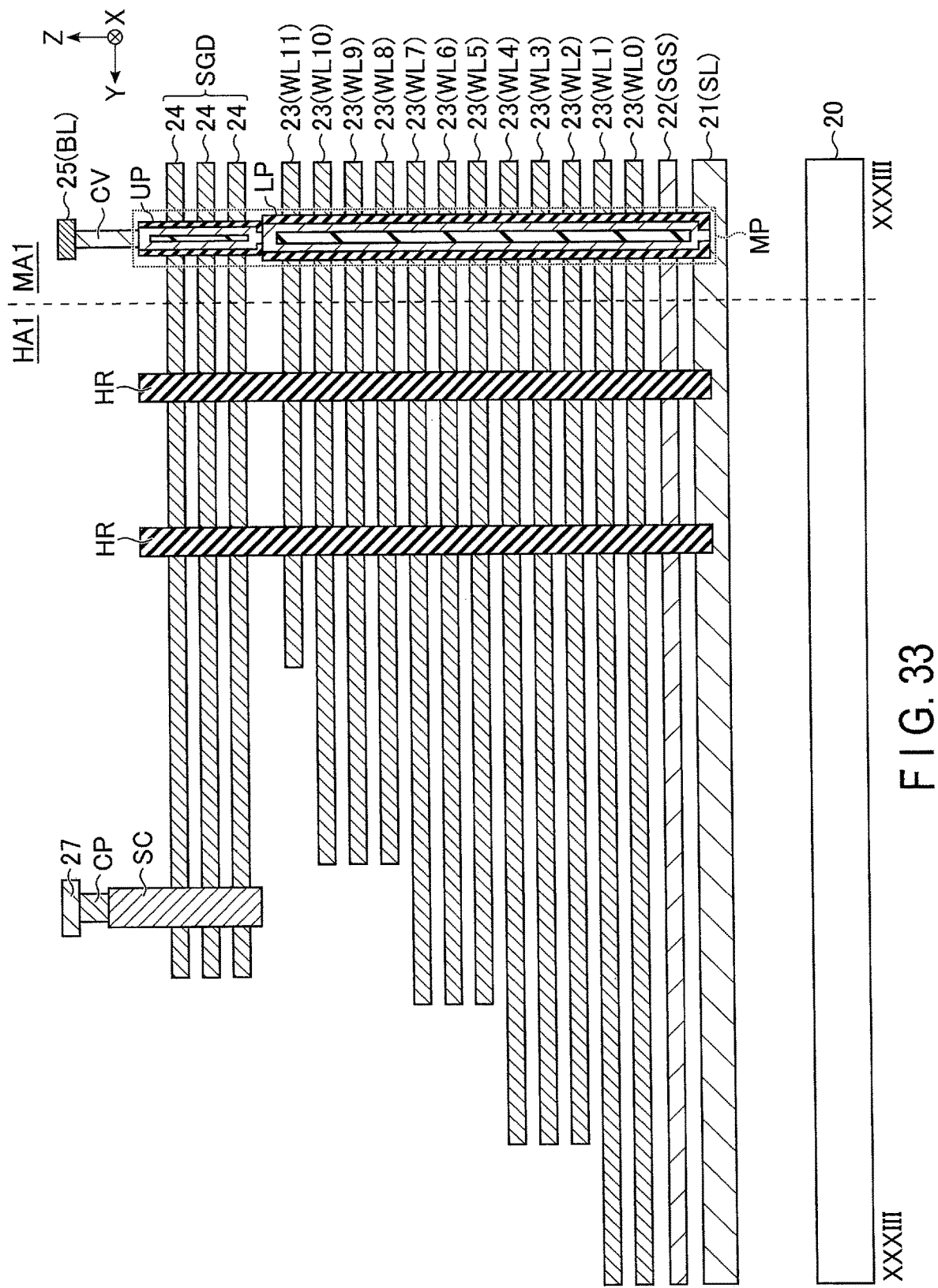
FIG. 33 is a cross-sectional view, taken along line XXXIII-XXXIII in FIG. 32, illustrating an example of a cross-sectional structure in the hookup area of the semiconductor memory device according to the third embodiment.

FIG. 33 is a cross-sectional view, taken along line XXXIII-XXXIII in FIG. 32, illustrating an example of a cross-sectional structure in the hookup area. HA1 of the memory cell array 10 included in the semiconductor memory device 1 according to the third embodiment. Compared to the structure of the memory cell array 10 illustrated in FIG. 8, the contacts CC are omitted in the structure of the memory cell array 10 illustrated in FIG. 33. In addition, the three conductive layers 24 are provided to extend to a positon above the terrace portion of the conductive layer 23 corresponding to the word line WL7.

The contact SC is provided to penetrate the three conductive layers 24. Specifically, the contact SC is disposed above the terrace portion of the conductive layer 23 corresponding to, for example, the word line WL7. The distance between the conductive layer 23 corresponding to the word line WL7 and the lowermost conductive layer 24 is greater than the distance between the uppermost conductive layer 23 and the lowermost conductive layer 24. In other words, the distance in the Z direction between the conductive layer 23 provided under the contact SC and the contact SC is greater than the distance in the Z direction between the contact SC illustrated in FIG. 8 and the uppermost conductive layer 23.

The above-described structure of the select gate lines SGD and contact SC in the hookup area HA1 and block BLK1 is similarly provided, for example, in other odd-numbered blocks BLK. In addition, the memory cell array 10 in the third embodiment includes, in the even-numbered block BLK in the hookup area HA2, the same structure as the select gates SGD and contact SC in the hookup area HA1 and block BLK1.

Thus, each of the contact SC in the hookup area HA1 and odd-numbered block BLK and the contact SC in the hookup area HA2 and even-numbered block BLK is disposed above the terrace portion of any conductive layer 23 other than the uppermost conductive layer 23. In other words, on one side of the block BLK in the X direction to which the contacts CC are not connected in the hookup area HA, the contacts SC are disposed in such a manner as not to overlap at least the uppermost conductive layer 23. The length of the select gate line SGD in the hookup area HA1 and odd-numbered block BLK and the length of the select gate line SGD in the hookup area HA2 and even-numbered block BLK may be changed according to the disposition of the contacts SC. The other structure of the semiconductor memory device 1 according to the third embodiment is the same as in the first embodiment.

[3-2] Advantageous Effects of the Third Embodiment

There is a case in which the semiconductor memory device 1 includes stepped structures on both sides of the word lines WL, and includes, on one side, the block BLK in which the contacts CC are disposed, and, on the other side, the block BLK in which the contacts CC are formed. In this case, for example, the block BLK in which the contacts CC are disposed in the hookup area HA1 includes a margin in a layout in the hookup area HA2, and the block BLK in which the contacts CC are disposed in the hookup area HA2 includes a margin in a layout in the hookup area HA1.

Taking this into account, the semiconductor memory device 1 according to the third embodiment includes the structure in which the select gate lines SGD are provided to extend to a position above the terrace portions of the word lines WL, in the area in which the contacts CC are not disposed in the hookup area HA. In addition, in this area, the contacts SC are disposed above the terrace portions of the word lines WL other than the uppermost word line WL. Specifically, in the third embodiment, the structure of the extended select gate lines SGD and contacts SC is provided in the area above the stepped portion in the hookup area HA, where the thickness of the insulating layer formed on the stacked interconnect structure of word lines WL is greater than in the other area.

Thereby, in the semiconductor memory device 1 according to the third embodiment, the process margin in the formation of the contact SC is relaxed. As a result, the semiconductor memory device 1 according to the third embodiment can suppress the occurrence of short-circuit between the select gate line SGD and word line WL via the contact SC. Therefore, like the first embodiment, the semiconductor memory device 1 according to the third embodiment can improve the manufacturing yield.

[4] Fourth Embodiment

A semiconductor memory device 1 according to a fourth embodiment includes such a structure that the second embodiment is combined in the case in which end portions of the stacked select gate lines SGD are processed in a stepped shape. Hereinafter, the semiconductor memory device 1 according to the fourth embodiment will be described with respect to different points from the first to third embodiments.

[4-1] Structure of Memory Cell Array 10 in Hookup Area HA

Figure 34:
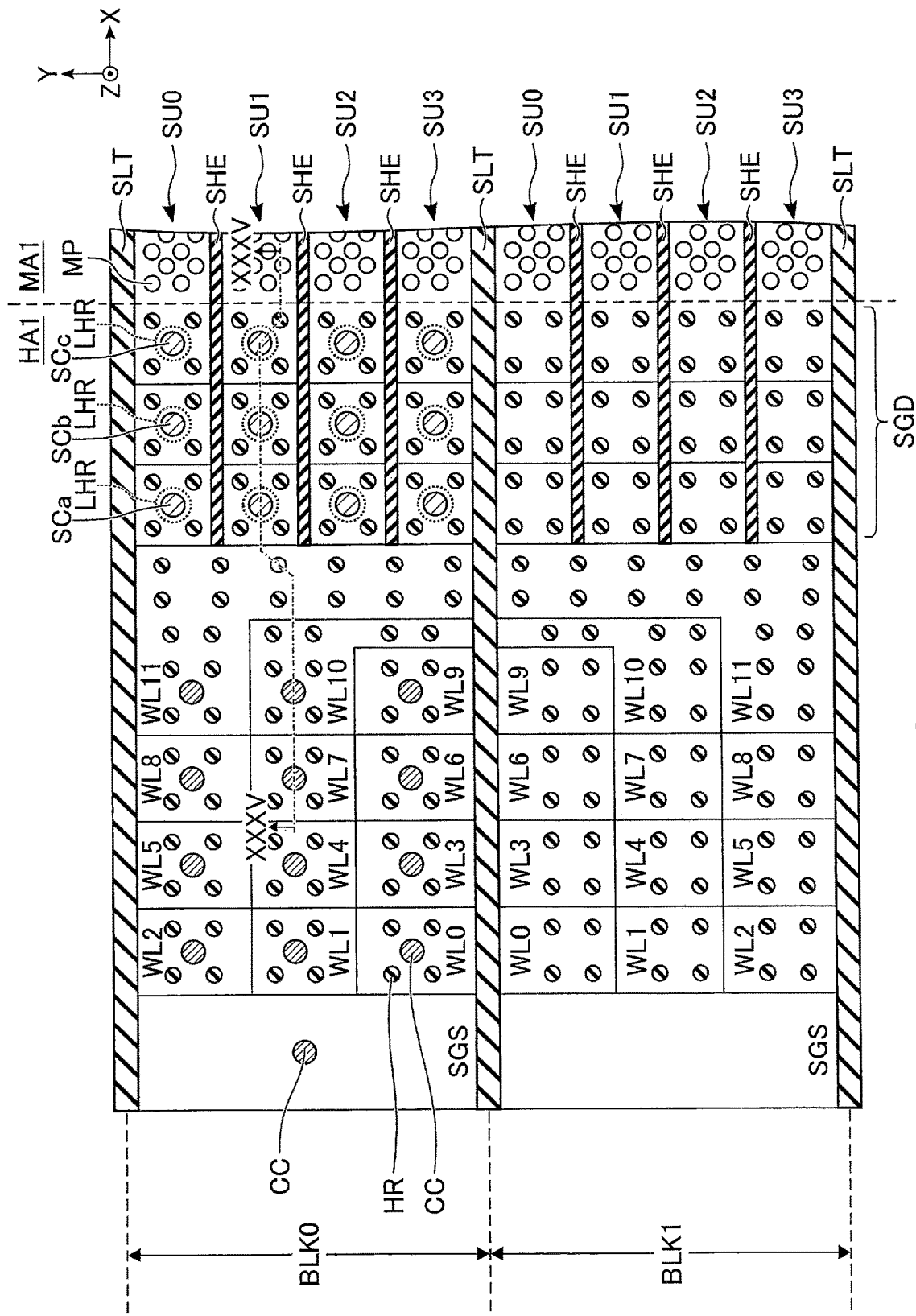
FIG. 34 is a plan view illustrating an example of a planar layout in a hookup area of a semiconductor memory device according to a fourth embodiment.

FIG. 34 illustrates an example of a detailed planar layout in the hookup area HA1 of a memory cell array 10 included in the semiconductor memory device 1 according to the fourth embodiment, and illustrates an area similar to the area illustrated in FIG. 7 described in the first embodiment. As illustrated in FIG. 34, in the memory cell array 10 in the fourth embodiment, the stacked select gate lines SGD include stepped portions. Specifically, in the fourth embodiment, a lower-layer select gate line SGD includes a terrace portion which does not overlap an upper-layer select gate line SGD. In addition, the memory cell array 10 in the fourth embodiment includes a plurality of contacts SCa, SCb and SCc and a plurality of support pillars LHR in association with the terrace portions of the select gate lines SGD.

The contact SCa is provided in association with, for example, the lowermost select gate line SGD. The contact SCb is provided in association with, for example, a middle select gate line SGD. The contact SCc is provided in association with, for example, the uppermost select gate line SGD. The support pillars LHR are disposed in a manner to overlap the contacts SCa, SCb and SCc. In plan view, the area in which each of the contacts SCa, SCb and SCc is formed is included in the area of the support pillar LHR.

FIG. 35 is a cross-sectional view, taken along line XXXV-XXXV in FIG. 34, illustrating an example of a cross-sectional structure in the hookup area HA1 of the memory cell array 10 included in the semiconductor memory device 1 according to the fourth embodiment. The structure of the memory cell array 10 illustrated in FIG. 35 differs from the structure of the memory cell array 10 illustrated in FIG. 26 with respect to a structure relating to the select gate lines SGD. Hereinafter, the three stacked conductive layers 24 are referred to as conductive layers 24a, 24b and 24c in the order from the semiconductor substrate 20 side.

As illustrated in FIG. 35, the conductive layer 24a includes a terrace portion which overlaps neither the upper-layer conductive layer 24b nor 24c. The conductive layer 24b includes a terrace portion which does not overlap the upper-layer conductive layer 24c. For example, the contact SCa is provided to penetrate the terrace portion of the conductive layer 24a. The contact SCb is provided to penetrate the terrace portion of the conductive layer 24b. The contact SCc is provided to penetrate the terrace portion of the conductive layer 24c. Note that the contacts SCa, SCb and SCc may be formed to be in contact with at least the conductive layers 24a, 24b and 24c respectively, and are not limited to the above-described case. For example, a lower end of each contact SC may be provided to be included in a layer in which the corresponding conductive layer 24 is provided.

The conductive layers 24a, 24b and 24c corresponding to the same string unit SU are commonly connected by, for example, a conductive layer 27. Specifically, the conductive layers 24a, 24b and 24c corresponding to the same string unit SU are electrically connected to the common conductive layer 27 via the contacts SCa, SCb and SCc, respectively. The contacts SCa, SCb and SCc and the conductive layer 27 are connected via, for example, contacts CP.

In addition, in the fourth embodiment, support pillars LHR are provided under the contacts SCa, SCb and SCc, respectively. The outside diameter and area of an upper end of the support pillar LHR are greater than the outside diameter and area of a lower end of each contact SCa, SCb, SCc. The upper end of the support pillar LHR and the lower end of each contact SCa, SCb, SCc may be put in contact, or may be separated. Even when the support pillar LHR is in contact with the contact SCa, SCb or SCc, these contacts SC may be isolated and insulated from at least the conductive layer 23. The other structure of the semiconductor memory device 1 according to the fourth embodiment is the same as in the second embodiment.

[4-2] Advantageous Effects of the Fourth Embodiment

As described above, in the semiconductor memory device 1 according to the fourth embodiment, the end portions of the stacked select gate lines SGD are provided in a stepped shape, and the contacts SC are connected to the terrace portions of the stacked select gate lines SGD. In addition, the semiconductor memory device 1 according to the fourth embodiment includes the support pillars LHR disposed under the contacts SC.

For example, in particular, in the case of the structure in which the contacts SC are connected to the select gate lines SGD including stepped end portions, the processing of holes SCH and CCH and the burying of conductors in the holes SCH and CCH are, in some cases, performed simultaneously in association with the contacts CC with the word lines WL which similarly include stepped end portions. In such cases, even when the process margin at the time of simultaneously forming the contacts SC and CC is small and the contacts SCa, SCb and SCc penetrate the lowermost select gate line SGD, the support pillars LHR in the fourth embodiment, like the second embodiment, can suppress short-circuit between the select gate line SGD and word line WL. Therefore, the semiconductor memory device 1 according to the fourth embodiment, like the second embodiment, can improve the manufacturing yield.

Like the second embodiment, the support pillar LHR in the fourth embodiment may include a conductor and/or a semiconductor. In addition, in the fourth embodiment, the support pillars LHR corresponding to the contacts SC other than the contact SCa, which is connected to the lowermost conductive layer 24a, may be omitted. The reason for this is that the contact SCa, among the contacts SC, may penetrate, with the highest possibility, the lowermost conductive layer 24a and reaches the layer in which the conductive layer 23 is provided.

[5] Other Modifications, Etc.

A semiconductor memory device according to an embodiment includes a base, a first conductor, a second conductor, a first pillar, a first insulating member, and a first contact. The first conductor is provided in a first layer above the base. The second conductor is provided above the first conductor. The first pillar includes a first portion and a second portion formed by different bodies. The first portion of the first pillar is provided to penetrate the first conductor. The second portion of the first pillar is provided to penetrate the second conductor. The first insulating member is provided at least in the first layer. The first contact is contacting the second conductor above the first insulating member. Thereby, the manufacturing yield of semiconductor memory devices is improved.

Figure 36:
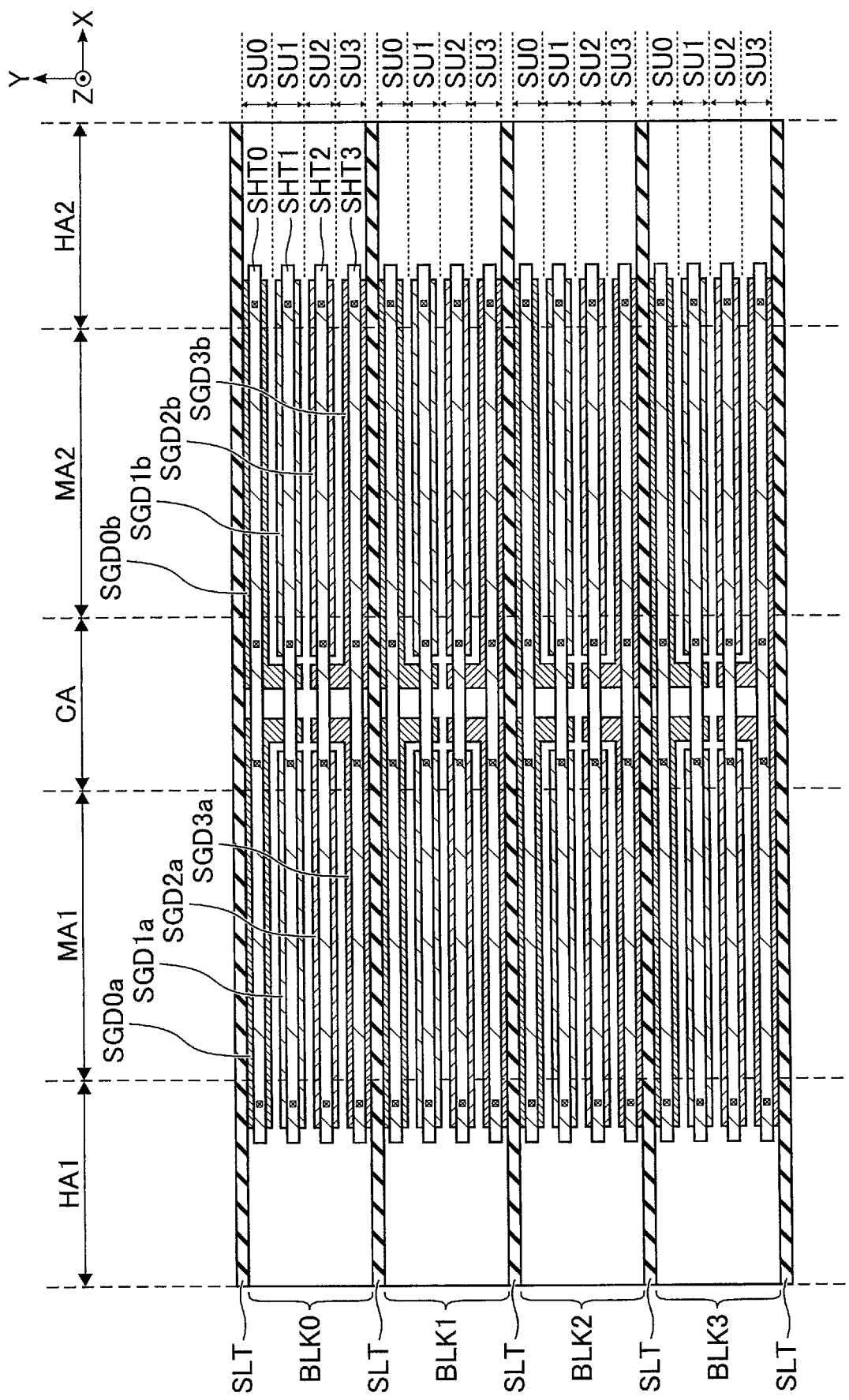
FIG. 36 is a plan view illustrating an example of a planar layout of a semiconductor memory device according to a modification of the first embodiment.

In the above embodiments, a shunt wiring may be provided in a layer above the interconnects SW which connect the select gate lines SGDa and SGDb. FIG. 36 illustrates an example of a planar layout of a semiconductor memory device 1 according to a modification of the first embodiment, and illustrates the same area as in FIG. 3. As illustrated in FIG. 36, for example, the semiconductor memory device 1 further includes a plurality of shunt lines SHT0 to SHT3. The shunt lines SHT0 to SHT3 are provided to extend in the X direction and are arranged in the Y direction. Each of the shunt lines SHT0 to SHT3 extends, for example, across from the hookup area HA1 to the hookup area HA2. For example, the shunt lines SHT0 to SHT3 are connected to the select gate lines SGD0 to SGD3 as appropriate. Thereby, the semiconductor memory device 1 can lower the wiring resistance of the select gate lines SGD.

In addition, the select gate lines SGD may include a plurality of structures which are the same as the structure in the contact area CA. In other words, the select gate lines SGD may be divided at two or more locations between the hookup areas HA1 and HA2. In this case, the interconnect SW is provided at each of the locations of division of the select gate lines SGD, and connects the divided select gate lines SGD.

In the above embodiments, the case in which the select gate lines SGD0a to SGD3a are connected to the select gate lines SGD0b to SGD3b, but the embodiments are not limited to this case. For example, the select gate lines SGD0a and SGD1b may be connected, the select gate lines SGD1a and SGD0b may be connected, the select gate lines SGD2a and SGD3b may be connected, and the select gate lines SGD3a and SGD2b may be connected. In addition, all the corresponding select gate lines SGDa and SGDb may be connected via the interconnects SW, or some of the select gate lines SGDa and SGDb may be continuously formed without intervention of the interconnects SW. Further, when the memory cell array 10 includes a plurality of contact areas CA, the connection between the select gate lines SGDa and SGDb corresponding to the same block BLK may be different among the contact areas CA. Thereby, the semiconductor memory device 1 can also suppress coupling noise of the select gate lines SGD.

Besides, the conductive layers 24 used as the select gate lines SGD may be formed as a single layer. In this case, too, for example, when the contact CC with the word line WL and the contact SC with the select gate line SGD are to be formed at the same time, it is possible to effectively suppress the possibility of short-circuit between the select gate line SGD and word line WL, in connection with the risk that the contact SC penetrates the select gate line SGD.

The above embodiments can be combined. For example, the semiconductor memory device 1 may include both the contacts SC disposed in the penetration area OA as in the first embodiment, and the contacts SC disposed above the support pillars LHR. The structure in which the end portions of the select gate lines SGD are provided in the stepped shape as in the fourth embodiment may be combined with the first embodiment or the third embodiment, and the contacts SC may be disposed in the penetration area OA or above the terrace portions of the word lines WL other than the uppermost word line WL. In addition, the semiconductor memory device 1 may include the structure in which the support pillar LHR is disposed under the contact SC which is disposed in the hookup area HA as in the third embodiment.

In the above embodiments, the structure of the memory cell array 10 may have other structures. For example, the memory pillar MP may have such a structure that three or more pillars are coupled in the Z direction. The inside of the slit SLT may be composed of a plurality of kinds of insulators. Further, a conductor may be formed in the slit SLT, and the conductor may be used as a contact of the source line SL. When the conductor is formed in the slit SLT, the conductor and the interconnects, such as the stacked word lines WL, are isolated and insulated by a spacer insulation film. The number of steps formed in the Y direction in the end portions of the stacked word lines WL may be freely selected. Specifically, in the semiconductor memory device 1, the end portions of the word lines WL in the hookup area HA may be designed in a stepped shape with a freely selected number of rows. Each of the memory pillars MP and contacts CV, CP, CC, SC and C4 may have a taper shape or an inverse taper shape, or may have a shape with a bulging intermediate portion. Similarly, the slit SLT may have a taper shape or an inverse taper shape, or may have a shape with a bulging intermediate portion.

In the present specification, the term "connection" means an electrical connection, and does not exclude, for example, a connection with another element being interposed. The expression "electrically connected" may also mean "electrically connected via an insulator" if the same operation as "electrically connected" is enabled. The term "columnar shape" means a structure provided in a hole formed in a manufacturing step of the semiconductor memory device 1. The terms "outside diameter" and "area" mean an outside diameter and an area in a cross section parallel to, for example, the semiconductor substrate 20. For example, when outside diameters and areas of two constituent elements, which are opposed in the Z direction, are compared, the outside diameter and area of an upper end of the lower constituent element are compared with the outside diameter and area of a lower end of the upper constituent element. The expression "thickness of an insulating layer" means, for example, a thickness in a direction vertical to the surface of the semiconductor substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a base;
a first conductor provided in a first layer above the base;
a second conductor provided above the first conductor;
a first pillar including a first portion and a second portion formed by different bodies, the first portion of the first pillar being provided to penetrate the first conductor, and the second portion of the first pillar being provided to penetrate the second conductor;
a first insulating member provided at least in the first layer; and
a first contact contacting the second conductor above the first insulating member and overlapping the first insulating member in a direction perpendicular to a surface of the base, wherein
in the first layer, the first conductor does not overlap the first insulating member in the direction perpendicular to the surface of the base.

2. The device of claim 1, further comprising:
a third conductor provided above the second conductor, each of the second portion of the first pillar and the first contact penetrating the third conductor, wherein
an intersection portion between the first conductor and the first pillar functions as a memory cell transistor, and
an intersection portion between the second and third conductors and the first pillar functions as a select transistor.

3. The device of claim 1, further comprising:
a fourth conductor provided in a second layer between the base and the first conductor, the first portion of the first pillar penetrating the fourth conductor; and
a second insulating member provided in the second layer and between the base and the first insulating member, wherein
the first insulating member and the second insulating member include an identical material.

4. The device of claim 3, further comprising:
a first insulating layer provided between the first conductor and the fourth conductor; and a second insulating layer provided between the first insulating member and the second insulating member, wherein the first insulating layer and the second insulating layer include an identical insulating material.

5. The device of claim 3, wherein a plurality of second conductors are provided to extend in a first direction, the second conductors being arranged in a second direction crossing the first direction, and a plurality of first contacts are provided in contact with the second conductors, respectively, the first contacts overlapping the first insulating member and the second insulating member in plan view.

6. The device of claim 3, further comprising:

a fifth conductor provided in a third layer between the base and the fourth conductor, a bottom portion of the first pillar being in contact with the fifth conductor;

a sixth conductor provided in a fourth layer between the base and the fifth conductor; and a second contact penetrating the first insulating member and the second insulating member, the second contact being provided on the sixth conductor.

7. The device of claim 6, further comprising:

a third insulating member and a fourth insulating member, each of which is provided to extend in a first direction, the third insulating member and the fourth insulating member sandwiching the first to fourth conductors in a second direction crossing the first direction; and a fifth insulating member and a sixth insulating member provided between the third insulating member and the fourth insulating member, the fifth insulating member and the sixth insulating member extending in the first direction and being arranged in the second direction, wherein each of the fifth insulating member and the sixth insulating member includes a portion provided between the first conductor and the first insulating member, and the fifth insulating member and the sixth insulating member are spaced part from each other.

8. The device of claim 6, further comprising:

a seventh conductor provided in a fifth layer above the second conductor, wherein each of the first conductor, the second conductor and the fourth conductor includes a portion extending in a first direction, the first conductor includes a first portion provided on one side in the first direction of the second contact and a second portion provided on the other side in the first direction of the second contact, the first portion of the first conductor and the second portion of the first conductor being electrically connected in the first layer, the fourth conductor includes a first portion provided on one side in the first direction of the second contact and a second portion provided on the other side in the first direction of the second contact, the first portion of the fourth conductor and the second portion of the fourth conductor being electrically connected in the second layer, the second conductor includes a first portion provided on one side in the first direction of the second contact and a second portion provided on the other side in the first direction of the second contact, the first portion of the second conductor and the second portion of the second conductor being isolated, a plurality of first contacts are provided in the first portion and the second portion of the second conductor, and the first portion and the second portion of the second conductor are electrically connected via the first contacts and the seventh conductor.

9. The device of claim 8, wherein the seventh conductor includes a crank-shaped pattern which does not overlap the second contact in plan view.

10. The device of claim 8, wherein a plurality of second conductors are arranged in a second direction crossing the first direction, and the plurality of the first contacts with first portions and second portions of the second conductors arranged in the second direction are disposed in a manner to surround the second contact in plan view.

11. The device of claim 1, further comprising:

a fourth conductor; a third contact; and a fourth contact, wherein the base includes a first area, a second area and a third area, the first area including the first pillar, and the second area and the third area sandwiching the first area in a first direction, the fourth conductor is provided in a second layer between the base and the first conductor, the first portion of the first pillar penetrating the fourth conductor, the third contact is provided on the first conductor in the second area, the fourth contact is provided on the fourth conductor in the second area, and the first contact is disposed at a position which is above the fourth conductor and is not above the first conductor in the third area.

12. The device of claim 11, wherein in the third area, no contact is provided on each of the first conductor and the fourth conductor.

13. The device of claim 11, wherein in each of the second area and the third area, the first conductor and the fourth conductor are provided in a stepped shape.

14. The device of claim 1, wherein an area of an upper end of the first portion of the first pillar is greater than an area of a lower end of the second portion of the first pillar.

15. The device of claim 1, further comprising:

a fourth conductor provided in a second layer between the base and the first conductor, the first portion of the first pillar penetrating the fourth conductor, wherein the first conductor neighbors the fourth conductor via one insulating layer, and neighbors the second conductor via another insulating layer, and a distance in a direction of extension of the first pillar is greater between the first conductor and the second conductor than between the first conductor and the fourth conductor.

16. A semiconductor memory device comprising:

a base;

a first conductor provided in a first layer above the base;

a second conductor provided above the first conductor;

a first pillar including a first portion and a second portion formed by different bodies, the first portion of the first pillar being provided to penetrate the first conductor, and the second portion of the first pillar being provided to penetrate the second conductor;

a first insulating member provided at least in the first layer;

a first contact contacting the second conductor above the first insulating member and overlapping the first insulating member in a direction perpendicular to a surface of the base; and a fourth conductor provided between the base and the first conductor, the first portion of the first pillar penetrating the fourth conductor, wherein the first insulating member extends in a direction of extension of the first pillar, and penetrates the first conductor and the fourth conductor.

17. The device of claim 16, wherein an area of an upper end of the first insulating member is greater than an area of a lower end of the first contact.

18. The device of claim 16, wherein a plurality of first insulating members penetrate the first conductor and the fourth conductor in the direction of extension of the first pillar, a plurality of second conductors are provided to extend in a first direction, the second conductors being arranged in a second direction crossing the first direction, and a plurality of first contacts are provided in contact with the second conductors, respectively, the first contacts being provided above the first insulating members and overlapping the first insulating members in the direction perpendicular to the surface of the base respectively.

19. A semiconductor memory device comprising:

a base;

a first conductor provided in a first layer above the base;

a second conductor provided above the first conductor;

a first pillar including a first portion and a second portion formed by different bodies, the first portion of the first pillar being provided to penetrate the first conductor, and the second portion of the first pillar being provided to penetrate the second conductor;

a first insulating member provided at least in the first layer;

a first contact contacting the second conductor above the first insulating member and overlapping the first insulating member in a direction perpendicular to a surface of the base a third conductor provided above the second conductor, the second portion of the first pillar being provided to penetrate the third conductor; and a fifth contact provided in contact with the third conductor, wherein the base includes a first area and a second area, the first area including the first pillar, the second area neighboring the first area in a first direction and including the first contact and the fifth contact, and the second conductor and the third conductor being provided in a stepped shape in the second area, and a plurality of first insulating members are provided under the first contact and the fifth contact.

20. The device of claim 19, wherein the second conductor neighbors the third conductor via one insulating layer, and neighbors the first conductor via another insulating layer, and a distance in a direction of extension of the first pillar is greater between the second conductor and the first conductor than between the second conductor and the third conductor.

* * * * *